United States Patent
Maenishi et al.

(10) Patent No.: US 6,971,161 B1
(45) Date of Patent: Dec. 6, 2005

(54) METHOD FOR GENERATING COMPONENT MOUNTING DATA AND COMPONENT MOUNTING METHOD

(75) Inventors: Yasuhiro Maenishi, Kofu (JP); Ikuo Yoshida, Kofu (JP); Masamichi Morimoto, Kofu (JP); Makoto Hirahara, Higashimurayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 489 days.

(21) Appl. No.: 10/088,992

(22) PCT Filed: Sep. 26, 2000

(86) PCT No.: PCT/JP00/06597

§ 371 (c)(1),
(2), (4) Date: Mar. 26, 2002

(87) PCT Pub. No.: WO01/24597

PCT Pub. Date: Apr. 5, 2001

(30) Foreign Application Priority Data

Sep. 28, 1999 (JP) .................................. 11-274252

(51) Int. Cl.⁷ ............................................. H05K 3/30
(52) U.S. Cl. ............................ 29/832; 29/833; 29/834; 29/739; 700/121
(58) Field of Search .................. 29/832–836, 739–743; 700/95–97, 121; 716/8; 703/7; 414/783; 901/17, 40–47

(56) References Cited

U.S. PATENT DOCUMENTS

5,908,282 A * 6/1999 Onodera ...................... 29/740
6,161,214 A * 12/2000 Ishihara et al. ............... 29/834

FOREIGN PATENT DOCUMENTS

| EP | 1 175 137 | 1/2002 |
| JP | 62-169423 | 7/1987 |
| JP | 64-5100 | 1/1989 |
| JP | 4-171999 | 6/1992 |
| JP | 5-13989 | 1/1993 |

* cited by examiner

*Primary Examiner*—Minh Trinh
(74) *Attorney, Agent, or Firm*—Wenderoth, Lind & Ponack, L.L.P.

(57) ABSTRACT

There are provided a method and device for generating component mounting data in view of productivity, quality assurance, safety, or the like, when components are mounted onto a mounting target, and a component mounting method and device by which a mounting operation can be performed based on the data. Rules that must be observed, or are desired to be observed, based on various conditions such as mounting apparatus and component information and the like are automatically generated in view of productivity, quality assurance, safety, or the like and can be utilized for generation of component mounting data.

44 Claims, 31 Drawing Sheets

Fig. 15

| CONDITION | MOUNTING APPARATUS NUMBER | MOUNTING APPARATUS 1 | MOUNTING APPARATUS 2 | MOUNTING APPARATUS 3 |
|---|---|---|---|---|
| A | HEAD CONSTITUTION | 2 HEADS | 1 HEAD | 1 HEAD |
| B | NOZZLE CONSTITUTION | HEAD 1: 10 NOZZLES, HEAD 2: 10 NOZZLES | 10 NOZZLES | 4 NOZZLES |
| C | CASSETTE CONSTITUTION | MAXIMUM 100 (CALCULATED WITH WIDTH AS 8 mm) | 100 | 50 |
| D | TRAY CONSTITUTION | NONE | NONE | TWIN TRAY |
| E | NOZZLE STATION CONSTITUTION | NONE | NONE | 50 (STOCKER CAPACITY) |
| F | CAMERA | TWO-DIMENSIONAL | TWO-DIMENSIONAL | TWO-DIMENSIONAL +THREE-DIMENSIONAL |

Fig. 16

| COMPONENT NAME | COMP-A | COMP-B | COMP-C | COMP-D | COMP-E | COMP-F | COMP-G | COMP-H | COMP-I | COMP-J |
|---|---|---|---|---|---|---|---|---|---|---|
| CAMERA | 2D SMALL | 2D SMALL | 2D SMALL | 2D LARGE | 2D LARGE | 2D LARGE | 2D LARGE | 2D LARGE | 3D SMALL | 3D LARGE |
| COMPONENT HEIGHT | 0.3 | 0.3 | 1.5 | 2.4 | 2.8 | 4.2 | 4.5 | 7.0 | 7.4 | 8.2 |
| NOZZLE TO BE USED | \multicolumn{10}{l|}{NOZZLE CONSTITUTION IS DETERMINED ACCORDING TO APPARATUS RESOURCE INFORMATION} |
| FEEDER | \multicolumn{10}{l|}{FEEDER ARRANGEMENT IS DETERMINED ACCORDING TO APPARATUS RESOURCE INFORMATION} |

Rule labels across top: RULE 6 | RULE 2 | RULE 5 | RULE 1 | RULE 1

Fig.17

| TASK 1 | TASK 2 | TASK 3 | TASK 4 | TASK 5 |
|---|---|---|---|---|
| LOWER THAN 6mm | LOWER THAN 6mm | LOWER THAN 6mm | MIXED | 6mm OR HIGHER |
| HIGH SPEED | | | | LOW SPEED |

RULE 5 "IS NOT OBSERVED"

| TASK 1 | TASK 2 | TASK 3 | TASK 4 | TASK 5 | TASK 6 |
|---|---|---|---|---|---|
| LOWER THAN 6mm | LOWER THAN 6mm | LOWER THAN 6mm | LOWER THAN 6mm | 6mm OR HIGHER | 6mm OR HIGHER |
| HIGH SPEED | | | | | LOW SPEED |

RULE 5 "IS OBSERVED"

Fig. 18

| | TASK 1 | TASK 2 | TASK 3 | TASK 4 | TASK 5 | TASK 6 |
|---|---|---|---|---|---|---|
| RULE 5 "IS NOT OBSERVED" | LOWER THAN 6mm | LOWER THAN 6mm | LOWER THAN 6mm | MIXED | 6mm OR HIGHER | 6mm OR HIGHER |
| | HIGH SPEED | | | LOW SPEED | | |

| | TASK 1 | TASK 2 | TASK 3 | TASK 4 | TASK 5 | TASK 6 |
|---|---|---|---|---|---|---|
| RULE 5 "IS OBSERVED" | LOWER THAN 6mm | LOWER THAN 6mm | LOWER THAN 6mm | LOWER THAN 6mm | 6mm OR HIGHER | 6mm OR HIGHER |
| | HIGH SPEED | | | | LOW SPEED | |

Fig. 33

| RULE | CONTENT | STRICTNESS OF RULE | CLASSIFICATION IN ALGORITHM |
|---|---|---|---|
| RULE 1 | LIMITATION OF CAMERA | OPERATION STRICTLY PROHIBITED | STRICTLY OBSERVED RULE |
| RULE 2 | LIMITATION OF DEPTH OF FIELD | OPERATION STRICTLY PROHIBITED | STRICTLY OBSERVED RULE |
| RULE 3 | LIMITATION OF NUMBER OF NOZZLES | OPERATION PROHIBITED DEPENDING ON CONDITIONS | STRICTLY OBSERVED RULE |
| RULE 4 | LIMITATION OF NUMBER OF FEEDERS | OPERATION PROHIBITED DEPENDING ON CONDITIONS | STRICTLY OBSERVED RULE |
| RULE 5 | HIGHER SPEED NOZZLE OPERATION | CAUSE OF LOWER PRODUCTIVITY | DESIRABLY OBSERVED RULE |
| RULE 6 | HIGHER SPEED TWO-DIMENSIONAL IMAGE INPUT | CAUSE OF LOWER PRODUCTIVITY | DESIRABLY OBSERVED RULE |
| RULE 7 | ADJACENT PITCH AT COMPONENT SUCTION | LIMITATION AT TASK CONSTITUTION | |

Fig.34

| COMPONENT SIZE | WEIGHT (OCCUPIED GAP BETWEEN ADJACENT COMPONENTS) |
|---|---|
| 3.5×3.5 | 0.5 |
| 10×10 | 0.5 |
| 25×25 | 1 |
| 38×38 | 1.5 |
| 55×55 | 2 |
| 80×50 | 2.5 |
| 200×40 | 5 |

Fig.35

| COMPONENT THICKNESS GROUP | COMPONENT THICKNESS (T) |
|---|---|
| 1 | $0 < T \leq 4$ |
| 2 | $4 < T \leq 8$ |
| 3 | $8 < T \leq 13$ |
| 4 | $13 < T \leq 17$ |
| 5 | $17 < T \leq 21$ |
| 6 | $21 < T \leq 25$ |

Fig.36

| NUMBER OF COMPONENTS | 1 | 2 | 3 | 4 | 5 | 6 | 7 | 8 | 9 | 10 |
|---|---|---|---|---|---|---|---|---|---|---|
| SCORE | −8 | −6 | −4 | −2 | 0 | 2 | 4 | 6 | 8 | 10 |

METHOD FOR GENERATING COMPONENT MOUNTING DATA AND COMPONENT MOUNTING METHOD

This application is a National Stage application of PCT/JP00/06597, filed Sep. 26, 2000.

TECHNICAL FIELD

The present invention relates to a method and device for generating component mounting data for performing a component mounting operation, a method and device for mounting components, by which the mounting operation is performed based on this generated data and a computer readable recording medium storing a program for generating component mounting data, when components are mounted on a mounting target by using a component mounting apparatus equipped with various devices such as a component feeding device for feeding a plurality of components, a component holding member for holding fed components, a component recognition device for recognizing components held by the component holding member, a mounting target positioning device for positioning a mounting target onto which the components held by the component holding member and recognized are placed, a head having the component holding member and for moving the component holding member between the component feeding device, the component recognition device, and the mounting target positioning device and so forth, based on component information about a plurality of components to be placed on the mounting target (for example, a board or a component), mounting target information about the mounting target, and placing position information of the components for the mounting target.

BACKGROUND ART

Conventionally, when components are mounted on a board by using a component mounting apparatus including various devices such as a component feeding device, component recognition device, board positioning device, component holding member for holding the components, head having the component holding member, and so forth, an operator determines a component mounting procedure for groups of components to be mounted based on his own experience or the like.

In recent years, however, due to complicated structure and control of component mounting apparatus and diversified component sucking conditions, recognizing conditions, placing conditions, and user mounting requesting conditions, it has been becoming difficult to determine an appropriate mounting procedure in view of productivity, quality assurance or safety, or in view of prevention of causes of lower productivity or lower quality. Thus, a method and device are being required by which appropriate mounting data can be generated in consideration of these various conditions in view of productivity or the like, and a mounting operation can be performed based on this generated data.

Accordingly, an object of the present invention is to provide: a method and device for generating component mounting data by which these requirements can be responded to, and data for performing a component mounting operation when components are mounted on a mounting target can be appropriately generated in view of productivity, quality assurance, or safety, or in view of prevention of causes of lower productivity or lower quality; a method and device for mounting components by which a mounting operation can be performed based on appropriately generated data; and a computer readable recording medium wherein a program for generating the component mounting data is recorded.

SUMMARY OF THE INVENTION

To achieve the above object, the present invention is constituted as follows.

According to a first aspect of the present invention, there is provided a component mounting data generating method comprising:

preparing component information about a plurality of components to be placed onto a mounting target, mounting target information about the mounting target, and placing position information of the components for the mounting target, and preparing at least one or more conditions out of: (i) mounting apparatus conditions about a component feeding device for feeding the plurality of components, a component holding member for holding fed components, a component recognition device for recognizing components held by the component holding member, a mounting target positioning device for positioning the mounting target onto which the components held by the component holding member and recognized are to be placed, a head having the component holding member and for moving the component holding member between the component feeding device, the component recognition device, and the mounting target positioning device, and so forth in a mounting apparatus to be used; (ii) component holding conditions when the components are held, after being received from the component feeding device, by the component holding member; (iii) recognizing conditions when the components held by the component holding member are recognized by the recognition device; (iv) placing conditions when the components held by the component holding member are placed onto the mounting target and (v) user mounting requesting conditions;

judging whether or not a mounting operation, wherein the mounting apparatus is used to hold, recognize, and place the components, is a strictly observed rule, which must be strictly observed and without observation of which a corresponding operation cannot be performed, based on the component information, mounting target information, placing position information, and the at least one or more of the conditions, which are prepared as above, in view of productivity or quality assurance to generate the strictly observed rule; and generating data for performing a component mounting operation in consideration of this generated strictly observed rule.

According to a second aspect of the present invention, there is provided a component mounting data generating method comprising:

preparing component information about a plurality of components to be placed onto a mounting target, mounting target information about the mounting target, and placing position information of the components for the mounting target, and preparing at least one or more conditions out of: (i) mounting apparatus conditions about a component feeding device for feeding the plurality of components, a component holding member for holding fed components, a component recognition device for recognizing components held by the component holding member, a mounting target positioning device for positioning the mounting target onto which the components held by the component holding member and recognized are to be placed, a head having the component holding member and for moving the component holding member between the component feeding device, the component recognition device, and the mounting target positioning device, and so forth in a mounting apparatus to be used; (ii) component holding conditions when the components are held, after being received from the component feeding device, by the component holding member; (iii) recognizing conditions when the components held by the component holding member are recognized by the recognition device; (iv) placing conditions when the components held by the component holding member are placed onto the mounting target; and (v) user mounting requesting conditions;

judging whether or not a mounting operation, wherein the mounting apparatus is used to hold, recognize, and place the components, is a desirably observed rule, which is desirable to be observed, based on the component information, mounting target information, placing position information, and the at least one or more of the conditions, which are prepared as above, in view of prevention of lower productivity or lower quality, or in view of safety, to generate the desirably observed rule; and generating data for performing a component mounting operation in consideration of this generated desirably observed rule.

That is, according to the above-described first and second aspects, there is provided a method for generating component mounting data, comprising: preparing component information about a plurality of components to be placed onto a mounting target, mounting target information about the mounting target, and placing position information of the components for the mounting target, and preparing at least one or more conditions out of: (i) mounting apparatus conditions about a component feeding device for feeding the plurality of components, component holding member for holding fed components, component recognition device for recognizing components held by the component holding member, mounting target positioning device for positioning the mounting target onto which the components held by the component holding member and recognized are to be placed, head having the component holding member and for moving the component holding member between the component feeding device, the component recognition device, and the mounting target positioning device, and so forth in a mounting apparatus to be used; (ii) component holding conditions when the components are held, after being received from the component feeding device, by the component holding member; (iii) recognizing conditions when the components held by the component holding member are recognized by the recognition device; (iv) placing conditions when the components held by the component holding member are placed onto the mounting target; and (v) user mounting requesting conditions;

based on the component information, mounting target information, placing position information, and the at least one or more of the conditions, which are prepared as above, judging whether or not a mounting operation, wherein the mounting apparatus is used to hold, recognize, and place the components, is a strictly observed rule, which must be strictly observed and without observation of which a corresponding operation cannot be preformed, in view of productivity or quality assurance to generate the strictly observed rule, or judging whether or not a mounting operation, wherein the mounting apparatus is used to hold, recognize, and place the components, is a desirably observed rule, which is desirable to observe, in view of prevention of lower productivity or lower quality, or in view of safety, to generate the desirably observed rule; and generating data for performing a component mounting operation in consideration of a generated rule.

According to a third aspect of the present invention, there is provided a component mounting data generating method according to the first aspect, further comprising: judging whether or not a mounting operation, wherein the mounting apparatus is used to hold, recognize, and place the components, is a desirably observed rule, which is desirable to be observed, based on the component information, mounting target information, placing position information, and the at least one or more of the conditions, which are prepared as above, in view of prevention of lower productivity or lower quality, or in view of safety, to generate the desirably observed rule; and generating data for performing a component mounting operation in consideration of this generated desirably observed rule.

According to a fourth aspect of the present invention, there is provided a component mounting data generating method according to any one of the first to third aspects, wherein a mounting operation, wherein the mounting apparatus is used to hold, recognize, and place the components, is at least one of a component holding operation when the components are held, after being received from the component feeding device, by the component holding member, a recognizing operation when the components held by the component holding member are recognized by the recognition device, and a placing operation when the components held by the component holding member are placed onto the mounting target.

According to a fifth aspect of the present invention, there is provided a component mounting data generating method according to any one of the first to fourth aspects, further comprising automatically determining a component mounting procedure of mounting operations of all the components to be mounted in consideration of a generated rule to generate component mounting data for performing the component mounting operations.

According to a sixth aspect of the present invention, there is provided a component mounting data generating method according to any one of the first to fifth aspects, further comprising: automatically dividing a component mounting procedure of mounting operations of all the components to be mounted into component groups in consideration of generated rules; automatically dividing each divided component group into operation units for one head based on the mounting apparatus conditions, component holding conditions, recognizing conditions, placing conditions, and the user mounting requesting conditions; and assuming the divided operation unit as a task to examine mounting operations for each task, then to connect all tasks, and then to generate component mounting data for performing the component mounting operations.

According to a seventh aspect of the present invention, there is provided a component mounting data generating method according to the sixth aspect, further comprising: when each of the divided component groups is automatically divided into operation units each for one head to generate the tasks, assuming one virtual mounting apparatus having a highest production capacity from the mounting apparatus conditions and the user mounting requesting conditions; automatically dividing the component mounting procedure of mounting operations of all the components to be mounted into operation units each for one head of the virtual mounting apparatus; examining mounting operations for each divided task and then connecting all tasks to generate component mounting data for performing the component mounting operation.

According to an eighth aspect of the present invention, there is provided a component mounting data generating device comprising:

an information database for storing component information about a plurality of components to be placed onto a mounting target, mounting target information about the mounting target, and placing position information of the components for the mounting target;

a condition database for storing at least one or more conditions out of: (i) mounting apparatus conditions about a component feeding device for feeding the plurality of components, a component holding member for holding fed components, a component recognition device for recognizing components held by the component holding member, a mounting target positioning device for positioning the mounting target onto which the components held by the component holding member and recognized are to be placed, a head having the component holding member and for moving the component holding member between the component feeding device, the component recognition device, and the mounting target positioning device, and so forth in a mounting apparatus to be used; (ii) component holding conditions when the components are held, after being received from the component feeding device, by the component holding member; (iii) recognizing conditions when the components held by the component holding member are recognized by the recognition device; (iv) placing conditions when the components held by the component holding member are placed onto the mounting target; (v) and user mounting requesting conditions;

a strictly observed rule generation unit for judging whether or not a mounting operation, wherein the mounting apparatus is used to hold, recognize, and place the components, is a strictly observed rule, which must be strictly observed and without observation of which a corresponding operation cannot be performed, based on the component information, mounting target information, placing position information, and at least one or more of the conditions in view of productivity or quality assurance to generate the strictly observed rule; and a data generation unit for generating data for performing a component mounting operation in consideration of this generated strictly observed rule.

According to a ninth aspect of the present invention, there is provided a component mounting data generating device comprising:

an information database for storing component information about a plurality of components to be placed onto a mounting target, mounting target information about the mounting target, and placing position information of the components for the mounting target;

a condition database for storing at least one or more conditions out of: (i) mounting apparatus conditions about a component feeding device for feeding the plurality of components, a component holding member for holding fed components, a component recognition device for recognizing components held by the component holding member, a mounting target positioning device for positioning the mounting target onto which the components held by the component holding member and recognized are to be placed, a head having the component holding member and for moving the component holding member between the component feeding device, the component recognition device, and the mounting target positioning device, and so forth in a mounting apparatus to be used; (ii) component holding conditions when the components are held, after being received from the component feeding device, by the component holding member (iii) recognizing conditions when the components held by the component holding member are recognized by the recognition device (iv) placing conditions when the components held by the component holding member are placed onto the mounting target; and (v) user mounting requesting conditions;

a desirably observed rule generation unit for judging whether or not a mounting operation, wherein the mounting apparatus is used to hold, recognize, and place the components is a desirably observed rule, which is desirable to be observed, based on the component information, mounting target information, placing position information, and at least one or more of the conditions in view of prevention of lower productivity or lower quality, or in view of safety, to generate the desirably observed rule; and a data generation unit for generating data for performing a component mounting operation in consideration of this generated desirably observed rule.

That is, according to the eighth and ninth aspects of the present invention, there is provided a component mounting data generating device comprising: an information database storing component information about a plurality of components to be placed onto a mounting target, mounting target information about the mounting target, and placing position information of the components for the mounting target;

a condition database for storing at least one or more conditions out of: (i) mounting apparatus conditions about a component feeding device for feeding the plurality of components, component holding member for holding fed components, component recognition device for recognizing components held by the component holding member, mounting target positioning device for positioning the mounting target onto which the components held by the component holding member and recognized are to be placed, head having the component holding member and for moving the component holding member between the component feeding device, the component recognition device, and the mounting target positioning device, and so forth in the mounting apparatus to be used; (ii) component holding conditions when the components are held, after being received from the component feeding device, by the component holding member, recognizing conditions when the components held by the component holding member are recognized by the recognition device; (iv) placing conditions when the components held by the component holding member are placed onto the mounting target; (v) and user mounting requesting conditions;

a rule generation unit for judging based on the component information, the mounting target information, the placing position information, and the at least one or more of the conditions, whether or not a mounting operation, wherein the mounting apparatus is used to hold, recognize, and place the components, is a strictly observed rule, which must be strictly observed and without observation of which a corresponding operation cannot be preformed, in view of productivity or quality assurance to generate the strictly observed rule, or whether or not a mounting operation, wherein the mounting apparatus is used to hold, recognize, and place the components, is a desirably observed rule, which is desirable to observe, in view of prevention of lower productivity or lower quality, or in view of safety, to generate the desirably observed rule; and a data generation unit for generating data for performing a component mounting operation in consideration of a generated rule.

According to a tenth aspect of the present invention, there is provided a component mounting data generating device according to the eighth aspect, wherein whether or not a mounting operation, wherein the mounting apparatus is used to hold, recognize, and place the components is a desirably observed rule, which is desirable to be observed, is judged based on the component information, mounting target information, placing position information, and at least one or more of the conditions, which are prepared as above, in view of prevention of lower productivity or lower quality, or in view of safety, to generate a desirably observed rule; and data for performing the component mounting operation is generated in consideration of this generated desirably observed rule.

According to an eleventh aspect of the present invention, there is provided a component mounting data generating device according to any one of the eighth to tenth aspects, wherein a mounting operation, wherein the mounting apparatus is used to hold, recognize, and place the components, is at least one of a component holding operation when the components are held, after being received from the component feeding device, by the component holding member, a recognizing operation when the components held by the component holding member are recognized by the recognition device, and a placing operation when the components held by the component holding member are placed onto the mounting target.

According to a twelfth aspect of the present invention, there is provided a component mounting data generating device according to any one of the eighth to eleventh aspects, wherein a component mounting procedure of mounting operations of all the components to be mounted is automatically determined in consideration of a rule to generate component mounting data for performing the component mounting operation.

According to a thirteenth aspect of the present invention, there is provided a component mounting data generating device according to any one of eighth to twelfth aspects, wherein the component mounting procedure of mounting operations of all the components to be mounted is automatically divided into component groups in consideration of a generated rule, each divided component group is automatically divided into operation units each for one head based on the mounting apparatus conditions, component holding conditions, recognizing conditions, placing conditions, and the user mounting requesting conditions, the divided operation unit is assumed as a task, mounting operations are examined for each task, and then all tasks are connected to generate component mounting data for performing the component mounting operation.

According to a fourteenth aspect of the present invention, there is provided a component mounting data generating device according to the thirteenth aspect, wherein, when each of the divided component groups is automatically divided into operation units each for one head to generate the task, one virtual mounting apparatus having a highest production capacity is assumed from the mounting apparatus conditions and the user mounting requesting conditions, the component mounting procedure of mounting operations of all the components to be mounted is automatically divided into operation units each for one head of the virtual mounting apparatus, mounting operations are examined for each divided task and then all tasks are connected to generate component mounting data for performing the component mounting operation.

According to a fifteenth aspect of the present invention, there is provided a component mounting data generating method according to any one of the first to seventh aspects, wherein: the component information is information about the plurality of components to be placed onto the mounting target, which includes length, width, and height of the components; the mounting target information is information about the mounting target, which includes vertical and horizontal sizes of the mounting target; and the placing position information is placing position information of the components to be mounted for the mounting target.

According to a sixteenth aspect of the present invention, there is provided a component mounting data generating method according to any one of the first to seventh aspects, wherein:

the mounting apparatus conditions include at least one condition out of a number of mounting apparatuses, constitution of the head of each apparatus, constitution of the component holding member of each head, constitution of component feeding cassettes of the component feeding device, constitution of a tray feed unit of the component feeding device, constitution of cameras of the recognition device, and constitution of a station for replacing the component holding member;

the component holding conditions includes at least one condition out of component holding surface heights, pitches of the component holding members, pitches of the component feeding cassettes of the component feeding device, component holding method, and rotation before recognition for positional correction before placement;

the recognizing conditions include at least one condition out of constitution of recognition cameras of the recognition device, recognition surface heights of components, depth of field of the cameras, and component pitches;

the placing conditions include at least one condition out of component placement order, whether shorter components are mounted first and then taller ones are mounted or in the reverse order, whether components having small dimensions are mounted first and then those having large dimensions are mounted or in the reverse order, and arrangement of components on the mounting target; and the user mounting requesting conditions include at least one condition out of a number of component holding members included, a number of component feeding cassettes included, component mounting order, mounting order wherein shorter components are mounted first and then successively taller ones later, and order specification for specified components.

According to a seventeenth aspect of the present invention, there is provided a component mounting data generating method according to the first or third aspect, wherein strictly observed rules on the recognizing conditions include at least one of the following rules:

- a rule that a two-dimensional camera and a three-dimensional camera, or a large-size three-dimensional camera and a small-size three-dimensional camera, of the recognition device cannot coexist in one operation unit of one task, that is, one head, since these cameras have different head moving speeds;
- a rule that, in one task using a two-dimensional camera of the recognition device, components in the task must be limited so that component height variation is at most 4 mm of a depth of field;
- a rule that, since kind and number of the component holding members allocated to each head are different, components to be placed in the task must be determined based on resource information of a component holding member; and
- a rule that, since kind and number of component feeding cassette feeders of the component feeding device owned by a user are different, arrangement of the feeders must be determined based on resource information of a feeder.

According to an eighteenth aspect of the present invention, there is provided a component mounting data generating method according to the first or third aspect, wherein strictly observed rules based on the component holding conditions include a component holding rule that, when components are simultaneously held by a plurality of component holding members, components can be held only after being received from adjacent component feed units in the component feeding device; and strictly observed rules based on the user mounting requesting conditions include a rule that a maximum number of components that can be sucked in one sucking operation determined by the user mounting requesting conditions is a number of nozzles disposed in one head.

According to a nineteenth aspect of the present invention, there is provided a component mounting data generating method according to the second or third aspect, wherein desirably observed rules based on the placing condition include one of the following rules:

- a rule that components of at most 6 mm are desirably united in one operation unit for one task, that is, one head, to speed up a placing operation; and
- a rule that, to speed up a placing operation, it is desirable to divide a task so that components recognized by a large-size two-dimensional camera and a small-size two-dimensional camera of the recognition device are not mixed in one task.

According to a twentieth aspect of the present invention, there is provided a component mounting data generating method according to the second or third aspect, wherein desirably observed rules based on user mounting requesting conditions is any one of a rule that a moving distance of the head is minimized, a rule that causes of lower productivity are minimized, a rule that mounting is started with shorter components, and a rule that a mounting order is determined so that component feeding cassettes of the component feeding device are not moved a large distance at once.

According to a twenty-first aspect of the present invention, there is provided a component mounting data generating method according to the sixth aspect, wherein, when mounting operations are examined for each task, each task is generated so that tasks for mounting components onto the mounting target are minimized, and then all the tasks are connected to generate component mounting data for performing the component mounting operation.

According to a twenty-second aspect of the present invention, there is provided a component mounting data generating method according to the sixth or twenty-first aspect, wherein, when mounting operations are examined for each task, it is judged whether or not there is a portion wherein the desirably observed rule is not observed.

According to a twenty-third aspect of the present invention, there is provided a component mounting data generating method according to the twenty-second aspect, wherein, when mounting operations are examined for each task and it is judged that there is a portion wherein the desirably observed rule is not observed, a mounting operation of the portion is simulated and whether or not the desirably observed rule should be observed is judged.

According to a twenty-fourth aspect of the present invention, there is provided a component mounting data generating method according to the twenty-third aspect, wherein, when mounting operations are examined for each task and it is judged that there is a portion wherein the desirably observed rule is not observed, a mounting operation of the portion is simulated and whether or not the desirably observed rule should be observed is judged in view of shortening of a time required for all the tasks as a whole.

According to a twenty-fifth aspect of the present invention, there is provided a component mounting method for performing a mounting operation based on component mounting data generated by the component mounting data generating method according to any one of the first to seventh and fifteenth to twenty-fourth aspects.

According to a twenty-sixth aspect of the present invention, there is provided a component mounting device for performing a mounting operation based on component mounting data generated by the component mounting data generating device according to any one of the eighth to fourteenth aspects.

According to a twenty-seventh aspect of the present invention, there is provided a computer readable recording medium storing a generation program to generate component mounting data recorded by a computer, the program comprising:

preparing component information about a plurality of components to be placed onto a mounting target, mounting target information about the mounting target, and placing position information of the components for the mounting target, and preparing at least one or more conditions out of: (i) mounting apparatus conditions about a component feeding device for feeding the plurality of components, a component holding member for holding fed components, a component recognition device for recognizing components held by the component holding member, a mounting target positioning device for positioning the mounting target onto which the components held by the component holding member and recognized are to be placed, a head having the component holding member and for moving the component holding member between the component feeding device, the component recognition device, and the mounting target positioning device, and so forth in a mounting apparatus to be used; (ii) component holding conditions when the components are held by the component holding member after being received from the component feeding device; (iii) recognizing conditions when the components held by the component holding member are recognized by the recognition device; (iv) placing conditions when the components held by the component holding member are placed onto the mounting target; and (v) user mounting requesting conditions;

judging whether or not a mounting operation, wherein the mounting apparatus is used to hold, recognize, and place the components, is a strictly observed rule, which must be strictly observed and without observation of which a corresponding operation cannot be performed, based on the component information, mounting target information, placing position information, and the at least one or more of the conditions, which are prepared above, in view of productivity or quality assurance to generate the strictly observed rule;

judging whether or not a mounting operation, wherein the mounting apparatus is used to hold, recognize, and place the components is a desirably observed rule, which is desirable to be observed, based on the component information, mounting target information, placing position information, and the at least one or more of the conditions, which are prepared above, in view of prevention of lower productivity or lower quality, or in view of safety, to generate the desirably observed rule;

generating data for performing the component mounting operation in consideration of this generated strictly observed rule and desirably observed rule;

automatically dividing a component mounting procedure of mounting operations of all the components to be mounted into component groups in consideration of the rules;

based on the mounting apparatus conditions, the component holding conditions, the recognizing conditions, the placing conditions, and the user mounting requesting conditions for each of the divided component groups, assuming one virtual mounting apparatus having a highest production capacity from the mounting apparatus conditions and the user mounting requesting conditions, automatically dividing each divided component group into operation units each for one head of the virtual mounting apparatus, and assuming the divided operations unit as a task; and after mounting operations are examined for each divided task, connecting all tasks to generate the program for component mounting data for performing a component mounting operation.

BRIEF DESCRIPTION OF DRAWINGS

These and other aspects and features of the present invention will become clear from the following description taken in conjunction with the preferred embodiments thereof with reference to the accompanying drawings, in which:

FIG. 15 is a view for explaining more specific mounting apparatus conditions in the one embodiment;

FIG. 16 is a view for explaining an example when a border, formed based on a strictly observed rule and a border formed based on a desirably observed rule, are determined in the one embodiment;

FIG. 17 is a view for explaining a difference between when a desirably observed rule is not observed and when it is observed in the one embodiment;

FIG. 18 is a view for explaining a difference between when a desirably observed rule is observed and when it is not observed in the one embodiment;

FIG. 33 is a view for explaining strictly observed rules and desirably observed rules in the one embodiment;

FIG. 34 is a view for explaining an example of a required numbers of nozzles each weighted by a component size in the one embodiment;

FIG. 35 is a view for explaining an example of a relationship between component thickness groups and component thicknesses (T) in the one embodiment;

FIG. 36 is a view for explaining an example of evaluation of task groups in the one embodiment;

DETAILED DESCRIPTION OF THE PREFERRED EMBODIMENTS

Figure 1:
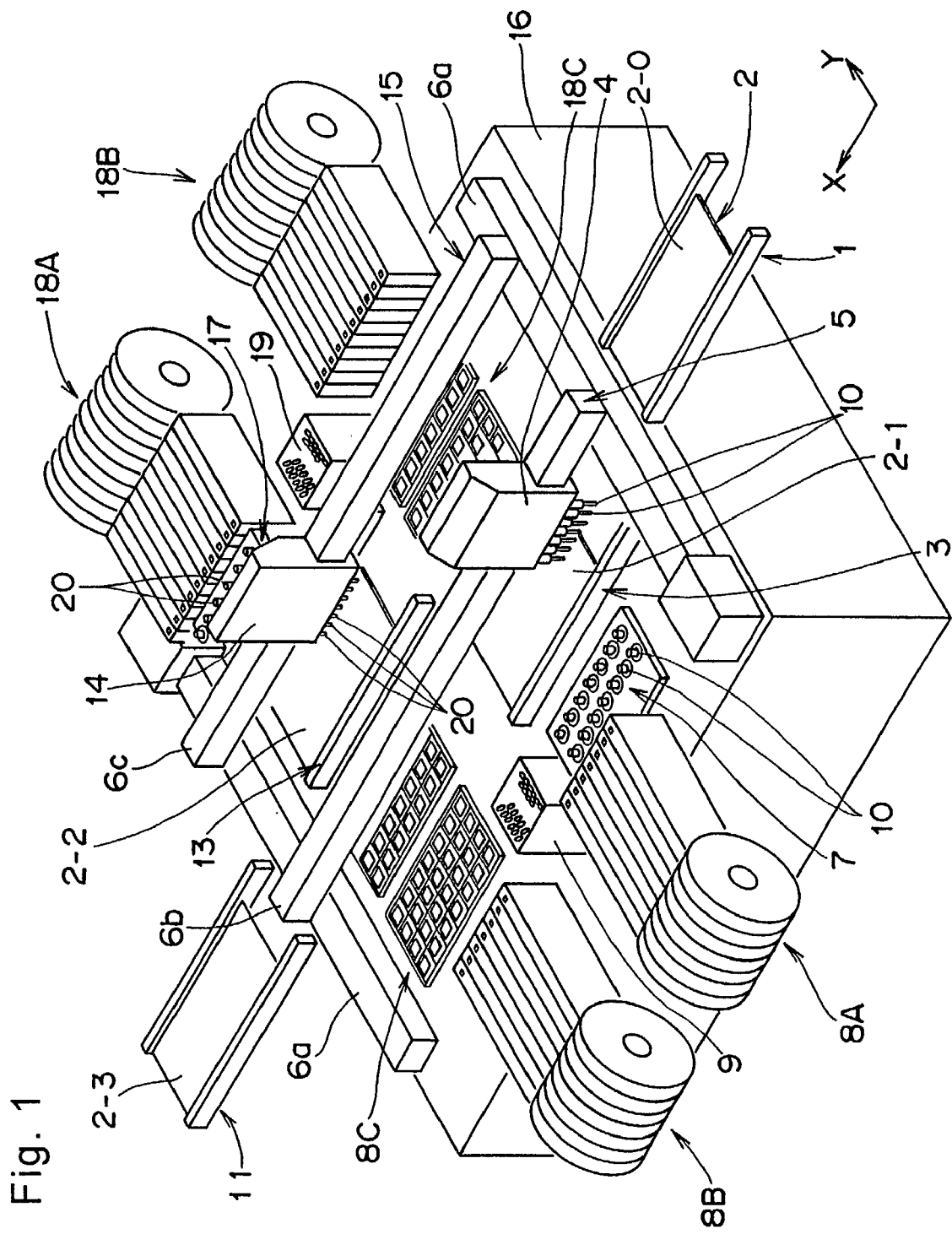
FIG. 1 is a schematic general perspective view showing a component mounting apparatus to which a component mounting device and method according to one embodiment of the present invention can be applied.

Before description of the present invention proceeds, it is to be noted that like parts are designated by like reference numerals throughout the accompanying drawings.

Embodiments of the present invention are described in detail below with reference to the accompanying drawings.

It is noted that, in the present DESCRIPTION, a term "mount" is used as having a concept including component holding, component recognition, and component placement. "Mounting apparatus" is used as having a concept including a component feeding device, component recognition device, board positioning device, and so forth. "Mounting device" is used as having a concept including one or a plurality of mounting apparatuses to be used and a control unit for controlling the mounting apparatus and generating and controlling rules, mounting data, and the like.

A component mounting data generating method and device for generating component mounting data, and a component mounting method and device for performing a component mounting operation by using generated data according to one embodiment of the present invention, are a component mounting data generating method and device for generating component mounting data, and a component mounting method and device for mounting components based on generated data when components are mounted; that is, sucked, recognized, and placed by using a mounting apparatus such as a component feeding device for feeding a plurality of components, suction nozzles functioning as an example of a component holding member for holding these fed components, a component recognition device for recognizing the components held by the suction nozzles, a board positioning device for positioning a mounting target onto which the components held by the suction nozzle and recognized are to be placed, for example, a board, and a head having the suction nozzles and for moving the suction nozzles between the component feeding device, the component recognition device, and the board positioning device.

Figure 2:
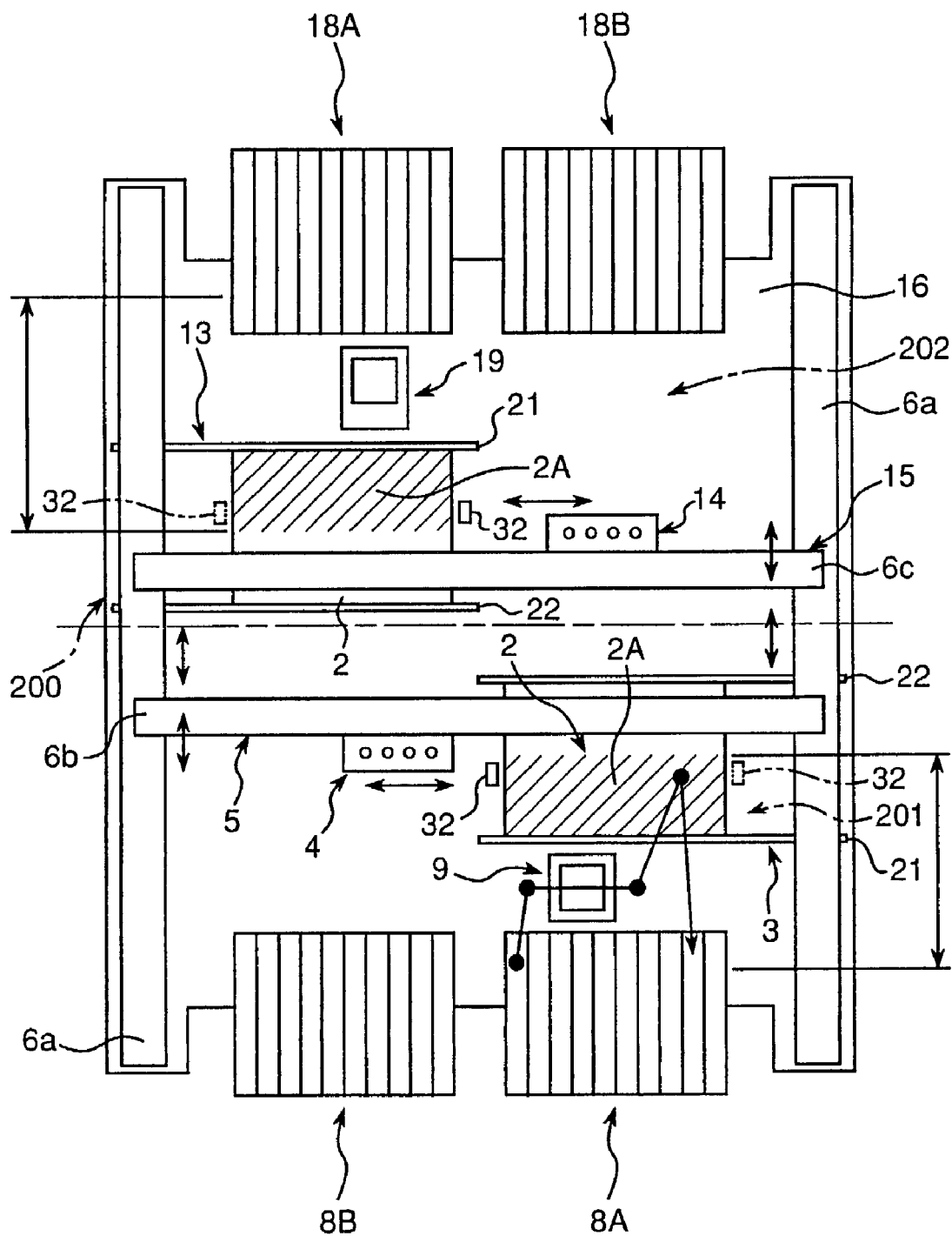
FIG. 2 is a schematic general plan view showing the component mounting apparatus shown in FIG. 1.
Figure 3:
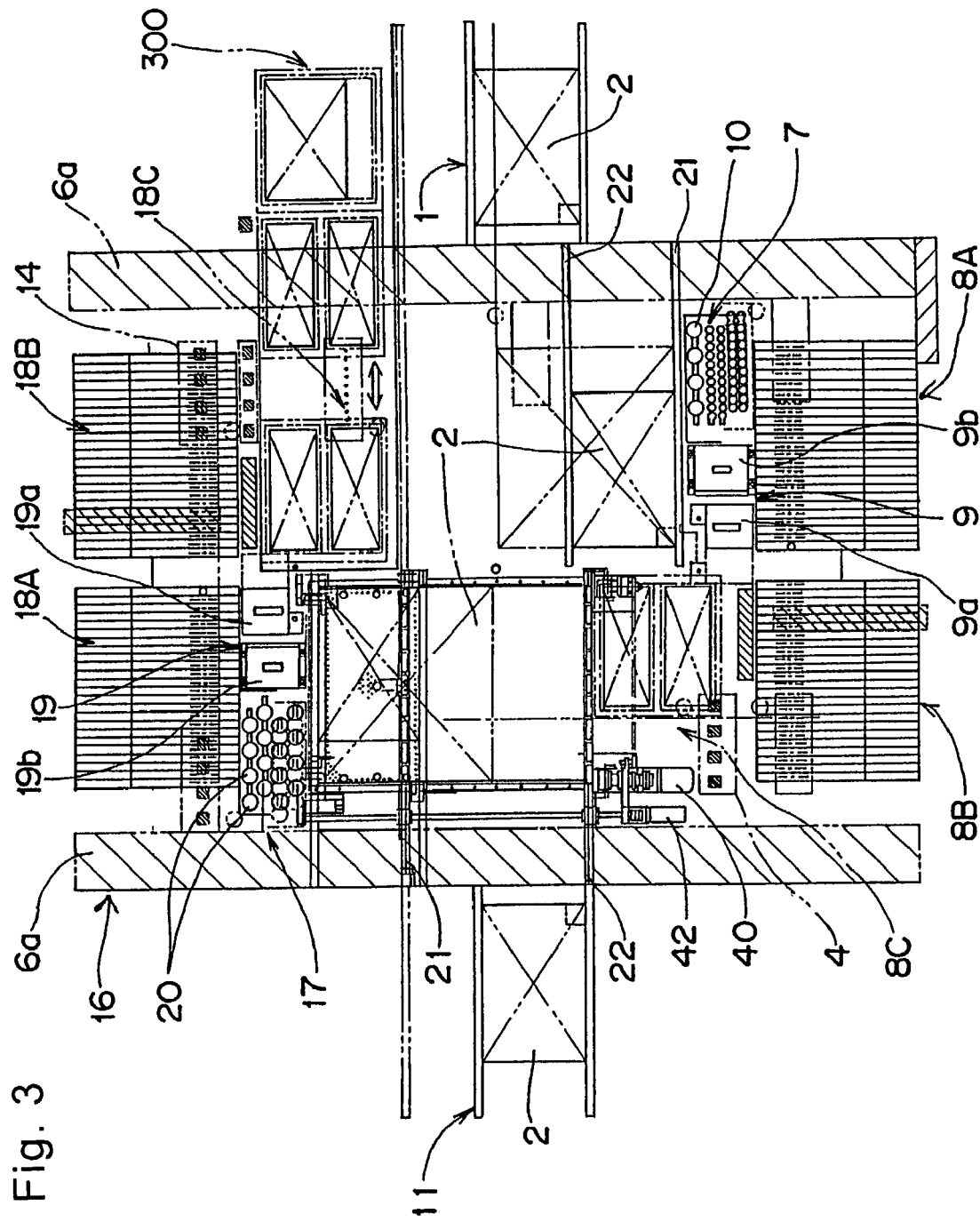
FIG. 3 is a detailed general plan view showing the component mounting apparatus shown in FIG. 1.

FIGS. 1 to 3 show one example of a mounting apparatus to which the method and device for generating component mounting data, and the method and device for mounting components by using this generated data according to the embodiment, are applicable.

As described above, the mounting apparatus of this embodiment of the present invention has at least a component feeding device for feeding a plurality of components, suction nozzles functioning as examples of component holding members for holding fed components, a component recognition device for recognizing the components held by the suction nozzles, a board positioning device for positioning a mounting target onto which the components held by the suction nozzles and recognized are to be placed, for example, a board, and a head having the suction nozzles and for moving the suction nozzles between the component feeding device, the component recognition device, and the board positioning device, and so forth. The above mounting apparatus at least having such devices and members can be applied to various mounting apparatuses.

As shown in FIGS. 1 to 3, the component mounting apparatus as one example where this embodiment can be applied mounts components onto a board 2 (a board referred to irrespective of its position is designated by reference numeral 2, while boards at certain positions are designated by reference numerals 2-0, 2-1, 2-2, 2-3, and so forth), onto which components are to be mounted. A board conveying/holding device for holding the board 2 also functions as the board positioning device.

In the component mounting apparatus, two boards 2 are disposed in zigzag in a component mounting work area and components can be independently mounted on each of them. Therefore, two sets of working heads, drive units thereof, board conveying/holding devices, recognition cameras as an example of recognition devices, and so forth are disposed. Hereinafter, these two sets on a front side of an operator and a rear side of the operator are referred to "front-side mounting unit" and "rear-side mounting unit", respectively. Furthermore, each board conveying/holding device for holding a board 2 is moved to a position closer to a component feed unit as an example of the component feeding device (for example, a component feeding cassette, a tray feed unit, or the like) in each mounting area to mount components. As a reference for adjusting the board conveying/holding device according to a width of the board 2 (distance adjustment according to board width) in a front-side mounting area (front-side mounting unit) closer to the operator, out of the two divided component mounting work areas, the front-side reference is used, while as that in the other mounting area (rear-side mounting unit), which is further from the operator, the rear-side reference is used. Consequently, a mounting tact can be shortened by minimizing a movement distance of the working head from component feeding, component recognition, to component placement. Conveyed boards 2 are once positioned in a central portion and then a board on the right hand side is positioned to the left, while a board on the left side is positioned to the right so that the mounting movement distance can be reduced due to their positions in a board center, resulting in a shorter tact. Furthermore, when the boards 2 are positioned in zigzag, tray feed units can be disposed in zigzag. Therefore, a successively disposed number of component feed cassettes does not need to be reduced and a tray feed unit and recognition position can be positioned close to one another, thereby shortening mounting tact. Thus, this mounting apparatus has various advantages.

A constitution of the component mounting apparatus is explained below. Through drawings, like constituent elements are designated by like reference numerals.

FIGS. 1 to 3 are a general schematic perspective view, a plan view showing the component mounting apparatus, and a detail general plan view showing the component mounting device in FIG. 1, respectively. A component mounting work area 200 of the mounting apparatus is divided into two areas along a component conveying direction; a first mounting area 201 and a second mounting area 202. In FIGS. 1 to 3, reference numeral 1 denotes a loader, which is disposed on a board carrying-in side of the component mounting work area 200 and carries a board 2 into a central portion of the component mounting work area 200, in which the first mounting area 201 and the second mounting area 202 adjoin. Reference numeral 11 is an unloader, which is disposed on a board carrying-out side of the component mounting work area 200 and carries the board 2 out from the central portion of the component mounting work area 200, in which the first mounting area 201 and the second mounting area 202 adjoin. In this mounting apparatus, various constituent elements are positioned point-symmetrically with respect to a central point of the component mounting work area 200 as follows.

That is, reference numeral 3 denotes a first board conveying/holding device equipped with a pair of support rails 21, 22 for conveying and holding the board 2 carried in from the loader 1 in the first mounting area 201. Reference numeral 4 denotes a working head, to which a plurality of, for example, ten component suction nozzles 10 for sucking and holding electronic components in the first mounting area 201 are replaceably attached. Reference numeral 5 denotes an XY robot, which positions the working head 4 in the first mounting area 201 at an arbitrary position in X-Y directions, which are two directions perpendicular to each other in the first mounting area 201. Reference numeral 7 denotes a nozzle station, which is disposed in the vicinity of a component feed unit 8A, described later, in the first mounting area 201, houses a plurality of kinds of nozzles 10 suitable for a plurality of kinds of electronic components, and replaces these nozzles for nozzles 10 attached to the working head 4 as required. Reference numerals 8A, 8B denote component feed units (for example, component feed cassettes), which are positioned at an end portion on a closer side, that is, the front side of the first mounting area 201, and house taping components which are components housed and held in a tape and are to be mounted onto the board 2. Reference numeral 8C denotes a component feed unit (for example, tray feed unit), which is disposed in the vicinity of the component feed unit 8B in the first mounting area 201 and houses tray components, which are components housed and held on a tray and are to be mounted onto the board 2. Reference numeral 9 denotes a recognition camera, which is disposed in the vicinity of the component feed unit 8A in the first mounting area 201 on a side closer to a center of the component mounting work area and picks up an image of a suction attitude of an electronic component sucked by a nozzle 10 of the working head 4. Reference numeral 9a in FIG. 3 denotes a two-dimensional camera of the recognition camera 9. Reference numeral 9b denotes a three-dimensional camera of the recognition camera 9.

Meanwhile, reference numeral 13 denotes a second board conveying/holding device equipped with a pair of support rails 21, 22 for conveying and holding the board 2 in the second mounting area 202 carried in from the first board conveying/holding device 3 in the first mounting area 201. Reference numeral 14 denotes a working head, to which a plurality of, for example, ten component suction nozzles 20 for sucking and holding electronic components are replaceably attached in the second mounting area 202. Reference numeral 15 denotes an XY robot, which positions the working head 14 in the second mounting area 202 at an arbitrary position in X-Y directions, which are two directions perpendicular to each other in the second mounting area 202. Reference numeral 17 denotes a nozzle station, which is disposed in the vicinity of a component feed unit 18A, described later, in the second mounting area 202, houses a plurality of kinds of nozzles 20 suitable for a plurality of kinds of electronic components, and replaces these nozzles for nozzles 20 attached to the working head 14 as required. Reference numerals 18A, 18B denote component feed units (for example, component feed cassettes), which are positioned at an end portion on a side of the second mounting area 202 further from the operator, that is, on the rear side, and house taping components which are components housed and held in a tape and are to be mounted onto the board 2. Reference numeral 18C denotes a component feed unit (for example, tray feed unit), which is disposed in the vicinity of the component feed unit 18B in the second mounting area 202 and houses tray components, which are components housed and held on a tray and are to be mounted onto the board 2. Reference numeral 19 denotes a recognition camera, which is disposed in the vicinity of the component feed unit 18A in the second mounting area 202 area on a side closer to the center of the component mounting work and picks up an image of a suction attitude of an electronic component sucked by a nozzle 20 of the working head 14. Reference numeral 19a in FIG. 3 denotes a two-dimensional camera of the recognition camera 19. Reference numeral 19b denotes a three-dimensional camera of the recognition camera 19.

The XY robot 5, 15 is constituted as follows. Two Y-axis drive units 6a, 6a of an XY robot device are fixed and disposed at front and rear end edges in a board conveying direction of the component mounting work area 200 on a mounting apparatus base 16. Two X-axis drive units 6b, 6c are disposed across these two Y-axis drive units 6a, 6a so as to move independently in the Y-axis direction and avoid collision. Furthermore, the working head 4 moving in the first mounting area 201 is disposed on the X-axis drive unit 6b movably in the X-axis direction. The working head 14 moving in the second mounting area 202 is disposed on the X-axis drive unit 6c movably in the X-axis direction. Therefore, the XY robot 5 is constituted by the two Y-axis drive units 6a, 6a fixed to the mounting apparatus base 16, the X-axis drive unit 6b movable in the Y-axis direction on the Y-axis drive units 6a, 6a, and the working head 4 movable in the X-axis direction on the X-axis drive unit 6b. Furthermore, the XY robot 15 is constituted by the two Y-axis drive units 6a, 6a fixed to the mounting apparatus base 16, the X-axis drive unit 6c movable in the Y-axis direction on the Y-axis drive units 6a, 6a, and the working head 14 movable in the X-axis direction on the X-axis drive unit 6c.

According to the above constitution, component mounting work area 200 for the board 2 is divided into two areas, the first mounting area 201 and the second mounting area 202, assuming a board conveyance path from the board carrying-in side to the board carrying-out side as a center. In the first mounting area 201, board 2-1 is carried into the first mounting area 201 by the loader 1. The board 2-1 is positioned and held for a mounting operation at a portion closest to the component feed unit 8A and the recognition camera 9, as an example of a first component recognition unit, disposed at an end portion of the first mounting area 201 along a direction of the board conveyance path. Subsequently, in the first mounting area 201, components are sucked and held from the component feed units 8A, 8B and placed on at least a half area (a shaded area 2A in FIG. 2) of the board 2-1 on the front side with respect to an operator on a side closer to the first component feed unit 8A. Subsequently, after this mounting work in the first mounting area 201 is finished, the board 2-1 is positioned and held for a mounting operation at a portion closest to the component feed unit 18A and the recognition camera 19, as an example of a second component recognition unit, of the second mounting area 202. Subsequently, in the second mounting area 202, components are sucked and held from the component feed units 18A, 18B and placed at least on a half area (shaded area 2A in FIG. 2) of the board 2-1 on a rear side viewed from the operator on a side closer to the component feed unit 18A. Subsequently, after this mounting work is finished in the second mounting area 202, the board 2-1 is carried out from the second mounting area 202 by the unloader 11. As a result, shortest distances between the board 2 positioned at each mounting area 201, 202, the component feed unit 8A, 18A and each recognition camera 9, 19 can be substantially reduced as compared with a conventional case where a board is held on a board conveyance path in a component mounting work area. Thus, mounting time can be shortened and productivity can be improved.

That is, one component mounting work area 200 of one mounting apparatus is divided into two areas, the first mounting area 201 and the second mounting area 202, so that two boards 2 can be located to mount components. Furthermore, the boards are moved reciprocally in each mounting area so that components are fed, recognized, and placed on an end edge side of the mounting area close a corresponding component feed unit. For example, the board 2 in the first mounting area 201 is positioned at the front-side end edge of the mounting area, while the board 2 in the second mounting area 202 is positioned at the rear-side end edge of the mounting area. Therefore, the recognition camera 9, 19 and board 2-0, 2-1 approach each other to have a shortest distance therebetween, irrespective of a size of the board 2, when a mounting operation is performed. Consequently, the moving distance of the working head 4, 14, that is, distances between positions for three operations, i.e. suction, recognition, and placement of components are minimized. Thus, mounting tact can be shortened and production efficiency can be improved. In particular, when components are conventionally mounted onto a board 2 in the vicinity of the board conveying position, distances between positions for three operations, i.e. suction, recognition, and placement of components are long for a small board, thereby resulting in a longer mounting tact. In this mounting apparatus, however, whether a board is small or large, the board is positioned for mounting operations so that the distances between positions for three operations, i.e. suction, recognition, and placement of components, become short. Therefore, mounting tact can be substantially reduced. In particular, in each mounting area, the component feed units 8A, 8B, 18A, 18B are disposed almost at entire end edges along the board conveying direction in the component mounting work area as shown in FIGS. 2 and 3. Therefore, the recognition camera 9, 19 is disposed on a central side of the component mounting work area 200 while the board 2 is also positioned on the central side of the component mounting work area 200 in the board conveying/holding device 3, 13 so that the distances between positions for the three operations of suction, recognition, and placement of components become shorter. Thus, mounting tact can be further improved. Furthermore, since one component mounting work area 200 is divided into two, a moving distance of the working heads 4, 14 is reduced and thus the mounting tact can be improved. For example, in the mounting apparatus of this embodiment, time required to mount one component can be reduced to about half of that required in a conventional apparatus. Thus, mounting tact can be substantially improved.

Furthermore, since two boards 2, 2 are positioned diagonally, that is, in zigzag, in the component mounting work area 200, mounting efficiency can be improved as compared with a conventional case, where only one board 2 is positioned.

Figure 4:
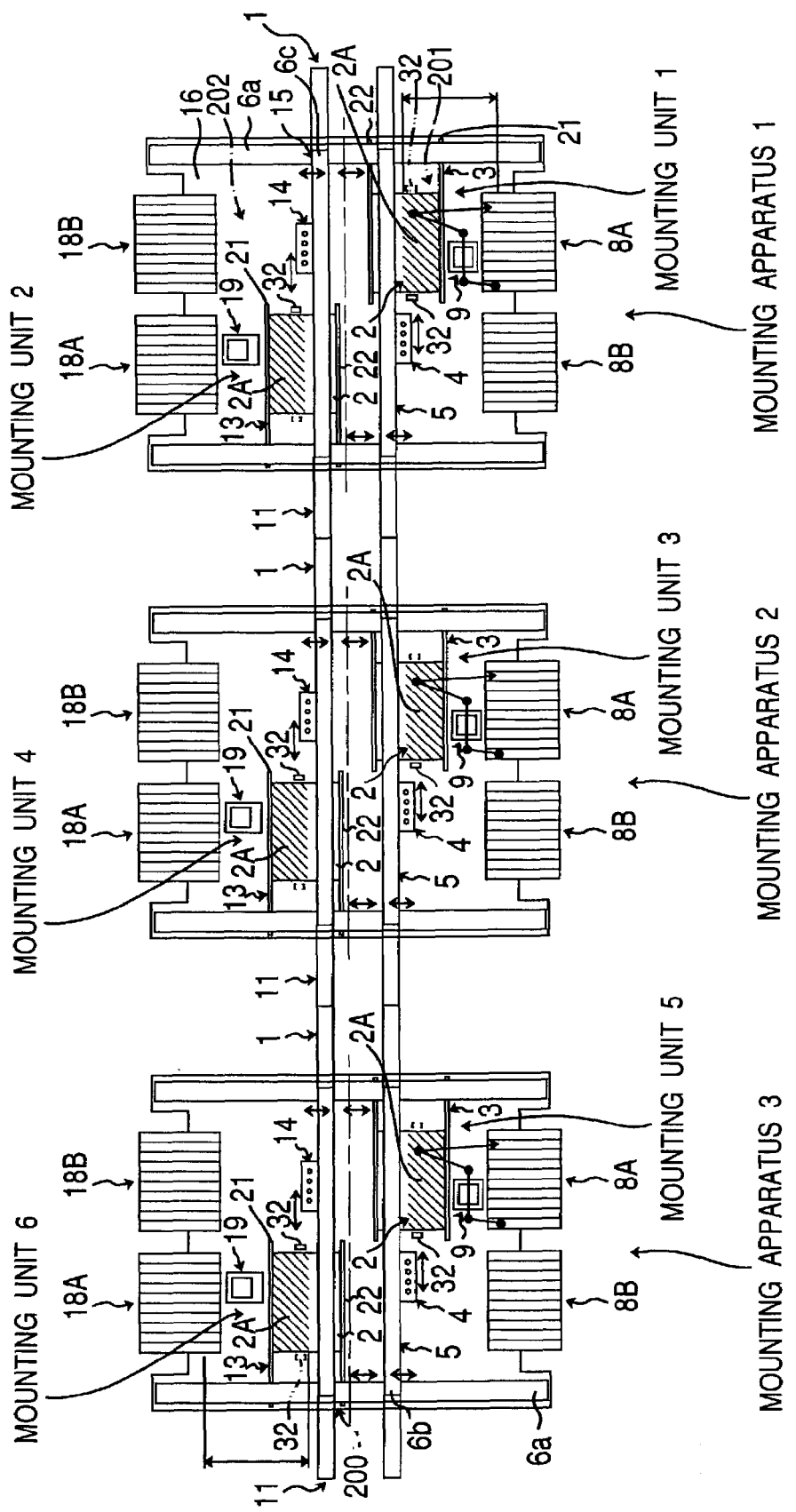
FIG. 4 is a detailed general plan view showing a case where three mounting apparatuses of FIG. 1 are connected.

A case where three of the mounting apparatuses are connected as shown in FIG. 4 is explained in one example used in the component mounting data generating method and device described later.

Figure 5:
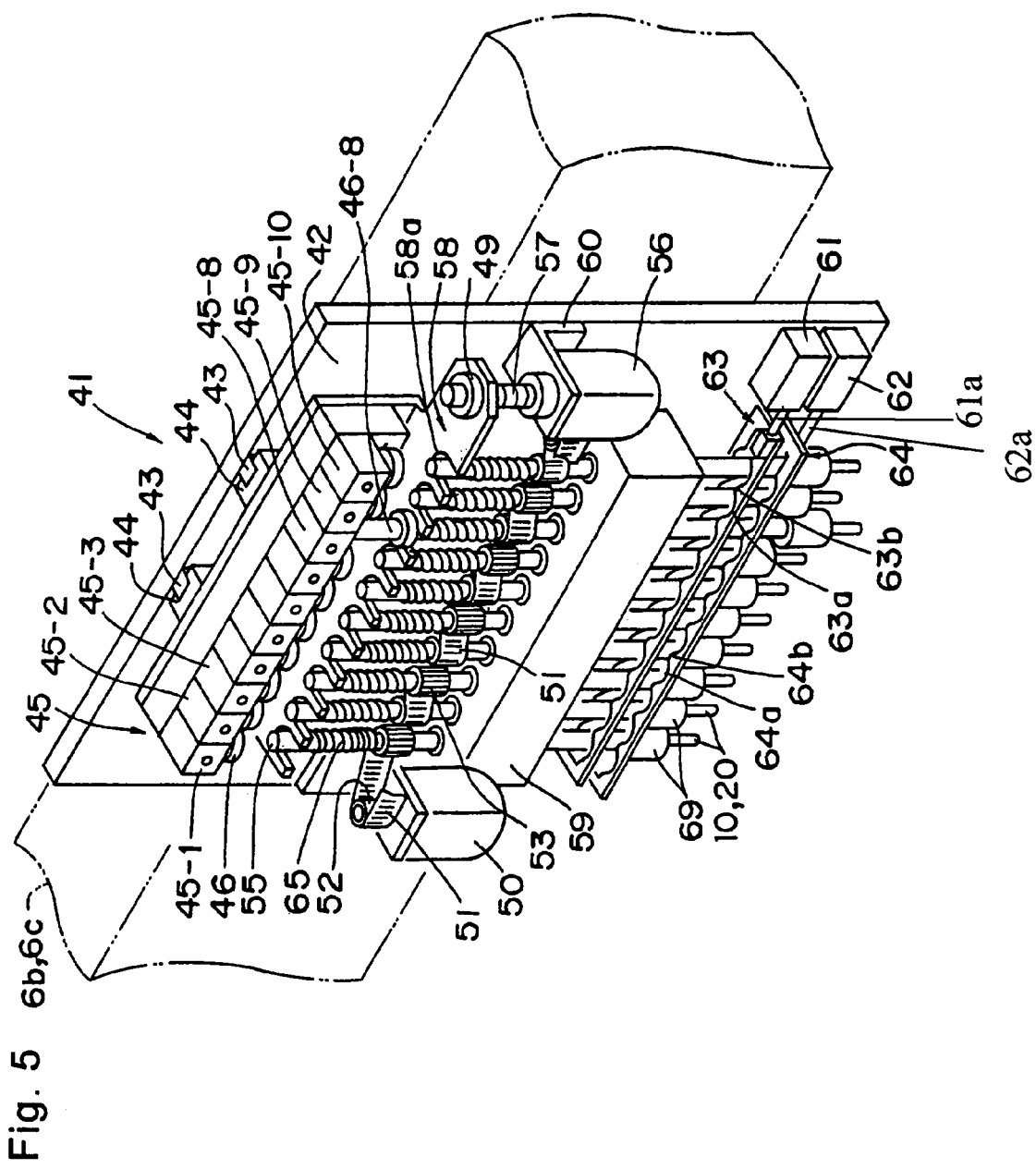
FIG. 5 is a perspective view showing a component suction nozzle elevating device of the mounting apparatus shown in FIG. 1.
Figure 6:
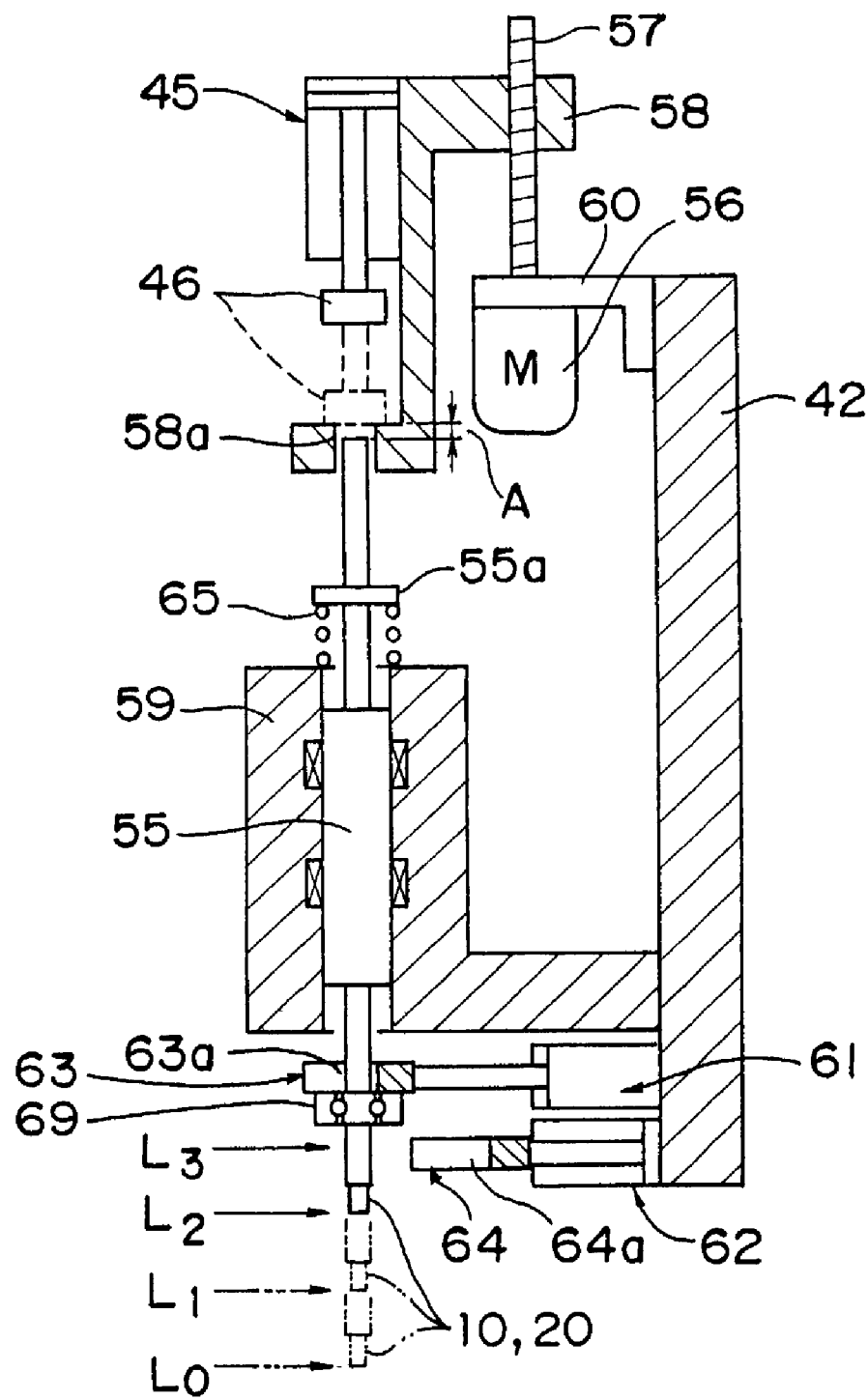
FIG. 6 is a partial cross sectional view for explaining the component suction nozzle elevating device of the mounting apparatus shown in FIG. 1.

FIGS. 5 and 6 are perspective views showing a component suction nozzle elevating device 41 disposed in the working head 4, 14 of the mounting apparatus. Each component suction nozzle elevating device 41 is generally constituted by a plurality of, for example, ten nozzle elevating shafts 55, the same number of nozzle selecting cylinders 45, serving as an example of nozzle selecting actuators, (for example, air cylinders, electromagnetic solenoids, or the like) as that of the nozzle elevating shafts 55, an elevation drive motor 56 as an example of an elevation-use rotation drive device, and at least one top dead center changing actuator as an example of a top dead center changing device. In this embodiment, first and second top dead center changing cylinders 61, 62 (for example, air cylinders) for switching top dead centers are used as an example of a case where two top dead center changing actuators are used.

The plurality of nozzle elevating shafts 55 support suction nozzles 10, 20 for sucking and holding components at a lower end of each nozzle elevating shaft 55 via a rotary joint 69. Normally, a spring 65 is brought into contact with a flat plate portion 55a provided on each nozzle elevating shaft 55 and urges the flat plate portion upwardly. An elevating operation of each nozzle elevating shaft 55 in a vertical (up-and-down) direction is guided by a guide member 59 fixed to a support plate 42 of the working head 4, 14. An upper end position of each nozzle elevating shaft 55 is not specifically shown, but each nozzle elevating shaft 55 is engaged by an engaging protrusion provided on the guide member 59 or the like and is regulated so as not to project upward above an upper end position.

The nozzle selecting cylinders 45 (a nozzle selecting cylinder referred to irrespective of the position thereof is designated by reference numeral 45, while first to tenth nozzle selecting cylinders are designated by reference numerals 45-1, 45-2, 45-3, 45-4, 45-5, 45-6, 45-7, 45-8, 45-9, and 45-10, respectively) corresponding to the plurality of nozzle elevating shafts 55 are fixed to an elevating member 58, which vertically moves in relation to the support plate 42 of the operating head 4, 14. When one suction nozzle 10, 20 to be lowered is selected from among the plurality of nozzles 10, 20, a piston rod 46 of the nozzle selecting cylinder 45 corresponding to the selected nozzle elevating shaft 55 having the selected suction nozzle 10, 20 is lowered towards an upper end portion of the nozzle elevating shaft 55 in a range in which the piston rod 46 is not brought into contact with the selected nozzle elevating shaft 55. For example, FIG. 5 shows a state in which the piston rod 46-8 of the nozzle selecting cylinder 45-8 corresponding to the eighth nozzle 10, 20 is lowered to a lower end position. Each piston rod 46 has a circular plate fixed at a lower end thereof so as to have an inverted T-shaped side surface. Thus, the nozzle elevating shaft 55 is easily depressed as described later.

The elevating member 58 is elevatably supported by the support plate 42 of the working head 4, 14. That is, the support plate 42 is equipped with two parallel linear guide members 43, 43. Two sliders 44, upper and lower ones, each provided on a rear surface of the elevating member 58, rise or lower along respective linear guide members 43 so that an elevating operation of the elevating member 58 is guided. Furthermore, the elevating member 58 has through holes or notches 58a (shown as notches in FIG. 5) through which an upper end portion of each of the nozzle elevating shafts can penetrate. When one suction nozzle 10, 20 to be lowered is selected from among the plurality of nozzles 10, 20, an upper end portion of the nozzle elevating shaft 55 is positioned in the notch 58a in a range in which the upper end portion is not projected upward above the notch 58a, and the lower end of the piston rod 46 of the nozzle selecting cylinder 45 is lowered until brought into contact with the elevating member 58 at an edge of the notch 58a. Then, a gap A is formed between the lower end of the piston rod 46 and the upper end portion of the nozzle elevating shaft 55 in the notch 58a. When the elevating member 58 is lowered by a rotary drive of the elevation drive motor 56, the upper end portion of the nozzle elevating shaft 55 is projected from the notch 58a. Consequently, the lower end of the piston rod 46 and the upper end portion of the nozzle elevating shaft 55 are brought into contact with each other and then, the nozzle elevating shaft 55 is lowered by the lower end of the piston rod 46.

The elevation drive motor 56 is fixed to the support plate 42 of the working head 4, 14 by a bracket 60. A ball screw shaft 57, as an example of a screw shaft, is connected to a rotating shaft of the elevation drive motor 56. The ball screw shaft 57 is screw-threaded through a nut 49 of the elevating member 58. Therefore, the elevating member 58 is raised or lowered by reciprocal rotation of the ball screw shaft 57 so that all the nozzle selecting cylinders 45 are integrally raised or lowered at the same time. Thus, when all the nozzle selecting cylinders 45 are integrally lowered at the same time, a piston rod 46 selectively lowered from the nozzle selecting cylinders 45 is also lowered so that the piston rod 46 is brought into contact with a selected nozzle elevating shaft 55, thereby lowering the nozzle elevating shaft 55.

The first top dead center changing cylinder 62 and the second top dead center changing cylinder 61, which change a top dead center position of each of the nozzle elevating shafts 55, have engaging portions 64, 63 each engaged with an upper end portion of the rotary joint 69 of the nozzle elevating shaft 55 at an end of the piston rod of each top dead center changing cylinder 62, 61. The first top dead center changing cylinder 62 is fixed to the support plate 42 of the working head 4, 14 so as to be positioned below the second top dead center changing cylinder 61.

The engaging portion 64 of the piston rod of the first top dead center changing cylinder 62 is constituted by a plate body having unengaging through holes 64a each having an inner diameter dimension larger than an outer diameter dimension of the rotary joint 69 of the lower portion of each nozzle elevating shaft 55 so that the rotary joint 69 penetrates through and is unengaged, and engaging through holes 64b each having an inner diameter dimension smaller than the outer diameter dimension of the rotary joint 69 so that the rotary joint 69 is engaged, with the through holes 64a and 64b being alternately formed. Therefore, by moving the piston rod 62a of the first top dead center changing cylinder 62 in a horizontal direction, the unengaging through holes 64a, not engaging the rotary joints 69 of the lower portions of all the nozzle elevating shafts 55, and the engaging through holes 64b, engaging these, are selectively positioned so that disengaging or engaging operations of all the nozzle elevating shafts 55 can be simultaneously performed.

The engaging portion 63 of the piston rod 61a of the second top dead center changing cylinder 61 is constituted by a plate body having unengaging through holes 63a each having an inner diameter dimension larger than an outer diameter dimension of the rotary joint 69 of the lower portion of each nozzle elevating shaft 55 so that the rotary joint 69 penetrates through and is unengaged, and engaging through holes 63b each having an inner diameter dimension smaller than the outer diameter dimension of the rotary joint 69 so that the rotary joint 69 is engaged, with the through holes 63a and 63b being alternately formed. Therefore, by moving the piston rod of the second top dead center changing cylinder 61 in the horizontal direction, the unengaging through holes 63a, not engaging the rotary joints 69 of the lower portions of all the nozzle elevating shafts 55, and the engaging through holes 63b, engaging these, are selectively positioned so that disengaging or engaging operations of all the nozzle elevating shafts 55 can be simultaneously performed.

Figure 7:
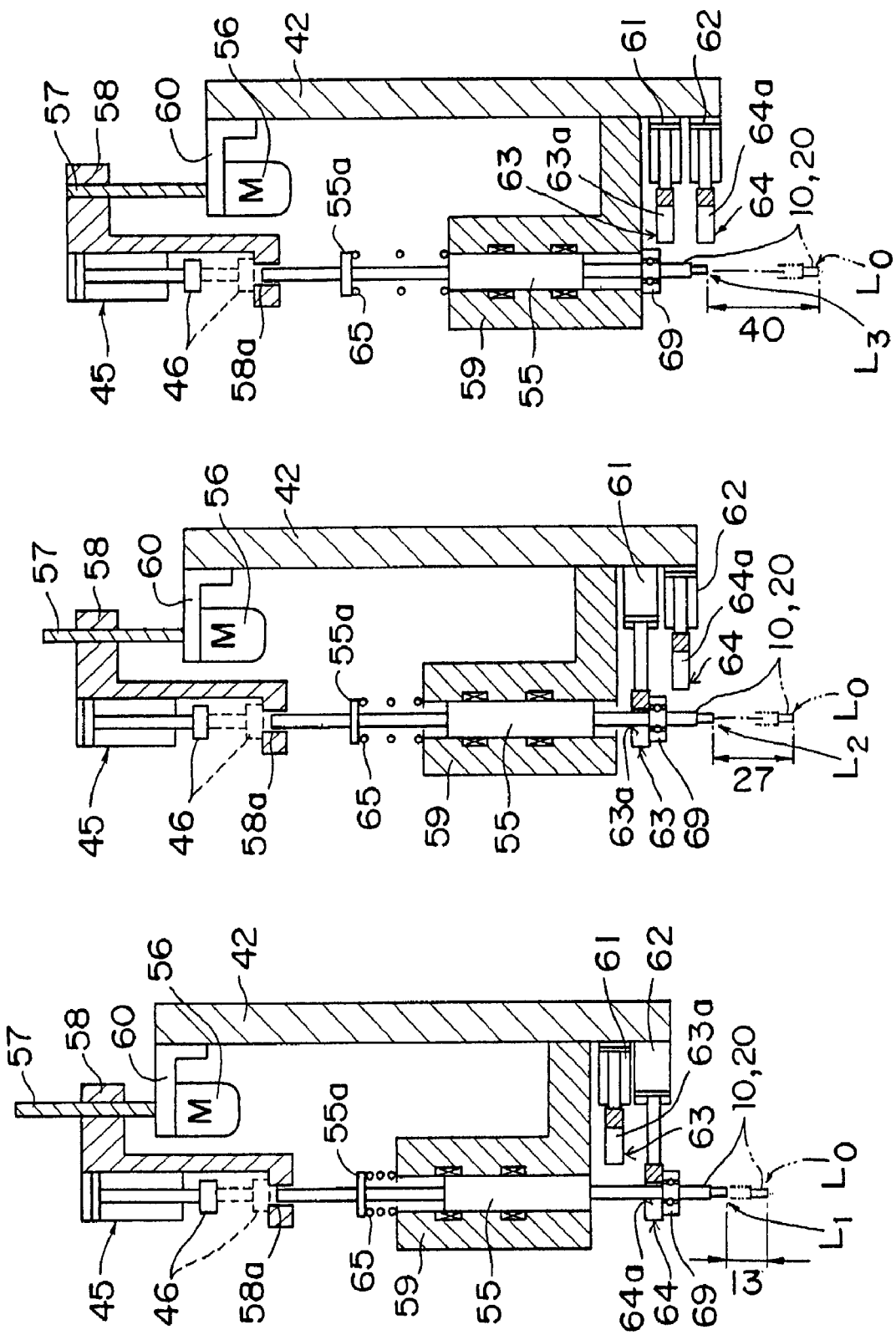
FIGS. 7A, 7B, and 7C are partial cross sectional views for explaining the component suction nozzle elevating device of the mounting apparatus shown in FIG. 1 at level 1, level 2, and level 3, respectively.

To clearly understand engaging and disengaging operations, FIGS. 6 and 7 show that the engaging portions 64, 63 are not through holes, but notch holes. At a time of engagement, the engaging portion 64, 63 is brought into contact with an upper end of the rotary joint 69 of the nozzle elevating shaft 55 to regulate its top dead center, while, at a time of unengagement, the nozzle elevating shafts 55 are removed from these portions, which can be contrasted in these figures. However, the idea about engaging and disengaging operations is exactly the same as that of the above unengaging through holes 63a and engaging through holes 63b.

FIGS. 7A, 7B, and 7C are local sectional views for explaining, respectively, states that the nozzle 10, 20 of the component suction nozzle elevating device of the component mounting apparatus in FIG. 1 is positioned at a lowest end position $L_1$ (hereinafter, may be referred to as "level 1"), which is, for example, 13 mm above a mounting position $L_0$ (which is both a sucking position and component recognizing position), at an middle position $L_2$ (hereinafter, may be referred to as "level 2"), which is, for example, 27 mm above the mounting position $L_0$, and at a highest end position $L_3$ (hereinafter, may be referred to as "level 3"), which is, for example, 40 mm above the mounting position $L_0$. That is, at level 1, the rotary joint 69 of the lower portion of the nozzle elevating shaft 55 is engaged with the engaging portion 64 of the first top dead center changing cylinder 62, and the second top dead center changing cylinder 61 is positioned at an escaping position and unengaged. At level 2, the rotary joint 69 of the lower portion of the nozzle elevating shaft 55 is engaged with the engaging portion 63 of the second top dead center changing cylinder 61, and the first top dead center changing cylinder 62 and the second upper dead center changing cylinder 61 are positioned at escaping positions and unengaged. At level 3, the rotary joint 69 of the lower portion of the nozzle elevating shaft 55 is not engaged with the engaging portions 64, 63 of the first and second top dead center changing cylinders 62, 61, but is engaged with the guide member 59, while the first top dead center changing cylinder 62 is positioned at an escaping position and unengaged. In any case, in response to a change in a height of the nozzle elevating shaft 55, the rotating shaft of the elevation drive motor 56 is rotated for a prescribed amount and a position of the elevating member 58 is also changed. At any level, a gap (dimension A: for example, about 0.02 mm) is formed between the lower end of the piston rod 46 and the upper end portion of the nozzle elevating shaft 55.

In FIG. 5, reference numeral 50 denotes a θ rotary drive motor for adjusting attitudes of components sucked by the nozzles 10, 20, by rotating the nozzle elevating shafts 55 about their respective axes in a θ direction. Reference numeral 52 denotes a gear fixed to a rotating shaft of the θ rotary drive motor 50. Reference numeral 53 denotes a θ rotating gear fixed to an intermediate portion of each nozzle elevating shaft 55. Reference numeral 51 denotes a belt having double-sided teeth to be engaged with the θ rotating gear 53 of each nozzle elevating shaft 55 and the gear 52 of the θ rotary drive motor 50. Therefore, when the θ rotary drive motor 50 is rotary-driven, the θ rotating gears 53 of all the nozzle elevating shafts 55 are rotated by the belt 51 with the double-sided teeth, and attitudes of the components sucked by the nozzles 10, 20 are adjusted.

Therefore, in the component suction nozzle elevating device 41 according to this constitution, basically, all the nozzle selecting cylinders 45 are elevated by drive of one elevation drive motor 56 to raise or lower all the nozzle elevating shafts 55 at the same time. Consequently, it is difficult to raise or lower each nozzle 10, 20 at an arbitrary time to suck and hold a component from the component feeding device. That is, in case of a nozzle 10, 20 having such a component suction nozzle elevating device 41, when components are sucked and held by all the nozzles 10, 20 in the component feeding device, a number and disposition pitch of component feeding cassettes disposed in the component feeding device need to be equal to those of the nozzles 10, 20. In such a case, as described later, the number and the disposition pitch of the component feeding cassettes and those of the nozzles 10, 20 are user mounting requesting conditions. Furthermore, a condition that the number and the disposition pitch of the component feeding cassettes disposed in the component feeding device and those of the nozzles 10, 20 are equal can be a strictly observed rule, which must be strictly observed in view of productivity or quality assurance and without observation of which a corresponding operation cannot be preformed.

Figure 8:
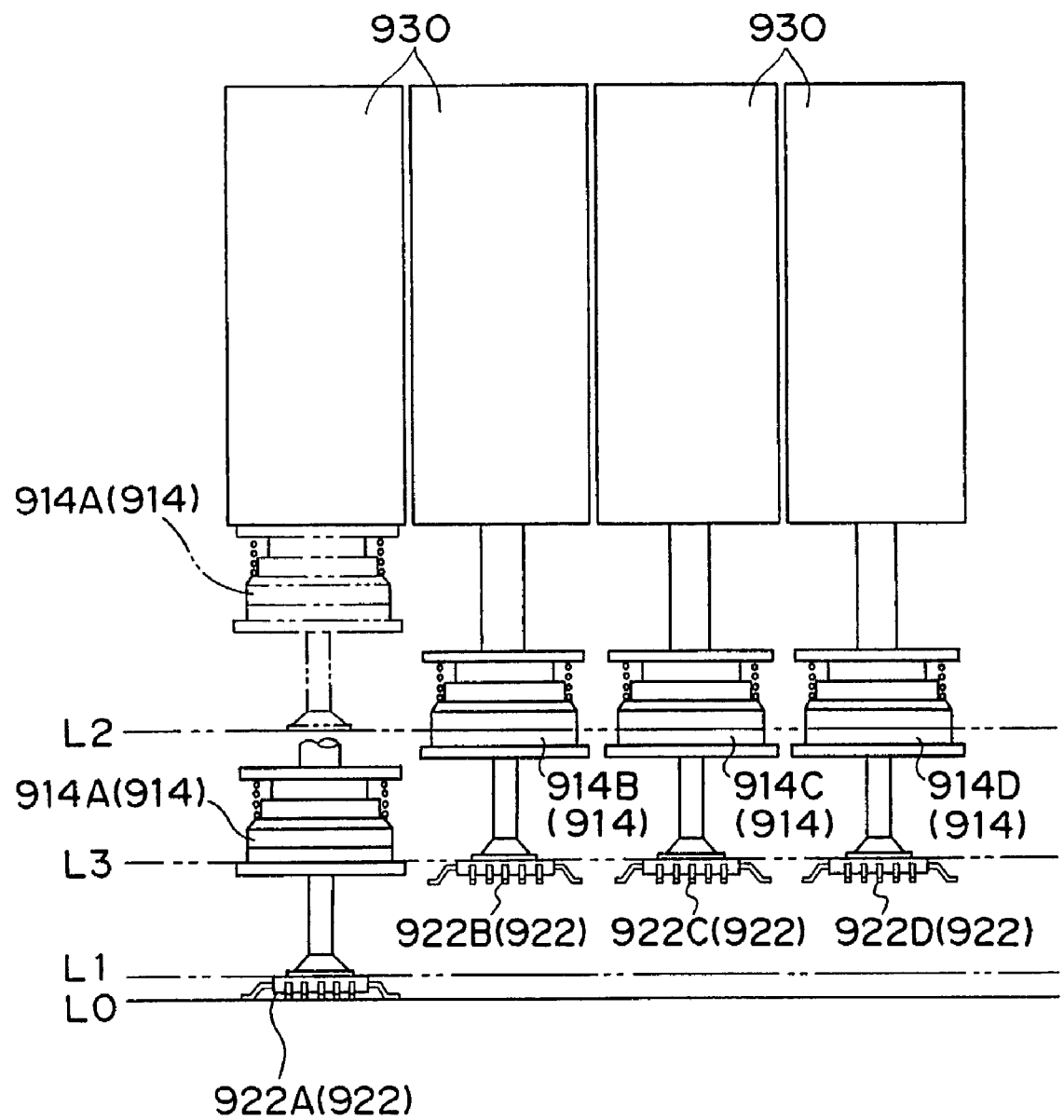
FIG. 8 is a front view showing another component suction nozzle applicable to the mounting apparatus shown in FIG. 1.

On the other hand, each of suction nozzles 914 shown in FIG. 8 can be individually raised or lowered at an arbitrary time to suck and hold a component from the component feeding device.

That is, in FIG. 8, four desired suction nozzles 914 can be loaded on one head and these loaded suction nozzles 914 can be moved vertically or rotated. Each of a plurality of suction nozzles 914 (first to fourth suction nozzle 914A to 914D) is allowed to suck and hold electronic component 922 (922A to 922D) from a component feeding device and then, all the suction nozzles 914 are raised to an upper end position. Then, each electronic component 922A to 922D held by each suction nozzle 914A to 914D can be recognized, lowered at a desired time to each desired placing position and placed. In such a case, as described later, a number and disposition pitch of component feeding cassettes and those of the nozzles 914 are user mounting requesting conditions. Furthermore, a condition that the number and disposition pitch of the component feeding cassettes disposed in the component feeding device are equal to those of the nozzles 914 can be a desirably observed rule, which is desirable to observe in view of prevention of lower productivity or lower quality, or in view of safety, during a mounting operation wherein the mounting apparatus is used to hold, recognize, and place components.

A component mounting data generating method and device applicable to the above-described mounting apparatus or the like are explained below.

First, a method and device for generating rules used for generating component mounting data when components are mounted, that is, sucked, recognized, and placed during and with the component mounting data generating method and device are explained.

Figure 12:
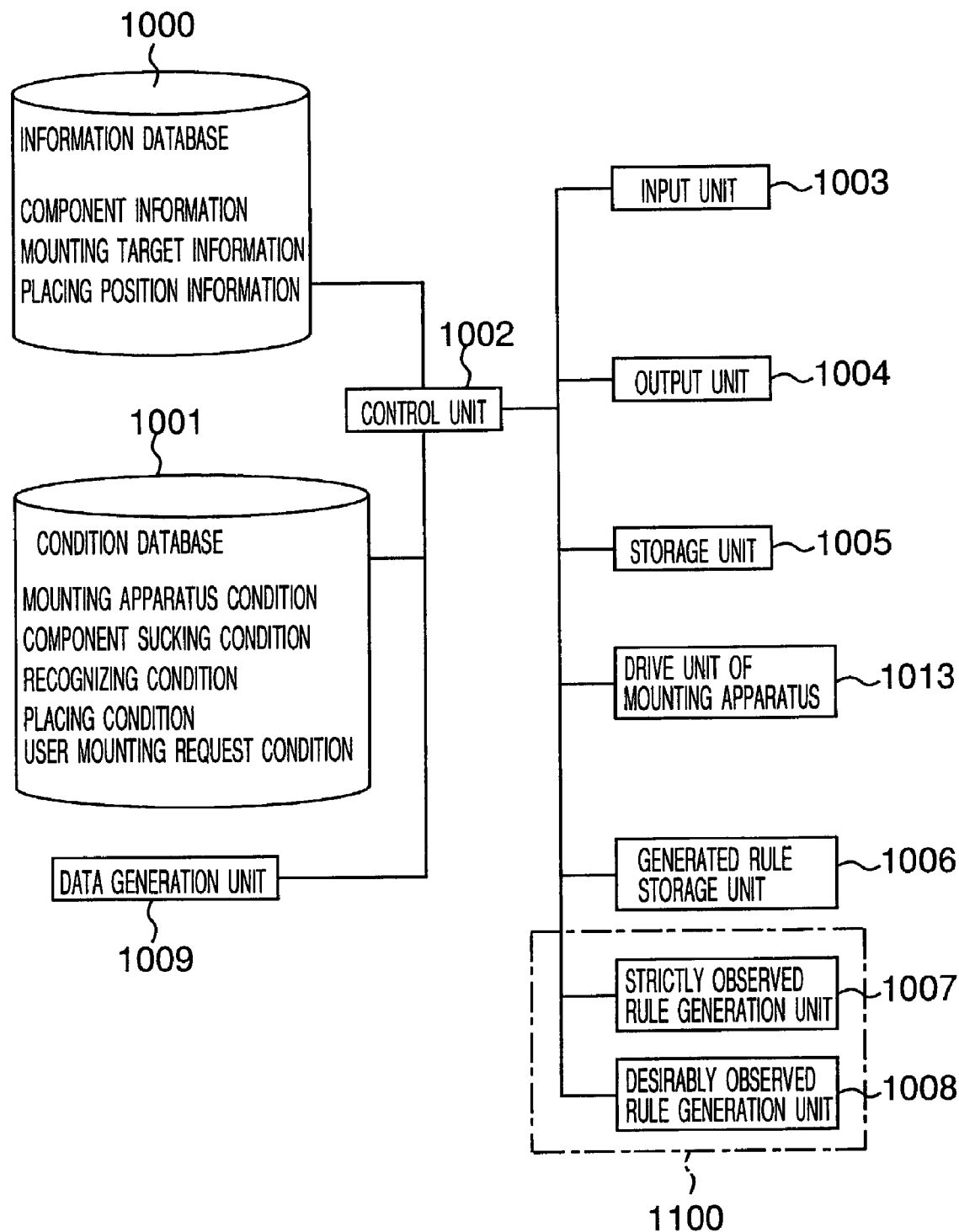
FIG. 12 is a block diagram of a control relationship between a component mounting data generating device and component mounting device according to one embodiment of the present invention.

First, this component mounting data generating device for employing the component mounting data generating method has: as shown in FIG. 12, an information database 1000 for storing component information, mounting target information, and placing position information; a condition database 1001 for storing mounting apparatus conditions, component sucking conditions, recognizing conditions, placing conditions, and user mounting requesting conditions; a control unit 1002; an input unit 1003 for inputting information to the information database 1000, the condition database 1001, and so forth; an output unit 1004 for performing output such as displaying generated data or the like on a display, printing the data by a printer, and so forth; a storage unit 1005 for temporarily storing various data or the like; a drive unit 1013 for each mounting apparatus; a data generation unit 1009; a generated rule storage unit 1006; and a rule generation unit 1100 (specifically, strictly observed rule generation unit 1007 and desirably observed rule generation unit 1008). The rule generation unit 1100 may be constituted by only either one of the strictly observed rule generation unit 1007 and the desirably observed rule generation unit 1008 as required.

Figure 9:
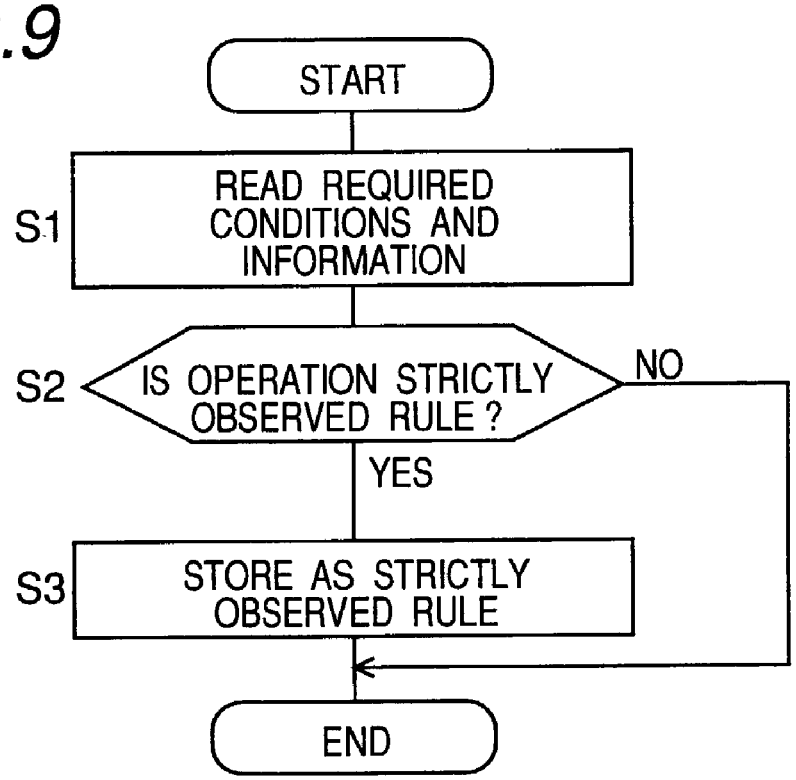
FIG. 9 is a flow chart for generating a strictly observed rule and generating data for performing a component mounting operation in the mounting apparatus.

FIG. 9 shows a flow chart for generating a strictly observed rule and generating data to perform a component mounting operation.

In step S1 in FIG. 9, at least one condition out of mounting apparatus conditions about the mounting apparatus, component holding conditions when components are held by the suction nozzles after received from the component feeding device, for example, component sucking conditions, recognizing conditions when the components held by the suction nozzles are recognized by the recognition device, placing conditions when the components held by the suction nozzles are placed onto a board, and user mounting requesting conditions, are read from the condition database 1001 in FIG. 12 under a control operation of the control unit 1002 and prepared (here, "prepare" indicates reading data from a storage medium such as database or the like, an input operation via manual input or communication, and the like). Meanwhile, component information about a plurality of components placed onto a board, board information about the board, and placing position information of the components for the board are read from the information database 1000 under a control operation of the control unit 1002 and prepared. Subsequently, in step S2 in FIG. 9, based on the at least one condition, component information, board information, and placing position information, which are prepared as described above, whether or not an operation performed when the components are mounted, for example, a mounting operation wherein the mounting apparatus is used to hold, recognize, and place the components is a "strictly observed rule", which must be strictly observed and without observation of which a corresponding operation cannot be performed, is judged in view of productivity or quality assurance by the strictly observed rule generation unit 1007. Then, an operation determined as a "strictly observed rule" by the strictly observed rule generation unit 1007 is generated as a strictly observed rule in step S3 in FIG. 1 and stored in the generated rule storage unit 1006 under a control operation of the control unit 1002. Meanwhile, an operation determined as not being a "strictly observed rule" by the strictly observed rule generation unit 1007 is regarded as an operation that does not particularly need to be considered as a strictly observed rule when mounting data is generated. Subsequently, data for performing the component mounting operation is generated in consideration of a generated strictly observed rule (see step S41 in FIG. 13) and this generated data is stored in the storage unit 1005 by the data generation unit 1009 (see step S42 in FIG. 13). Subsequently, based on the data generated and stored in the storage unit 1005, the control unit 1002 performs the component mounting operation by controlling drive of the drive unit 1013 for each mounting apparatus (see step S43 in FIG. 13).

Figure 10:
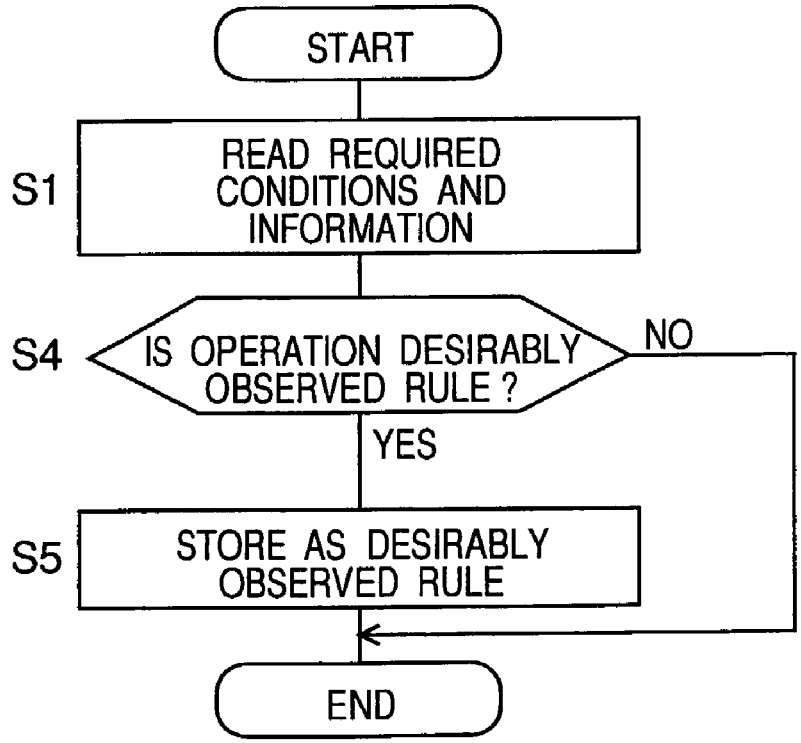
FIG. 10 is a flow chart for generating a desirably observed rule and generating data for performing a component mounting operation in the mounting apparatus.

FIG. 10 shows a flow chart for generating a desirably observed rule and generating data to perform a component mounting operation.

As in the case of step S1 in FIG. 9, in step S1 in FIG. 10, at least one condition out of mounting apparatus conditions about the mounting apparatus, component holding conditions when components are held by the suction nozzles after received from the component feeding device, for example, component sucking conditions, recognizing conditions when the components held by the suction nozzles are recognized by the recognition device, placing conditions when the components held by the suction nozzles are placed onto a board, and user mounting requesting conditions are read from the condition database 1001 in FIG. 12 under a control operation of the control unit 1002 and prepared (here, "prepare" indicates reading data from a storage medium such as database or the like, an input operation via manual input or communication, and the like). Meanwhile, component information about a plurality of components placed onto a board, board information about the board, and placing position information of the components for the board are read from the information database 1000 under a control operation of the control unit 1002 and prepared. Subsequently, in step S4 in FIG. 10, based on the at least condition, the component information, the board information, and the placing position information, which are prepared as described above, in view of prevention of lower productivity or lower quality, or in view of safety, whether or not an operation performed when a component is mounted, for example, a mounting operation wherein the mounting apparatus is used to hold, recognize, and place the components, is a "desirably observed rule", which is desirable to observe, is judged in view of prevention of lower productivity or lower quality, or in view of safety, by the desirably observed rule generation unit 1008. A rule determined as a "desirably observed rule" by the desirably observed rule generation unit 1008 is generated as a desirably observed rule in step S5 in FIG. 10 and stored in the generated rule storage unit 1006 under a control operation of control unit 1002. An operation determined as not being a "desirably observed rule" by the desirably observed rule generation unit 1008 is regarded as an operation that does not need to be considered as a desirably observed rule when mounting data is generated. Subsequently, the generated desirably observed rule is considered by the data generation unit 1009 (see step S41 in FIG. 13) and data for performing the component mounting operation is generated by the data generation unit 1009, and then, this generated data is stored in the storage unit 1005 (see step S42 in FIG. 13). Then, based on the data generated and stored in the storage unit 1005, the control unit 1002 controls drive of the drive unit 1013 for each mounting apparatus and performs the component mounting operation (see step S43 in FIG. 13).

Thus, it is also possible to perform the component mounting operation by generating a strictly observed rule or desirably observed rule, generating data for performing the component mounting operation in consideration of the generated rule, and controlling drive of the drive unit 1013 for each mounting apparatus based on the generated data by control unit 1002. However, it is preferred to perform the component mounting operation (see step S43 in FIG. 13) by generating both a strictly observed rule and a desirably observed rule, generating data for performing the component mounting operation (see step S42 in FIG. 13) in consideration of both the generated strictly observed rule and desirably observed rule (see step S41 in FIG. 13), and controlling drive of the drive unit 1013 for each mounting apparatus based on the generated data by the control unit 1002.

Figure 11:
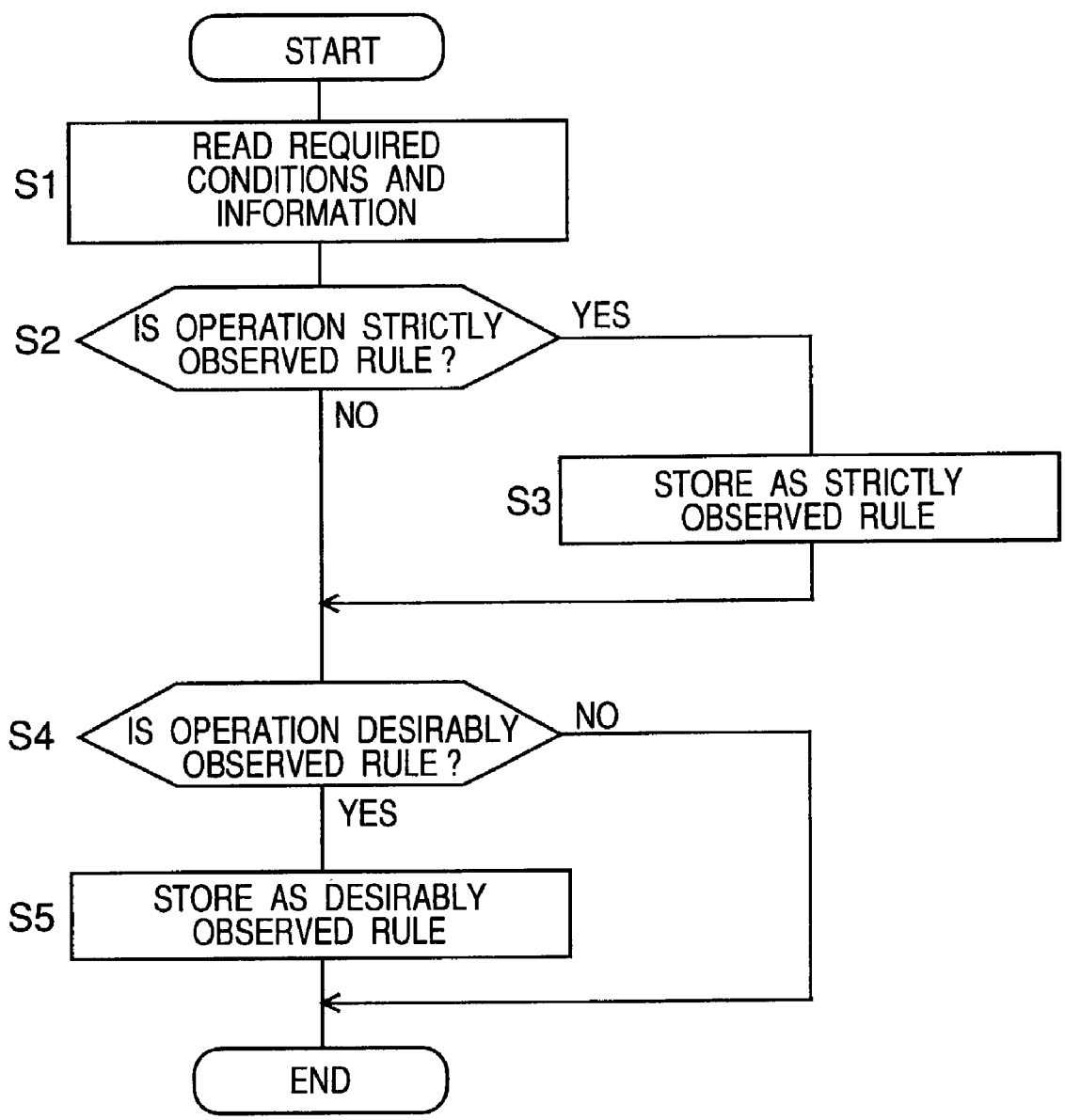
FIG. 11 is a flow chart for generating a strictly observed rule and a desirably observed rule and generating data for performing a component mounting operation in the mounting apparatus.

FIG. 11 shows an example of generating both a strictly observed rule and desirably observed rule as described above.

That is, FIG. 11 shows a flow chart for generating a strictly observed rule and a desirably observed rule, and then generating data to perform a component mounting operation.

In step S1 in FIG. 11, at least one condition out of mounting apparatus conditions, component sucking conditions, recognizing conditions, placing conditions when components held by the suction nozzles are placed on a board, and user mounting requesting conditions are read from the condition database 1001 in FIG. 12 under a control operation of the control unit 1002 and prepared (here, "prepare" indicates reading data from a storage medium such as database or the like, an input operation via manual input or communication, and the like). Meanwhile, component information, board information, and placing position information are read from the information database 1000 under a control operation of the control unit 1002 and prepared. Subsequently, in step S2 in FIG. 11, based on the at least one condition, component information, board information, and placing position information, which are prepared as described above, whether or not an operation performed when the components are mounted, for example, a mounting operation wherein the mounting apparatus is used to hold, recognize, and place the components, is a "strictly observed rule", which must be strictly observed and without observation of which a corresponding operation cannot be performed, is judged in view of productivity or quality assurance by the strictly observed rule generation unit 1007. Then, a rule determined as a "strictly observed rule" by the strictly observed rule generation unit 1007 is generated as a strictly observed rule in step S3 in FIG. 11 and then stored in the generated rule storage unit 1006 under a control operation of the control unit 1002. Subsequently, whether or not an operation performed when the components are mounted, for example, a mounting operation wherein the mounting apparatus is used to hold, recognize and place the components, which is determined as not being a "strictly observed rule" by the strictly observed rule generation unit 1007 in step S2 in FIG. 11, is a "desirably observed rule", which is desirable to be observed, is judged based on prepared conditions, component information, board information, and placing position information in view of prevention of lower productivity or lower quality, or in view of safety, by the desirably observed rule generation unit 1008 in step S4 in FIG. 11. Then, a rule determined as a "desirably observed rule" by the desirably observed rule generation unit 1008 is generated as a desirably observed rule in step S5 in FIG. 11 and then stored in the generated rule storage unit 1006 under a control operation of the control unit 1002. Since an operation determined as not being a "desirably observed rule" by the desirably observed rule generation unit 1008 does not particularly need to be considered as a strictly observed rule or desirably observed rule when mounting data is generated, this operation is ignored thereafter. Subsequently, a generated strictly observed rule and desirably observed rule are considered by the data generation unit 1009 (see step S41 in FIG. 13), data for performing the component mounting operation is generated by the data generation unit 1009, and this generated data is stored in the storage unit 1005 (see step S42 in FIG. 13). Then, based on the data generated and stored in the storage unit 1005, the control unit 1002 controls drive of the drive unit 1013 for each mounting apparatus and performs the component mounting operation (see step S43 in FIG. 13).

Hereafter, specific examples of information and conditions used when the strictly observed rule and desirably observed rule are generated are explained.

The component information is information about a plurality of components to be placed onto a mounting target, for example, a board, which includes length and width sizes, height, name, shape, weight, and so forth of the components.

The board information is information about a board, which includes length and width sizes, name, shape, weight, and so forth of the board.

The placing position information is placing position information or the like of the components to be mounted on the board.

Mounting apparatus conditions include conditions such as, for example, a number of mounting apparatuses to be installed, head constitution in each apparatus, nozzle constitution in each head (ten nozzles, four nozzles, or the like), component feeding cassette constitution (arrangement direction of component feeding cassettes, that is, successively disposed number in a Z direction), tray feed unit constitution (single tray feed unit, twin tray feed unit, or the like), recognition camera constitution (two-dimensional camera, three dimensional camera), nozzle station (stocker) constitution (a number of nozzle stations, a number of nozzles that can be stocked, or the like), and so forth.

The component sucking conditions include conditions such as height of a suction surface of a component, nozzle pitch, Z pitch (pitch of component feeding cassettes), component sucking method (two-stage sucking operation, pressurization), rotation before recognition for a positional correction before placement, and so forth. The two-stage sucking operation in the component sucking method is to switch a nozzle height (height of elevation at a time of component suction) according to the component height as a multiple stage switching method so that when the component height is low, a nozzle elevation distance is made shorter, thereby reducing a distance of vertical movement of the nozzle. Thus, suction time and placement time can be shortened, thereby improving mounting tact.

The recognizing conditions include conditions such as recognition camera constitution (two-dimensional camera, three-dimensional camera or the like), height of a component recognition surface, depth of field of a camera, component pitch and so forth.

The placing conditions include conditions such as component placement order, component height (shorter components to be mounted first or in reverse), component dimensions (smaller components to be mounted first or in reverse), component arrangement on a board, and so forth.

The user mounting requesting conditions include a number of nozzles installed respectively, a number of component feeding cassettes installed respectively, component mounting order, component height (mounting order of mounting shorter components first and then taller ones), order specification of a specific component {mounting in an order of an aluminum electrolytic capacitor (high component), connector, QFP (Quad Flat Package), SOP (Small Outline Package), and BGA (Ball Grid Array)}, and so forth. In particular, when shorter components are mounted first and then taller components are mounted later, there is a tendency that mounting precision becomes higher and yield becomes higher. Therefore, the conditions include such a requirement or the like. Furthermore, there is a condition from a requirement of mounting expensive components such as QFP, SOP, BGA and the like as late as possible.

Specific examples of the user mounting requesting conditions include conditions about an object apparatus and conditions about options. For example, the component mounting apparatus in FIG. 1 has object apparatus conditions that the front-side mounting unit has ten nozzles and the rear-side mounting unit has ten nozzles, the front-side mounting unit has ten nozzles and the rear-side mounting unit has four nozzles, or the like. The conditions about options at this time is whether or not options such as a nozzle station, tray feed unit, three-dimensional camera, collection conveyer, and the like are to be added to the front-side/rear-side mounting units.

Based on various information and conditions according to the above-described specific examples, specific examples of generated strictly observed rules and desirably observed rules are explained.

First, examples of rules under the mounting apparatus conditions include the following.

Rule 3 (strictly observed rule): Since the kind and number of nozzles allocatable to each drive member for driving a head, for example, an XY robot, depend on the mounting apparatus conditions, components to be placed in one operation unit for one task, that is, one head must be determined based on resource information in the user mounting requesting conditions about the nozzles. For example, in mounting apparatus conditions, ten nozzles can be arranged for each head. However, only four nozzles are arranged according to the resource information in the user mounting requesting conditions. In this case, a strictly observed rule is generated that components cannot be sucked by nozzles exceeding four. Basically, the mounting apparatus conditions have no desirably observed rule due to physical conditions.

Here, "task" means a task, that is, one operation unit for one head, that is, work by one head to mount a plurality of components onto a board by performing one or more sucking operations, one or more component recognizing operations, and a placing operation, which is one operation from component suction to placement completion. For example, a case is also regarded as one task where five components are sucked by ten nozzles in two operations, the recognition device recognizes the components by two laps to prevent being out of focus due to different component thicknesses and a depth of field at a time of recognition, and then the components are mounted.

As a more specific example of the mounting apparatus conditions, there are conditions, when the number of mounting apparatuses is three, and head constitution, nozzle constitution, component feeding cassette constitution, tray feed unit constitution, nozzle station constitution, and camera constitution in each apparatus is as shown in FIG. 15:

- as condition A about head constitution, mounting apparatus 1 has two heads, mounting apparatus 2 has one head, and mounting apparatus 3 has one head;
- as condition B about nozzle constitution, mounting apparatus 1 has ten nozzles for head 1 and ten nozzles for head 2, mounting apparatus 2 has ten nozzles, and mounting apparatus 3 has four nozzles;
- as condition C about component feeding cassette constitution, mounting apparatus 1 has a maximum of 100 cassettes (calculated with width as 8 mm), mounting apparatus 2 has 100 cassettes, and mounting apparatus 3 has 50 cassettes;
- as condition D about tray feed unit constitution, mounting apparatus 1 has none, mounting apparatus 2 has none, and mounting apparatus 3 has a twin tray feed unit;
- as condition E about nozzle station constitution, mounting apparatus 1 has none, mounting apparatus 2 has none, and mounting apparatus 3 has a nozzle station for 50 nozzles (stocker capacity); and
- as condition F about a recognition camera, mounting apparatus 1 has a two-dimensional camera, mounting apparatus 2 has a two-dimensional camera, and mounting apparatus 3 has a two-dimensional camera and a three-dimensional camera.

When data is read and strictly observed rules about the mounting apparatus conditions are generated, the following strictly observed rules (1) to (4) are generated.

(1) By condition C, a maximum number of components loaded is 250 when calculated with a width as 8 mm.

(2) By condition D, components fed by the tray feed unit can be allocated only to mounting apparatus 3.

(3) By condition F, components required to be recognized by the three-dimensional camera can be allocated only to mounting apparatus 3.

(4) By condition E, components requiring nozzle replacement can be allocated only to mounting apparatus 3. A reason is that mounting apparatus 1 and mounting apparatus 2 have no nozzle station (stocker) and nozzles initially installed cannot be replaced.

Examples of rules under the component sucking conditions include the following.

Rule 7: When nozzle arrangement is determined in a task, adjacent pitches must be considered based on component sizes.

Furthermore, examples of rules under the recognizing conditions include the following.

Rule 1 (strictly observed rule): a two-dimensional camera and a three-dimensional camera, or a large-size three-dimensional camera and a small-size three-dimensional camera cannot coexist in one task since their head movement speeds are different.

Rule 2 (strictly observed rule): In one task where a two-dimensional camera is used, components in the task must be limited so that a component height variation is 4 mm or less of a depth of field.

Examples of rules under the placing conditions include the following.

Rule 6 (desirably observed rule): To speed up a placing operation, it desirable to divide a task so that components recognized by a two-dimensional large camera and those recognized by a two-dimensional small camera are not mixed in one task.

Rule 5 (desirably observed rule): To speed up a placing operation, it is desirable to unite all components of 6 mm or shorter in one task.

Examples of rules under the user mounting requesting conditions include the following.

Rule 4 (strictly observed rule): Since a kind and number of component feeding cassettes (feeder) in a component feeding device owned by a user are limited, arrangement of the component feeding cassettes (feeders) must be determined based on resource information of one of the component feeding cassettes (feeder).

A specific method of generating strictly observed rules is explained below as an example of the user mounting requesting conditions.

The user mounting requesting conditions are roughly classified into, for example, resource information and a mounting priority principle.

The resource information includes a number of nozzles installed in various sizes, a number of various kinds of component feeding cassettes installed, and so forth. For example, it is assumed as a required number of components when one board is produced that ten components named x, five components named y, and five components named z are required. At this time, whether a required number of the components named x, ten, can be divided into two, five components named $x_1$ and five components named $x_2$, can be determined in view of whether there is a sufficient number of nozzles of their sizes to suck them at the same time exits or whether the number of the component feeding cassettes for setting components is equal to that of the nozzles. Therefore, in the above case, only when there are four suction nozzles of a size for sucking components simultaneously and four component feeding cassettes for setting four components of component $x_1$, component $x_2$, component y, and component z, these four components, component $x_1$, component $x_2$, component y, and component z, can be simultaneously sucked by the four suction nozzles. Then, when five sucking operations are performed by the four suction nozzles, all of these components can be sucked.

Consequently, as a strictly observed rule of the user mounting requesting conditions, a rule that "the maximum number of components that can be sucked by one sucking operation determined by the user mounting requesting conditions is the number of nozzles arranged in one head" can be generated. It is considered that there is no desirably observed rule due to the resource information.

Furthermore, mounting priority principles include (A) productivity, that is, throughput (tact) priority principle, (B) quality priority principle, (C) safety priority principle, and so forth.

(A) In the productivity, that is, throughput (tact) priority principle, a mounting order is determined to minimize a production tact for one board irrespective of component size or the like. At this time, there is no strictly observed rule, but, as desirably observed rules, (1) a rule for minimizing an XY moving distance and (2) a rule for minimizing causes of lower productivity (loss generation causes) can be generated.

(B) In the quality priority principle, a mounting order is determined statistically or empirically so that quality is stable. At this time, there is no strictly observed rule, but, as a desirably observed rule, a rule that shorter components are first mounted and then taller ones are mounted later can be generated. However, a user may make the rule, that shorter components are first mounted and then taller ones are mounted later, a strictly observed rule.

(C) In the safety priority principle, there is a rule that a mounting order is determined so that a drive unit is not moved greatly, for example, component feeding cassettes of a component feeding device are not moved a long distance at once. Specifically, in a case of a rotary head type high-speed component mounting device shown in FIG. 38, in particular, when there are 100 component feeding cassettes, it is assumed that, when a first component feeding cassette is positioned at a component sucking position, a component feeding device is positioned at its original point. When placement on one board is finished, component suction is started by a first component feeding cassette. When component suction is finally finished by a 100th component feeding cassette, the 100 component feeding cassettes are moved at once so that the first component feeding cassette is positioned at a component sucking position at a maximum speed and the component feeding device is to be returned to the original point. Thus, if a user considers that a moving operation where 100 component feeding cassettes are moved at once is not desirable in view of safety, components may be mounted so that the feeding device is not returned to the original point. That is, depending on a degree of a user requirement, as a strictly observed rule or desirably observed rule, a rule can be considered that the component feeding device is not returned to the original point even when an operation of mounting components onto a board is finished.

Figure 13:
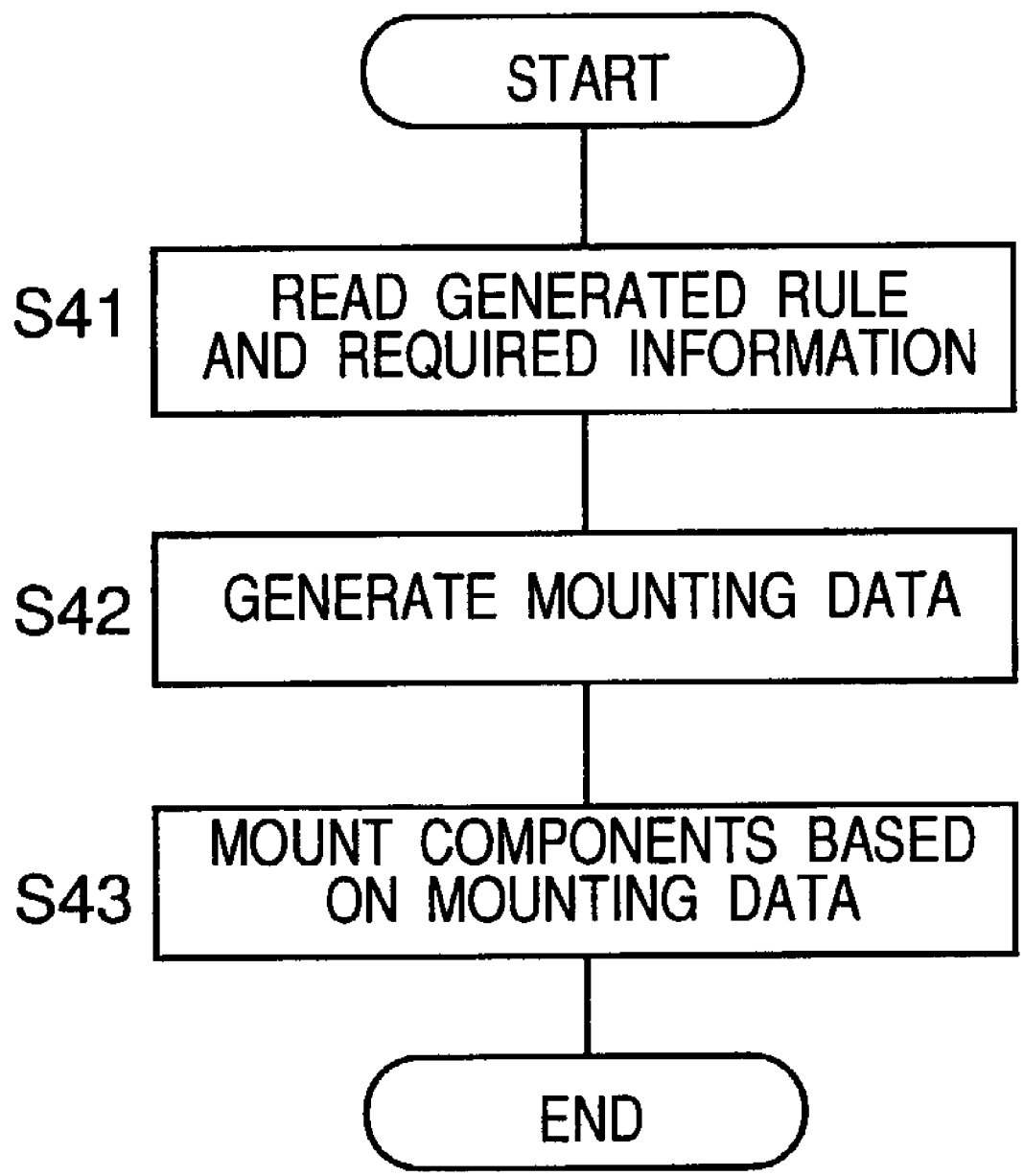
FIG. 13 is a flow chart for generating mounting data based on a generated rule and performing a mounting operation by a component mounting method according to one embodiment of the present invention.

A specific method for generating data for performing a component mounting operation by the data generation unit 1009 in consideration of a strictly observed rule and desirably observed rule in step S42 in FIG. 13 is as follows:

In a component mounting data generating method for generating component mounting data described below, as an example, one head is equipped with a plurality of suction nozzles, components are simultaneously sucked and held by each of these plurality of suction nozzles, simultaneously recognized, and simultaneously placed. Furthermore, by determining a component mounting procedure so that a task is minimized in view of productivity, the component mounting procedure is optimized.

Roughly speaking, optimization algorithms include the following two algorithms.

(1) Task Generation Algorithm (See Steps S52 and S53 Described Later)

A task is a work of placing a plurality of components onto a board during one sucking/placing operation.

Task generation is a process of determining a series of tasks for an apparatus to perform a placing operation efficiently from a provided NC program (component library).

The task generation algorithm is constituted by the following three basic processes.

Determination of initial conditions: An algorithm determining good initial conditions (task constitution) is used so that the following repetitive processes are converged in a short time. In determination of the initial conditions, rules for optimization are considered in order of priority to determine the initial conditions.

Calculation of evaluation value: A current task constitution is evaluated by a predetermined index and an evaluation value is calculated.

Reconstruction of task: A minimal value of the evaluation value is obtained and an algorithm for reconstructing the task is used for all components.

(2) Task Allocation Algorithm (See Steps S54 and S55 Described Later)

Task allocation is a processing of allocating generated tasks to a front stage and a rear stage. When two or more apparatuses are connected, tasks need to be allocated to stages in the number of apparatuses×2. Furthermore, when allocation is performed, placement time needs to be as equal as possible at each stage.

These are specifically explained below.

Figure 14:
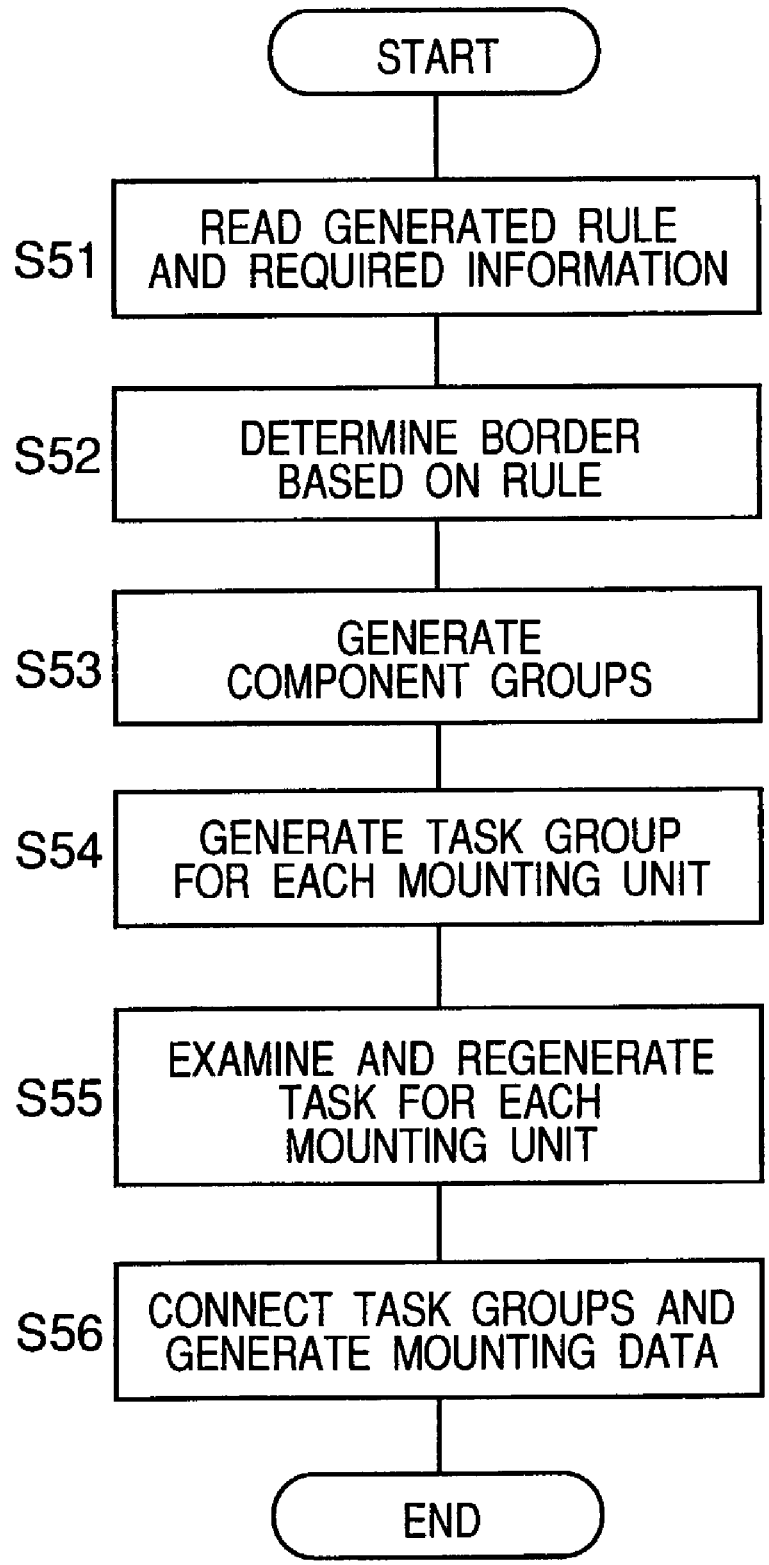
FIG. 14 is a flow chart for generating mounting data based on the generated rule in the embodiment.

First, in step S51 in FIG. 14, a generated strictly observed rule and desirably observed rule, required component information, and the like are read from the databases 1000, 1001 under a control of the control unit 1002. Specific examples of read data include apparatus option data (for each mounting unit), resource information (resource data for each mounting unit), nozzle station data before optimization (for each mounting unit), nozzle arrangement data before optimization (for each mounting unit), component feeding cassette arrangement data before optimization (for each mounting unit), mounting data before optimization, and component data. More specifically, mounting apparatus conditions include the number of constituent mounting apparatuses and options included therein. Component information includes dimensions of each component (length, width, height, and so forth), mounting conditions (camera and nozzles to be used, applicable speed, and so forth) and placing position information includes mounting position information on a board, and so forth.

Subsequently, in step S52 in FIG. 14, in consideration of generated strictly observed rules and desirably observed rules, a border formed based on a strictly observed rule and a border formed based on a desirably observed rule are determined during a procedure for mounting data of a plurality of components to be mounted onto a board.

Here, strictly observed rules and desirably observed rules are summarized again as follows (see FIG. 33).

Rule 1: A two-dimensional camera and a three-dimensional camera, or a large-size three-dimensional camera and a small-size three-dimensional camera cannot coexist in one task since their head movement speeds are different.

Rule 2: In one task using a two-dimensional camera, components in one task must be limited so that a component height variation becomes at most 4 mm of a depth of field.

Rule 3: A kind and number of nozzles allocated for each robot are different. Components to be placed in a task must be determined based on resource information of the nozzles.

Rule 4: A kind and number of feeders owned by a user are limited. Arrangement of the feeders must be determined based on resource information of the feeders.

Rule 5: To speed up a placing operation, it is desirable to unite components of at most 6 mm in height in one task.

Rule 6: To speed up a placing operation, it is desirable to divide a task so that components to be recognized by a large-size two-dimensional camera and a small-size two-dimensional camera are not mixed in one task.

Rule 7: When nozzle arrangement is determined in a task, adjacent pitches must be considered based on component sizes.

Subsequently, in step S53 in FIG. 14, one task is divided into component groups by borders formed based on a strictly observed rule to generate a plurality of component groups, that is, task groups. At this time, strictly observed rules such as Rules 1 to 4 or the like must not be violated to generate a task. However, a desirably observed rule is observed by employing either one of methods wherein 1) the rule is basically observed and 2) whether or not the rule is observed is confirmed by simulation and a case resulting in a shorter production tact (or one with which quality improvement or safety can be expected is selected) is selected. That is, in many cases, it is hard to judge whether a mounting tact is shortened and productivity is improved when a desirably observed rule is observed. On the contrary, it is easier to judge whether a mounting tact is shortened and productivity is improved when the desirably observed rule is not observed, or whether a mounting tact does not change so much and productivity is not improved whether or not the desirably observed rule is observed. Therefore, these are confirmed by simulation and then, whether or not the desirably observed rule should be observed, is preferably determined based on a corresponding result.

Here, for one task group (50 components are assumed), a case where Rule 5 (desirably observed rule) that it is desirable to unite components of at most 6 mm in height in one task to speed up a placing operation, is not observed and a case where this Rule is observed, are explained below.

FIG. 17 shows, when Rule 5 is not observed, there are ten components having a height lower than 6 mm in task 1 (one small square indicates one component in FIG. 17), there are ten components having a height lower than 6 mm in task 2, there are ten components having a height lower than 6 mm in task 3, there are eight components having a height lower than 6 mm and two components having a height of at least 6 mm, which are mixed, in task 4, and there are ten components having a height of at least 6 mm in task 5. Here, it is indicated that components can be placed at a high speed in tasks 1 to 3, but that components can be placed only at a low speed in tasks 4 and 5.

On the other hand, when Rule 5 is observed, there are ten components having a height lower than 6 mm in task 1, there are ten components having a height lower than 6 mm in task 2, there are ten components having a height lower than 6 mm in task 3, there are eight components having a height lower than 6 mm in task 4, there are ten components having a height of at least 6 mm in task 5, and there are two components having a height of at least 6 mm in task 6. Here, it is indicated that components can be placed at a high speed in tasks 1 to 4, but that components can be placed only at a low speed in tasks 5 and 6.

When these two cases are compared, the number of tasks is larger when Rule 5 is observed and the number of components to be placed at a low speed is 12 in total of ten in task 5 and 2 in task 6. On the other hand, when Rule 5 is not observed, 20 components in total of ten in task 4 and ten in task 5 are placed at a low speed. Which makes a tact shorter is uncertain without simulation.

Furthermore, as another example, for another task group (60 components are assumed), a case where a Rule 5 (desirably observed rule), that it is desirable to unite components of at most 6 mm in height in one task to speed up a placing operation, is not observed and a case where Rule 5 is observed, are explained below.

FIG. 18 shows that, when Rule 5 is not observed, as shown in the upper column, there are ten components having a height lower than 6 mm in each of tasks 1 to 3 (one small square indicates one component in FIG. 18), there are eight components having a height lower than 6 mm and two components having a height of at least 6 mm, which are mixed, in task 4, there are ten components having a height of at least 6 mm in task 5, and there are six components having a height of at least 6 mm and four components having a height of lower than 6 mm, which are mixed, in task 6. Here, it is indicated that components can be placed at a high speed in tasks 1 to 3, but that components can be placed only at a low speed in tasks 4 to 6.

On the other hand, when Rule 5 is observed, as shown in the lower column, there are ten components having a height lower than 6 mm in each of tasks 1 to 4, there are ten components having a height of at least 6 mm in task 5, and there are eight components having a height of at least 6 mm and two components having a height lower than 6 mm in task 6. Here, it is indicated that components can be placed at a high speed in tasks 1 to 4, but that components can be placed only at a low speed in tasks 5 and 6.

When these two cases are compared, the numbers of tasks are equal, 6, when Rule 5 is observed and when Rule 5 is not observed. However, when Rule 5 is not observed, the number of components to be placed at a low speed is 22 in total of two in task 4, ten in task 5, and ten in task 6. On the other hand, when Rule 5 is observed, 20 components in total of ten in task 5 and ten in task 6 are placed at a low speed. In this example, a tact is considered to be shorter when Rule 5 is observed.

It is noted that "task group" means a collection of tasks. A task belonging to a task group shares at least one Z axis (axis along arrangement direction of component feeding cassettes) with at least another one task belonging to the same task group (that is, adjacent component feeding cassettes or the like can suck components simultaneously). As described later, when a line balance between mounting apparatuses is averaged, movement in units of these task groups is considered.

Examples of task groups include the following.

For a mounting order specification case without component overlapping, wherein a plurality of components are not mounted by stacking them vertically, components are mounted in an order of the following component groups G [i] (i=1, . . . , 10).

Group G [1]: Component group using SX nozzles (nozzle for sucking a small-size component of 0.6 mm×0.3 mm) (for example, a component group wherein chip resistors of 0.6 mm×0.3 mm or the like are supported by a paper substrate sheet)

Group G [2]: Component group using SX nozzles (nozzle for sucking a small-size component of 0.6 mm×0.3 mm) (for example, a taping type component group, wherein capacitors of 0.6 mm×0.3 mm are housed in recesses formed by embossment of an embossing tape)

Group G [3]: Component group using SA nozzles (nozzle for sucking a small-size component of 1.0 mm×0.5 mm) (for example, a component group wherein chip resistors of 1.0 mm×0.5 mm or the like are supported by a paper substrate sheet)

Group G [4]: Component group using SA nozzles (nozzle for sucking a small-size component of 1.0 mm×0.5 mm) (for example, a taping type component group, wherein capacitors of 1.0 mm×0.5 mm are housed in recesses formed by embossment of an embossing tape)

Group G [5]: Component group using S nozzles (nozzle for sucking a small-size component of 3.2 mm×1.6 mm) (paper)

Group G [6]: Component group using S nozzle (nozzle for sucking a small-size component of 3.2 mm×1.6 mm) (embossment)

Group G [7]: Component group with 0 mm<component thickness<4 mm, and using small-size and large-size two-dimensional cameras Group G [8]: Component group with 0 mm<component thickness<4 mm, and using small-size and large-size three-dimensional cameras Group G [9]: Component group with 4 mm<component thickness<25 mm, and using small-size and large-size two-dimensional cameras Group G [10]: Component group with 4 mm<component thickness<25 mm, and using small-size and large-size three-dimensional cameras.

It is noted that these task groups may be out of order due to limitations of various rules.

Since components of the tray feed unit are 4 mm<component thickness<25 mm, they are forcibly allocated to group G [9] or group G [10].

Furthermore, for a case of component superposing mounting order specification, wherein a plurality of components are stacked vertically and mounted, component groups are formed in mounting units according to the following algorithm.

(1) Each of the components to be superposed and mounted is allocated in a mounting unit furthest downstream of a line where a component can be mounted. That is, for example, when a cover component is placed on a component such as a resistor or the like, the cover component, which is disposed on top, is allocated to the mounting unit furthest downstream of a line.

(2) The components allocated for each mounting unit are divided into the following two component groups.

Mounting unit group SG [1]: Component group using small-size and large-size two-dimensional cameras.

Mounting unit group SG [2]: Component group using small-size and large-size three-dimensional cameras.

FIG. 16 shows more specific examples.

In FIG. 16, "COMP-A" to "COMP-J" means components with component name A to component name J (hereinafter, referred to as "component A" to "component J", respectively). "2D small" of the recognition camera means a small-size two-dimensional camera. "2D large" means a large-size two-dimensional camera. "3D small" means a small-size three-dimensional camera. "3D large" means a large-size three-dimensional camera. Furthermore, a suction nozzle constitution of a suction nozzle to be used is determined according to resource information in user mounting requesting conditions. Furthermore, a component feeding cassette, which is an example of a component feeding device determines arrangement of feeders according to resource information in the user mounting requesting conditions.

It is indicated that Rule 1 (rule that two-dimensional and three-dimensional cameras, or 3D large and 3D small cannot coexist in one task since kinds of the recognition cameras or head movement speeds are different) is violated between component H and component I. That is, Rule 1 that component H and component I cannot be simultaneously recognized because component H is recognized by a large-size two-dimensional camera, while component I is recognized by a small-size three-dimensional camera is violated. Therefore, it is evident that the task needs to be divided between component H and component I.

Furthermore, it is shown that Rule 1 is violated between component I and component J. That is, component I is recognized by a small-size three-dimensional camera, while component J is recognized by a large-size three-dimensional camera. Therefore, Rule 1 that component I and component J cannot be simultaneously recognized is violated. Thus, it is evident that the task needs to be divided between component I and component J.

Furthermore, it is shown that Rule 2 (rule that in one task using a two-dimensional camera, components in one task must be limited so that a component height variation is at most 4 mm of a depth of field) is violated between component E and component F. That is, a component height of component E is 2.8 mm, while a component height of component F is 4.2 mm. Therefore, a Rule 2 that component E and component F do not have a component height variation of at most 4 mm of the depth of field, and cannot be simultaneously recognized, is violated. Therefore, it is evident that the task needs to be divided between component E and component F.

Meanwhile, it is shown that Rule 5 (it is desirable to unite all components of at most 6 mm in height in one task to speed up the placing operation) is violated between component G and component H. That is, a height of component G is 4.5 mm, while a height of component H is 7.0 mm. Therefore, since the height of component H exceeds 6 mm, Rule 5 that it is not desirable to recognize these components G and H at the same is violated. Therefore, it is evident that it is preferred that the task be divided between component G and component H.

Furthermore, it is shown that Rule 6 (it is desirable to divide a task so that a component recognized by 2D large and one recognized by 2D small are not mixed in one task to speed up the placing operation) is violated between component C and component D. That is, component C is recognized by a small-size two-dimensional camera, while component D is recognized by a large-size two-dimensional camera; that is, the component recognized by 2D large and that recognized by a 2D small are mixed in one task. Therefore, Rule 6 that it is desirable not to recognize these at the same time is violated. Thus, it is evident that it is preferred that the task be divided between component C and component D.

As a result, when strictly observed rules and desirably observed rules are observed, components A to C are allocated to one task group, components D and E are allocated to one task group, components F and G are allocated to one task group, component H is allocated to one task group, component I is allocated to one task group, and component J is allocated to one task group, which makes six task groups in total. However, when the strictly observed rules are observed, but the desirably observed rules are not observed, components A to E are allocated to one task group, components F to H are allocated to one task group, component I is allocated to one task group, and component J is allocated to one task group, which makes four task groups in total.

Subsequently, in step S54 in FIG. 14, a task group is generated for each mounting unit. At this time, by assuming one virtual mounting apparatus with a highest production capacity from mounting apparatus conditions and user mounting requesting conditions, a component mounting procedure for mounting operations of all components to be mounted is automatically divided into each operation unit for one head of the virtual mounting apparatus. Specifically, for example, in mounting apparatuses 1 to 3 in FIG. 15, as one virtual mounting apparatus with the highest production capacity, it is assumed that there are provided two heads, ten nozzles, 100 component feeding cassettes in maximum (calculated with width as 8 mm), a twin tray feed unit as a tray feed unit constitution, 50 nozzles as a nozzle station constitution (stocker capacity), and a two-dimensional camera and a three-dimensional camera as recognition cameras. Task groups are generated by one virtual mounting apparatus with the highest production capacity assumed as above. Consequently, when a task group is generated for each mounting unit, no component that cannot be generated is obtained.

Subsequently, in step S55 in FIG. 14, tasks are examined and regenerated for each mounting unit. That is, in the above-described step S54, as a result of generating task groups by one virtual mounting apparatus with the highest production capacity, an amount of data to be handled can be made small individually. However, when data is allocated to each real mounting apparatus, components cannot be mounted by this allocated mounting apparatus in practice and there are task groups that can be mounted by other mounting apparatuses. Therefore, such task groups are detected and an order of the task groups is regenerated.

Furthermore, as specific examples of steps S54 and S55, in an example of group G, while components are allocated to mounting units in units of the component groups G [i] (i= 1, . . . , 10), task groups are generated in mounting units, and task groups are moved between the mounting units, a line balance is optimized. This is described in detail later.

Subsequently, in step S56 in FIG. 14, the task groups, whose tasks are examined and regenerated for each mounting unit in step S55, are connected to generate component mounting data. Thus, output data when the mounting data is generated includes, for example, nozzle station data after optimization (when there is a nozzle station for each mounting unit), nozzle arrangement data after optimization (when there is not a nozzle station for each mounting unit), component feeding cassette arrangement data after optimization (for each mounting unit), mounting data after optimization (for each mounting unit), component groups, and a mounting order.

A line balance optimization algorithm (main routine) for optimizing line balance between mounting apparatuses is explained below.

Hereafter, a mounting unit tact means a mounting time required for all tasks in a mounting unit and the mounting time is calculated by utilizing a simulator. A maximum value of the mounting unit tact is a line tact.

A group G [i] largest mounting unit means a mounting unit to which a largest number of components of component group G [i] are allocated. In order not to get component groups out of the mounting order as much as possible, basically, a G [i+1] task group is generated by the group G [i] largest mounting unit and mounting units on a downstream side thereof.

A mounting order condition means that the G [i+1] largest mounting unit is any one of the group G [i] largest mounting unit or mounting units on the downstream side thereof.

A nozzle set is a combination of nozzles. A head number to which nozzles are attached is not specified. For example, four S, three M, and three L are used.

A nozzle pattern is an arrangement of nozzles (permutation), and the head number to which nozzles are attached is specified. For example, SSMMMSSLLL is specified.

While components are allocated to mounting units for each of the component groups G [i] (i=1, . . . , 10), task groups are generated in the mounting units, the task groups are moved between the mounting units, and the line balance is optimized. This is explained below.

Task groups are generated for each of mounting unit component group SG [1] and mounting unit component group SG [2] for each mounting unit by utilizing a task generation algorithm for general components (component larger than 3.2 mm×1.66 mm). Depending on an object mounting unit component group, another algorithm, that is, a task generation algorithm for small components can be utilized. Here, generated task groups are not to be subjected to task group movement.

Subsequently, the following items are considered for each component, and a list of mountable mounting units whereby this component can be mounted is generated. Option information in user mounting requesting conditions, that is: a three-dimensional camera and a collection conveyor; resource information in the user mounting requesting conditions, that is, nozzles, component feeding cassettes; a movement range of a head, for example, an XY movable range of an XY robot, information about whether component superposing mounting is performed or not; and so forth are considered.

Subsequently, the following processes A) to D) are performed for groups G [i] (in the order of i=1, . . . , 10).

A) Components of group G [i] are allocated to mounting units. Allocation target mounting units are limited to those included in the list of mounting units whereby the components can be mounted (see pre-processing step), and having a space where at least one component feeding cassette (or tray feed unit) of the components is disposed on the Z axis. A mounting unit is selected according to the following priority order.

A mounting unit with a shortest mounting unit tact from among a group G [i−1] largest mounting unit and mounting units on a downstream side thereof.

A mounting unit on an upstream side closest to the group G [i−1] largest mounting unit.

B) One task group is generated for only a mounting unit with a shortest mounting unit tact from among mounting units to which components in group G [i] are allocated by utilizing a task generation algorithm for small components or a task generation algorithm for general components.

C) When there are components in group G [i] not included in task groups generated so far, processing goes back to step A).

D) When a plurality of task groups are allocated to at least one mounting unit, the following are performed (line tact minimization algorithm described later): to an extent that component groups get out of a mounting order, task groups (movable component kinds among these) are moved, task groups that can be performed together are united at a movement destination, and then a new task group is reconstructed. A new task group is also reconstructed similarly at a source of the movement.

Rules for moving task groups are as follows.

Task group movement rule 1: Move a task group to another mounting unit so that a maximum value of a mounting unit tact is minimized.

Task group movement rule 2: Move a task group to a mounting unit on an upstream side to an extent that a maximum value is not increased.

It is noted that the number of nozzles may change upon movement. Furthermore, since movement is performed in units of task groups, line balance may be difficult.

Specific examples of movement in units of task groups are shown in FIGS. 19 to 32.

Figure 19:
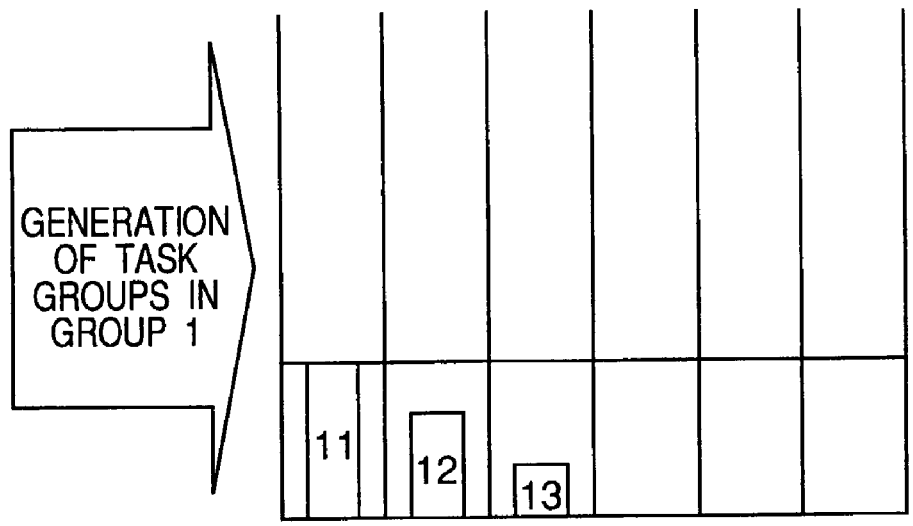
FIG. 19 is a view for explaining an example of movement in units of task groups in the one embodiment.

First, as shown in FIG. 19, task groups in group 1 are generated. That is, it is shown that task group 11, task group 12, and task group 13 in group 1 are allocated to mounting unit 1 (front-side mounting unit of the mounting apparatus 1), mounting unit 2 (rear-side mounting unit of the mounting apparatus 1), and mounting unit 3 (front-side mounting unit of the mounting apparatus 2), respectively.

Figure 20:
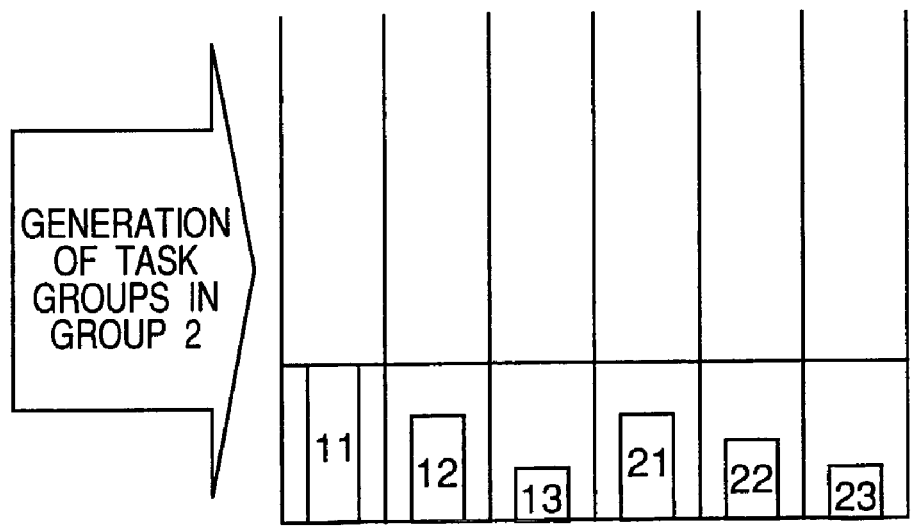
FIG. 20 is a view for explaining an example of movement in units of task groups in the one embodiment.

Subsequently, as shown in FIG. 20, task groups in group 2 are generated. That is, task group 21, task group 22, and task group 23 in group 2 are allocated to mounting unit 4 (rear-side mounting unit of the mounting apparatus 2), mounting unit 5 (front-side mounting unit of the mounting apparatus 3), and mounting unit 6 (rear-side mounting unit of the mounting apparatus 3), respectively.

Figure 21:
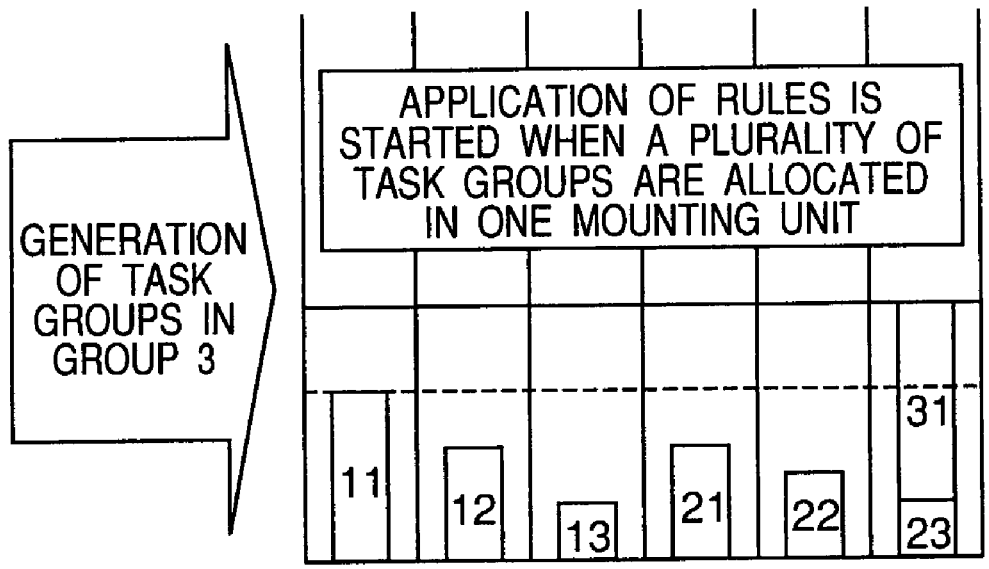
FIG. 21 is a view for explaining an example of movement in units of task groups in the one embodiment.

Subsequently, as shown in FIG. 21, task groups in group 3 are generated. That is, task group 31 in group 3 is allocated to mounting unit 6. As a result, when a plurality of task groups are allocated to one mounting unit (here, mounting unit 6), application of the task group movement rules is started. That is, task group 23 in group 2 and task group 31 in group 3 are in mounting unit 6. In FIG. 21, the lateral solid line indicates maximum tacts of all mounting units. The lateral dotted line indicates a maximum tact of all mounting units immediately therebefore. These are the same in other figures.

Figure 22:
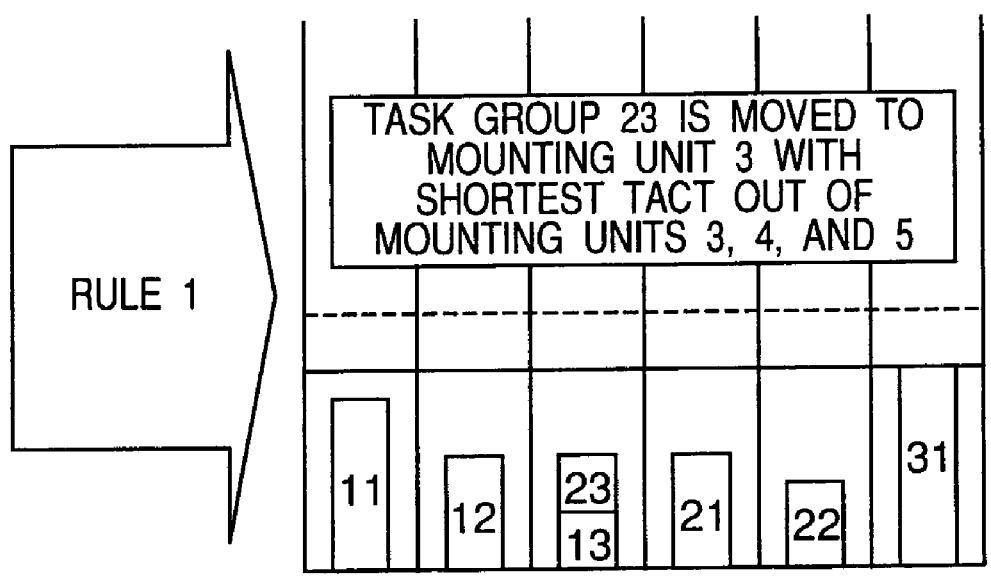
FIG. 22 is a view for explaining an example of movement in units of task groups in the one embodiment.

Subsequently, as shown in FIG. 22, out of mounting unit 3, mounting unit 4, and mounting unit 5, task group 23 is moved to mounting unit 3 with a shortest mounting unit tact. Here, a rule that task group 23 is moved to mounting unit 3 with the shortest tact in the mounting units is designated as rule 1.

Figure 23:
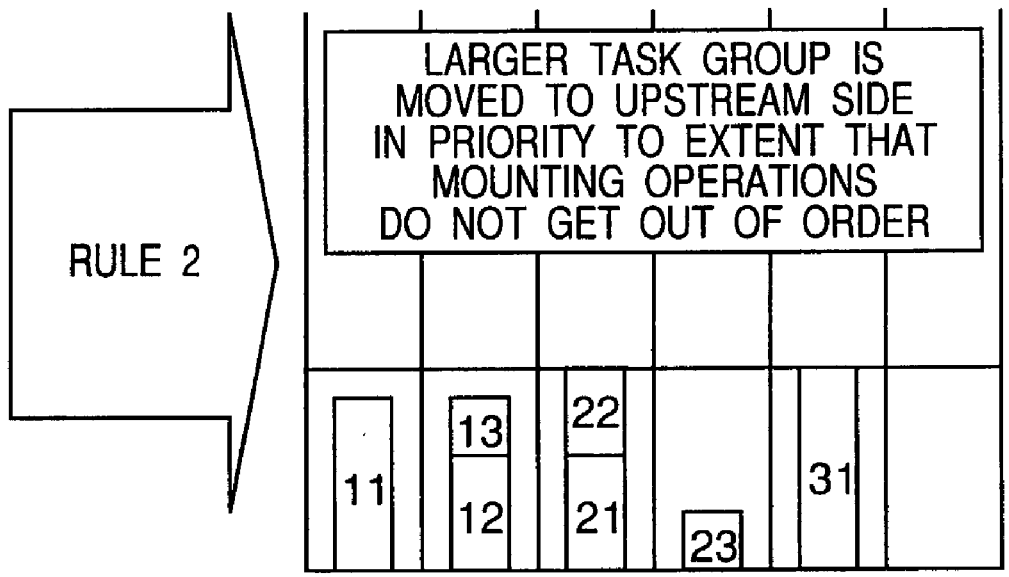
FIG. 23 is a view for explaining an example of movement in units of task groups in the one embodiment.

Subsequently, as shown in FIG. 23, to an extent that operations do not get out of a mounting order, larger task groups are moved to a mounting unit(s) on an upstream side in priority. This is designated as task group movement rule 2. That is, task group 13 is moved to mounting unit 2 and task group 12 and task group 13 are arranged in mounting unit 2. Along with this, task group 22, task group 21, task group 23, and task group 31 are moved, so that task group 22 and task group 21 are arranged in mounting unit 3, task group 23 is arranged in mounting unit 4, and task group 31 is arranged in mounting unit 5.

Figure 24:
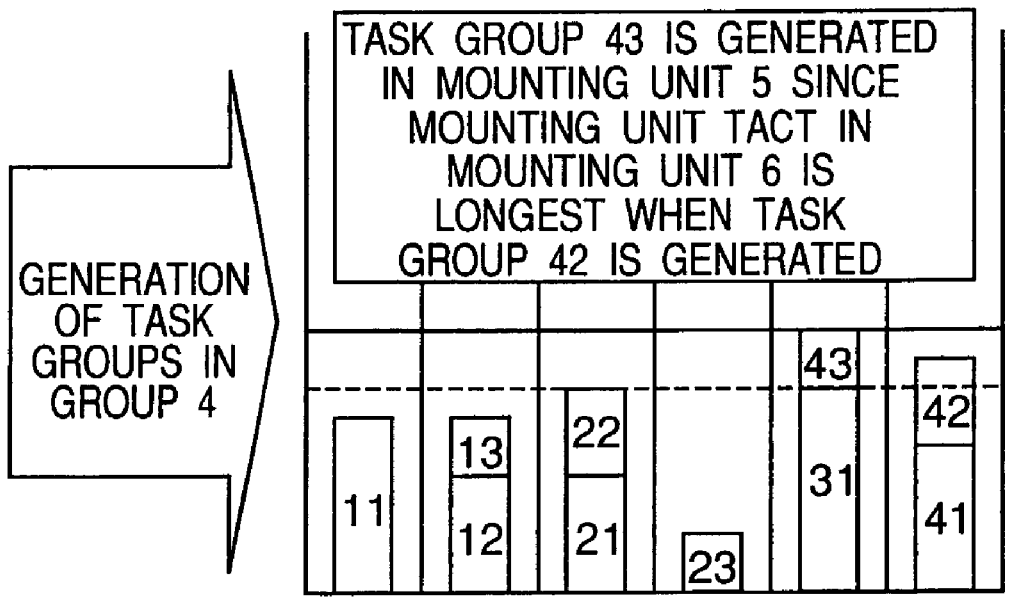
FIG. 24 is a view for explaining an example of movement in units of task groups in the one embodiment.

Subsequently, as shown in FIG. 24, task groups in group 4 are generated. That is, task group 41 and task group 42 in group 4 are arranged in mounting unit 6 and task group 43 in group 4 is arranged in mounting unit 5. As a result, when task group 42 is generated, a tact of mounting unit 6 is longest of all the mounting units. Therefore, task group 43 is generated not in mounting unit 6, but in mounting unit 5.

Figure 25:
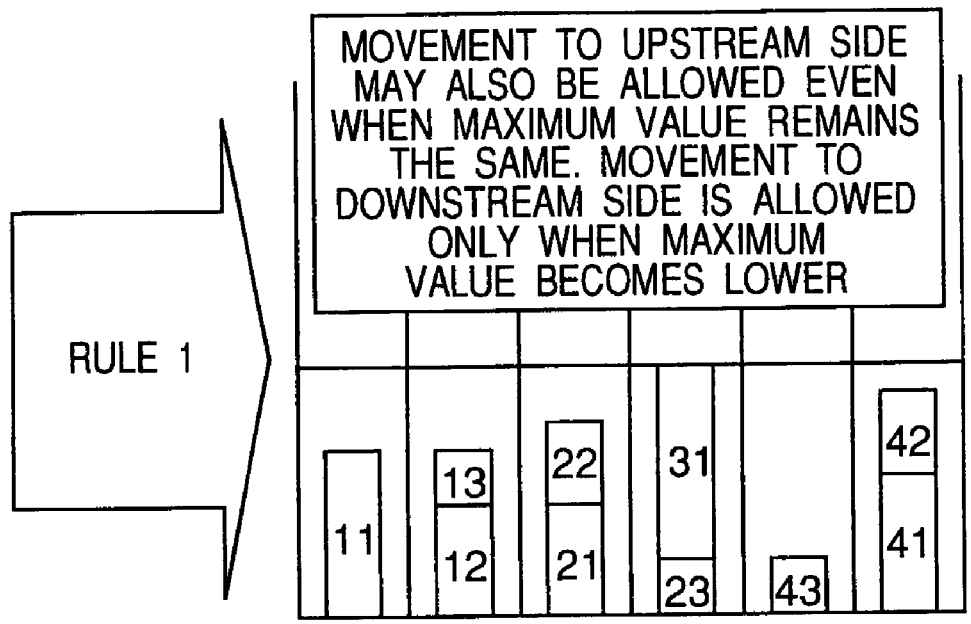
FIG. 25 is a view for explaining an example of movement in units of task groups in the one embodiment.

Subsequently, as shown in FIGS. 24 and 25, since a tact of mounting unit 5 becomes longest of all the mounting unit tacts, task group movement rule 1 is applied. That is, task group 31 of mounting unit 5 is moved to mounting unit 4. Thus, when task group movement rule 1 is applied, task groups can also be moved to mounting units on the upstream side when the tact maximum value remains the same. When task groups are moved to mounting units on a downstream side, this is permitted only when the tact maximum value becomes lower.

Figure 26:
FIG. 26 is a view for explaining an example of movement in units of task groups in the one embodiment.

Subsequently, as shown in FIGS. 25 and 26, since the tact of mounting unit 4 becomes longest among all the mounting unit tacts, task group movement rule 1 is applied. That is, task group 23 of mounting unit 4 is moved to mounting unit 3. As a result, the tact of mounting unit 3 is a total of those of task group 21, task group 22, and task group 23. Since this total tact is the same as the total tact of task group 23 and task group 31 in mounting unit 4 in FIG. 25, further movement of task groups to a mounting unit(s) on the upstream side resulting in a shorter tact is examined.

Figure 27:
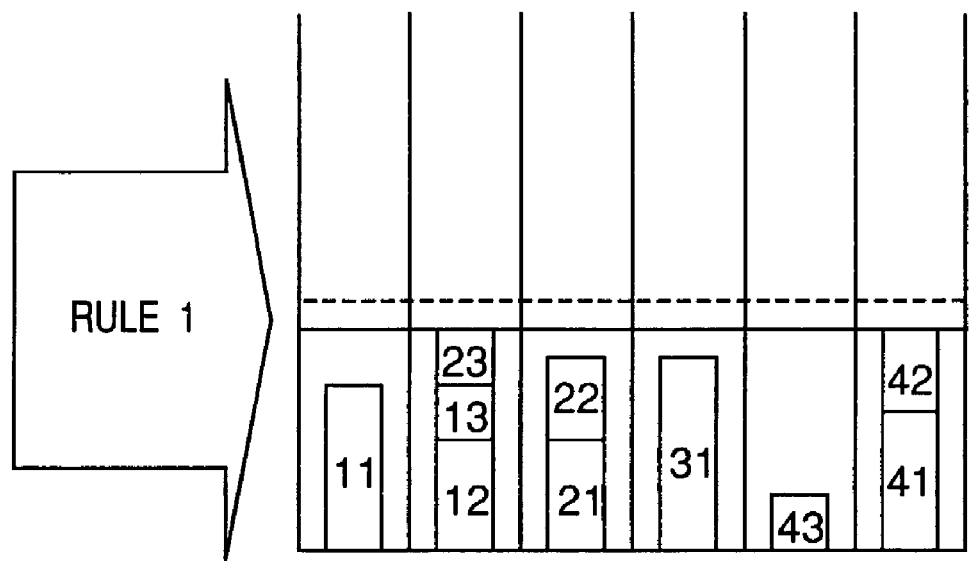
FIG. 27 is a view for explaining an example of movement in units of task groups in the one embodiment.

That is, as shown in FIGS. 26 and 27, since the tact of mounting unit 3 becomes the longest among all the mounting unit tacts, task group movement rule 1 is applied. That is, task group 23 in mounting unit 3 is moved to mounting unit 2.

Figure 28:
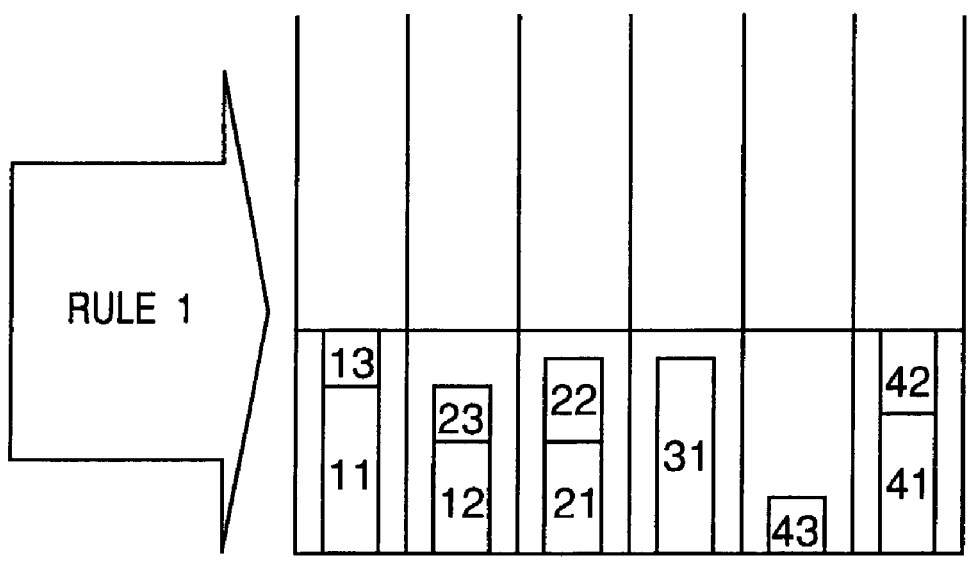
FIG. 28 is a view for explaining an example of movement in units of task groups in the one embodiment.

As a result, as shown in FIGS. 27 and 28, the tacts of mounting unit 2 and mounting unit 6 indicated with solid lines become shorter than the tact of mounting unit 3 indicated with a dotted line. However, since the tacts of mounting unit 2 and mounting unit 6 become the longest among all the mounting unit tacts, task group movement rule 1 is applied. That is, task group 13 in mounting unit 2 is moved to mounting unit 1.

Figure 29:
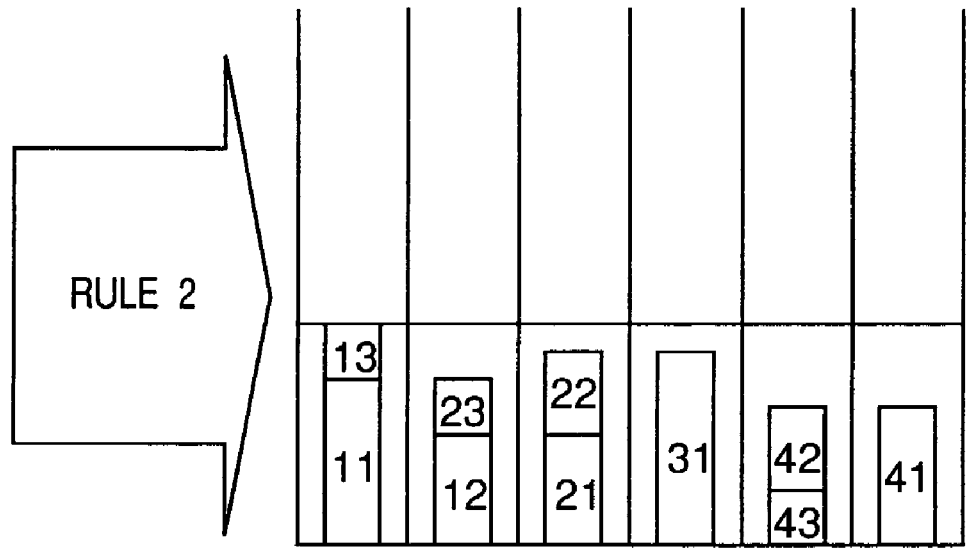
FIG. 29 is a view for explaining an example of movement in units of task groups in the one embodiment.

Subsequently, as shown in FIGS. 28 and 29, since the tact of mounting unit 6 becomes the longest among all the mounting unit tacts, task group movement rule 1 is applied. That is, task group 42 in mounting unit 6 is moved to mounting unit 5.

Figure 30:
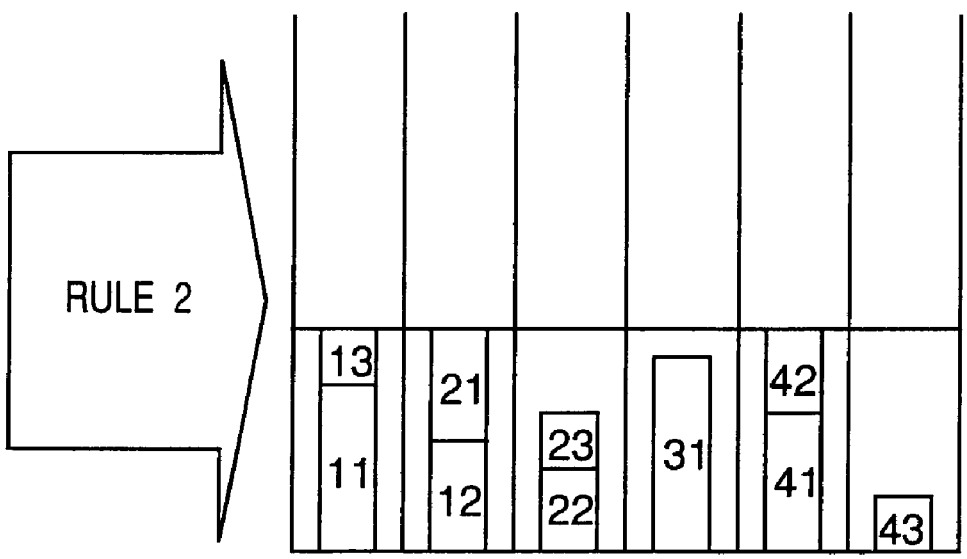
FIG. 30 is a view for explaining an example of movement in units of task groups in the one embodiment.

Subsequently, as shown in FIGS. 29 and 30, the tact of mounting unit 1 becomes the longest among all the mounting unit tacts. However, whether or not the tact of all mounting units as a whole can be shortened by further changing combinations in other mounting units is examined. That is, to an extent that operations do not get out of the mounting order, task group movement rule 2 that larger task groups are moved to the upstream side in priority is applied. That is, task group 21 in mounting unit 3 is moved to mounting unit 2, task group 23 in mounting unit 2 is moved to mounting unit 3, task group 43 in mounting unit 5 is moved to mounting unit 6, and task group 41 of mounting unit 6 is moved to mounting unit 5.

Figure 31:
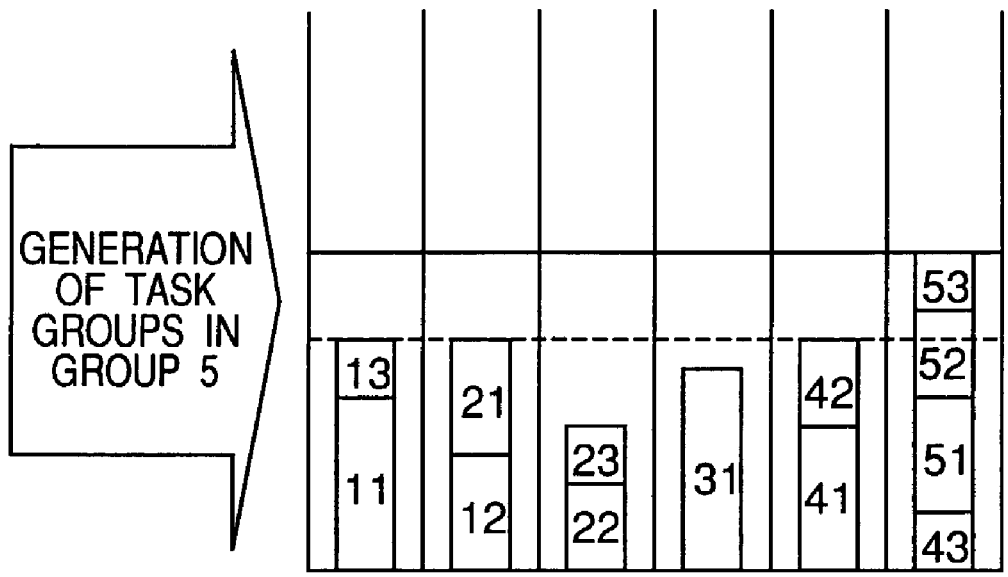
FIG. 31 is a view for explaining an example of movement in units of task groups in the one embodiment.
Figure 32:
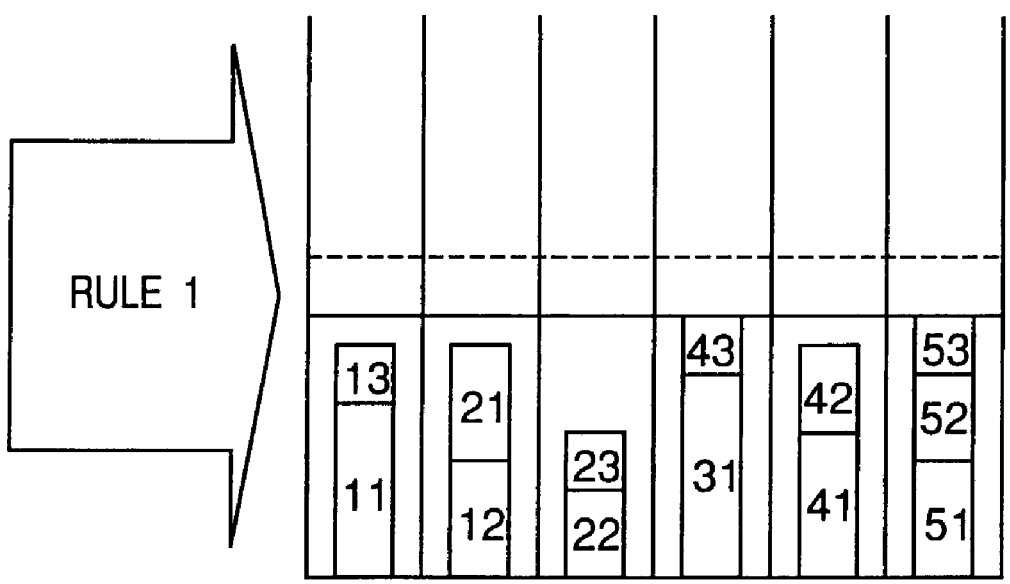
FIG. 32 is a view for explaining an example of movement in units of task groups in the one embodiment.

Subsequently, as shown in FIGS. 31 and. 32, task groups in group 5 are generated. That is, task group 51, task group 52, and task group 53 in group 5 are arranged in mounting unit 6. As a result, when task group 53 is generated, the tact of mounting unit 6 is the longest of all the mounting units. Therefore, task group 43 is moved from mounting unit 6 to mounting unit 4.

Consequently, task groups can be optimized.

A task generation algorithm for small components (small-size component of 3.2 mm×1.6 mm) is explained below.

Tasks are generated for groups G [1 to 6]. There are an algorithm for ten nozzles and that for four nozzles, but the basic principles of these algorithms are the same.

As an example, a task generation algorithm for ten nozzles is explained.

Tasks are generated so that a number of tasks for simultaneous suction of ten components by ten nozzles is increased. This indicates that tasks are generated so that as many components as possible can be simultaneously sucked by ten nozzles.

(1) A value a indicating a maximum number of tasks for simultaneous (at one time) suction of ten components that can be generated is calculated by the following expression.

$$\alpha = \max[\text{component kinds } [i] \times \text{required number/maximum number of divisions, component kinds } [i] \times \text{maximum number of divisions} > 0](\text{decimal part is carried})$$

(2) Ten component kinds are selected in an order of a required number, with the largest first. Component kinds having a required number larger than $\alpha$ are divided into component feeding cassettes of those with the required number of $\alpha$ and those with (original required number$-\alpha$), and the former is selected.

(3) Component kinds having the largest required number are selected from among component kinds having a required number of at most ($\alpha$−required number of component kinds selected in (2)). However, if there are component kinds that have a required number larger than ($\alpha$−required number of component kinds selected in (2)) and can be divided into component feeding cassettes, the component kinds are divided into component kinds having a required number of ($\alpha$−required number of component kinds selected in (2)) and component kinds (original required number−($\alpha$−required number of component kinds selected in (2))) for component feeding cassettes, and the former is selected.

(4) Tasks are generated from component kinds selected in steps (2) and (3) so that the number of tasks for one time suction of ten components is maximized.

(5) A Z axis in a direction of component feeding cassette arrangement is determined.

(6) Nozzle arrangement is determined.

A task generation algorithm for general components is explained below.

Tasks are generated for groups G [7 to 10]. There are task generation algorithms for ten nozzles and four nozzles, but basic principles of these algorithms are the same.

For general components, a component feeding device of a tray type (tray feed unit), a shuttle type, wherein components housed in a tray feed unit are once placed on a placing belt or the like and then the components are sucked from the belt, or the like is considered. Furthermore, height in a component group (restrictive consideration from focal depth), component feeding cassette, tray feed unit division, whether or not small and large nozzles can be mixed on the same line in a nozzle station, and so forth are considered.

Furthermore, coexistence of group G [7], group G [8], group G [9], and group G [ten] is also considered. When these groups are allocated in the same mounting unit by task group movement or the like, division is examined.

As an example, the task generation algorithm for ten nozzles is explained below.

(1) A multiplicity of nozzle sets (combinations of nozzles) are generated.

A) Nozzle Set Generating Method 1

A required number is obtained for each nozzle.

Subsequently, an average nozzle number (min [required number ratio×10 (decimal part is carried), required number]) is obtained for each nozzle.

Subsequently, all combinations satisfying that the nozzle number for each nozzle is 0<(average nozzle number)−($\alpha$+1)<(nozzle number)<(average nozzle number)+$\alpha \leq$ min [10, required number], and that the total number of nozzles of all nozzles is 10 or less, are generated.

B) Nozzle Set Generating Method 2

A required number weighted with a component size is obtained for each nozzle. Examples are shown in FIG. 34. A weight by component size, that is, a gap to be secured between adjacent nozzles (occupation gap between adjacent nozzles) needs to be considered. When the component size is 3.5 mm×3.5 mm, the gap is 0.5. Therefore, both adjacent nozzles can simultaneously suck components of this component size. However, when the component size is 38 mm×38 mm, the gap is 1.5. Therefore, if there is not a gap sufficient for one nozzle between nozzles, components of this component size cannot be simultaneously sucked.

Subsequently, for each nozzle, an average nozzle number (min [required number ratio×10 (decimal part is carried), required number]) is obtained.

Subsequently, all combinations satisfying that the nozzle number for each nozzle is 0<(average nozzle number)−($\alpha$+1)<(nozzle number)<(average nozzle number)+$\alpha \leq$ min [10, required number], and that the total number of nozzles of all nozzles is 10 or less, are generated.

C) Nozzle Set Generating Method 3

Subsequently, a required number is obtained for each pair of (nozzle, component size).

Subsequently, an average nozzle number (min [required number ratio×10 (decimal part is carried), required number] is obtained for each pair (nozzle, component size).

Subsequently, all combinations satisfying that the nozzle number for each pair of (nozzle, component size) is 0<(average nozzle number)−($\alpha$+1)<(nozzle number)<(average nozzle number)+$\alpha \leq$ min [10, required number], and that the total number of nozzles of all (nozzle, component size) pairs is 10 or less, are generated.

(2) Nozzles are allocated to each head in an order of limitation with a stronger limitation first for each nozzle set. A nozzle pattern (arrangement of nozzles, permutation) is generated. If a limitation is not satisfied, a nozzle set is discarded.

(3) Task groups are generated by allocating component kinds to each head (with nozzles) for each nozzle pattern. Allocation of component kinds to each head is determined in the following priority order.

Component Kinds Involved in Generation of the Nozzle

Component kinds belonging to the same component thickness group (minimization of number of scans). Here, a relationship between component thickness group and component thickness (T) is shown in FIG. 35. In this figure, component thickness group 2 and those having a greater thickness are positioned at level 2 (middle position L2 in FIG. 7, for example, 27 mm higher than mounting position $L_0$). That is, when the component thickness is at least a certain thickness and this component is mounted, an upper and lower height of a suction nozzle must be raised by a dimension of a component exceeding the component thickness. Otherwise, the component may be brought into contact with components already mounted on the board and knock them down. Therefore, component thickness group 2 and those having a greater thickness need to be maintained at level 2, that is, for example, the middle position $L_2$, 27 mm higher than the mounting position $L_0$ in FIG. 7.

Component Kinds in a Small Component Size

Component Kinds Having a Large Required Number of Components (4) The generated task group is evaluated for each nozzle pattern and the pair (nozzle pattern, task group) given the largest evaluated value is employed. Evaluation of the task group is the total of task evaluations. The task evaluations become higher as the number of components contained in a task (that is, number of components that can be simultaneously sucked) is increased. See FIG. 36. Consequently, for example, when the number of components is 7, the score is 4, but when the number of components is 9, the score is 8. As the number of components that can be simultaneously sucked is increased, the score becomes higher, and whether or not the task should be shortened is evaluated.

As described above, component information about a plurality of components to be placed onto a mounting target, for example, a board, board information about the board, and placing position information of the components for the board are prepared, while at least one or more conditions out of mounting apparatus conditions about a component feeding device for feeding the plurality of components, suction nozzles for holding fed components, component recognition devices for recognizing components held by the suction nozzles, board positioning devices for positioning boards onto which the components held by the suction nozzles and recognized are to be placed, heads having the suction nozzles and for moving the suction nozzles between the component feeding devices, the component, recognition devices, and the board positioning devices, and so forth in a mounting apparatus to be used, component holding conditions when the components are held from the component feeding devices by the suction nozzles, recognizing conditions when the components held by the suction nozzles are recognized by the recognition devices, placing conditions when the components held by the suction nozzles are placed onto the boards, and user mounting requesting conditions are prepared. Here, a case where a mounting operation wherein a mounting apparatus is used to hold, recognize, and place components is a strictly observed rule, which must be strictly observed and without observation of which a corresponding operation cannot be performed, based on the component information, board information, the placing position information, and the at least one or more of the conditions, which are prepared as above, in view of productivity or quality assurance and another case where a mounting operation wherein a mounting apparatus is used to hold, recognize, and place the components is a desirably observed rule, which is desirable to be observed, based on the component information, mounting target information, placing position information, and the at least one or more of the conditions, which are prepared as above, in view of prevention of lower productivity or lower quality or in view of safety are explained. A step for preparing the component information, the board information, and the placing position information, and a step for preparing the at least one or more conditions out of the mounting apparatus conditions, the component holding conditions, the recognizing conditions, the placing conditions, and the user mounting requesting conditions may be simultaneously performed, or either one of them may be performed first and then the other may be performed later.

More specific examples of strictly observed rules and desirably observed rules in view of productivity, strictly observed rules and desirably observed rules in view of quality assurance, and desirably observed rules in view of safety are explained below. It is noted that, in the following explanation, basically, each rule can be applied to various component mounting devices, but only a rule unique to a special kind of component mounting device is applied to the particular kind of component mounting device.

(A) View of Productivity (A1) Strictly Observed Rule

Examples of strictly observed rules in view of productivity are explained below.

Examples of strictly observed rules generated based on mounting apparatus conditions and component holding conditions in view of productivity include a rule that a suction nozzle that is not disposed in a component mounting device is not selected. For example, even if a component sucking operation by an S-size nozzle is instructed by a mounting program when there is no S-size nozzle, the sucking operation cannot be performed and nozzle replacement operation cannot be performed either since such a suction nozzle is not disposed in the component mounting device. Thus, mounting work is stopped. Based on this rule, no suction nozzle that is not disposed in the component mounting device can be selected in a component mounting operation.

Examples of strictly observed rules generated based on the mounting apparatus conditions and recognizing conditions in view of productivity include a rule that a two-dimensional recognition camera, three-dimensional recognition camera, or line sensor that is not disposed in a component mounting device is not selected. If such a two-dimensional recognition camera, three-dimensional recognition camera, or line sensor is selected, a recognition work cannot be performed since it is not disposed in the component mounting device. Thus, mounting work is stopped. Based on this rule, no two-dimensional recognition camera, three-dimensional recognition camera, or line sensor that is not disposed in the component mounting device is selected during a component mounting operation.

Figure 37:
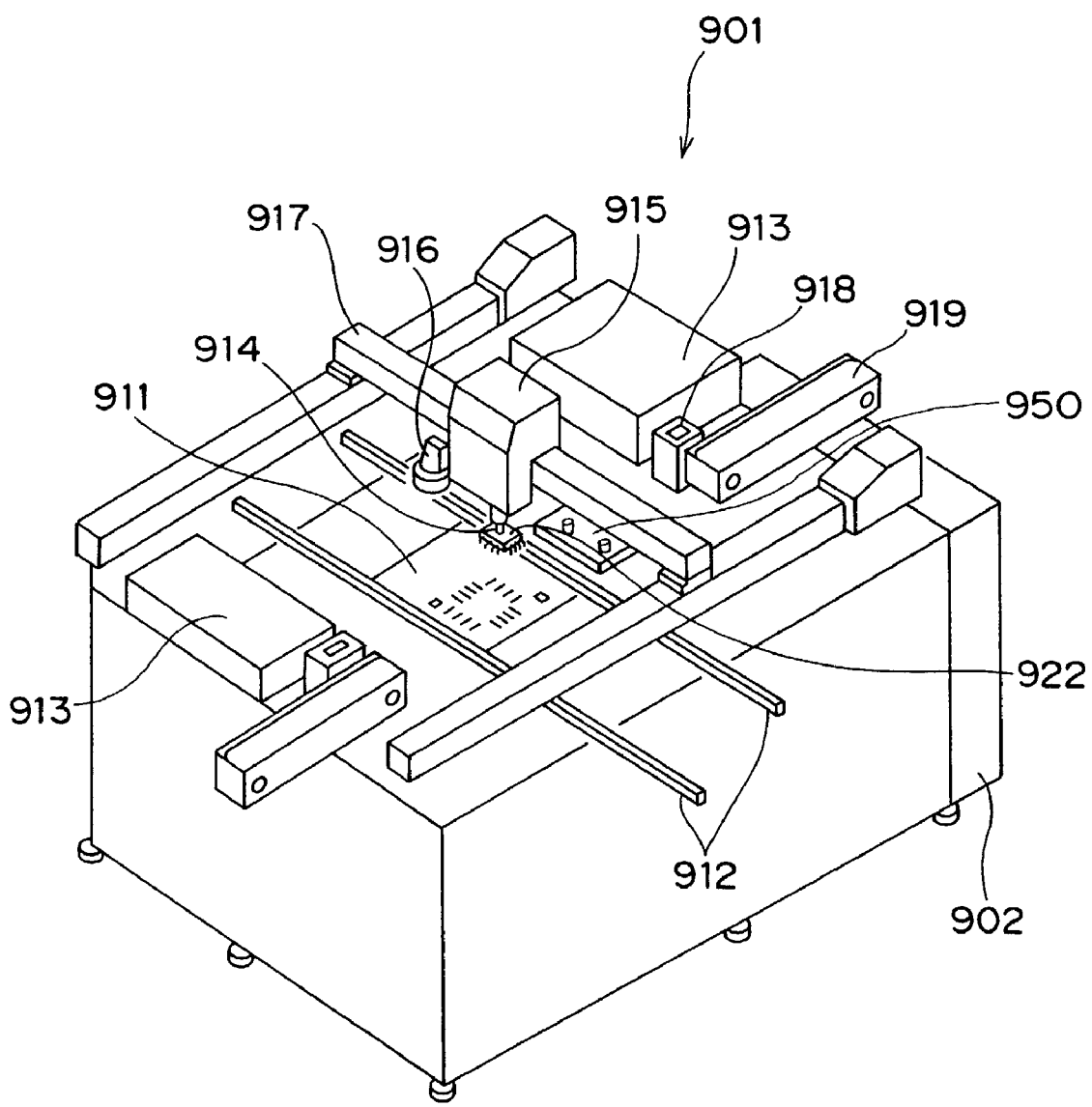
FIG. 37 is a perspective view showing an electronic component mounting device for employing the component mounting method according to the one embodiment.
Figure 38:
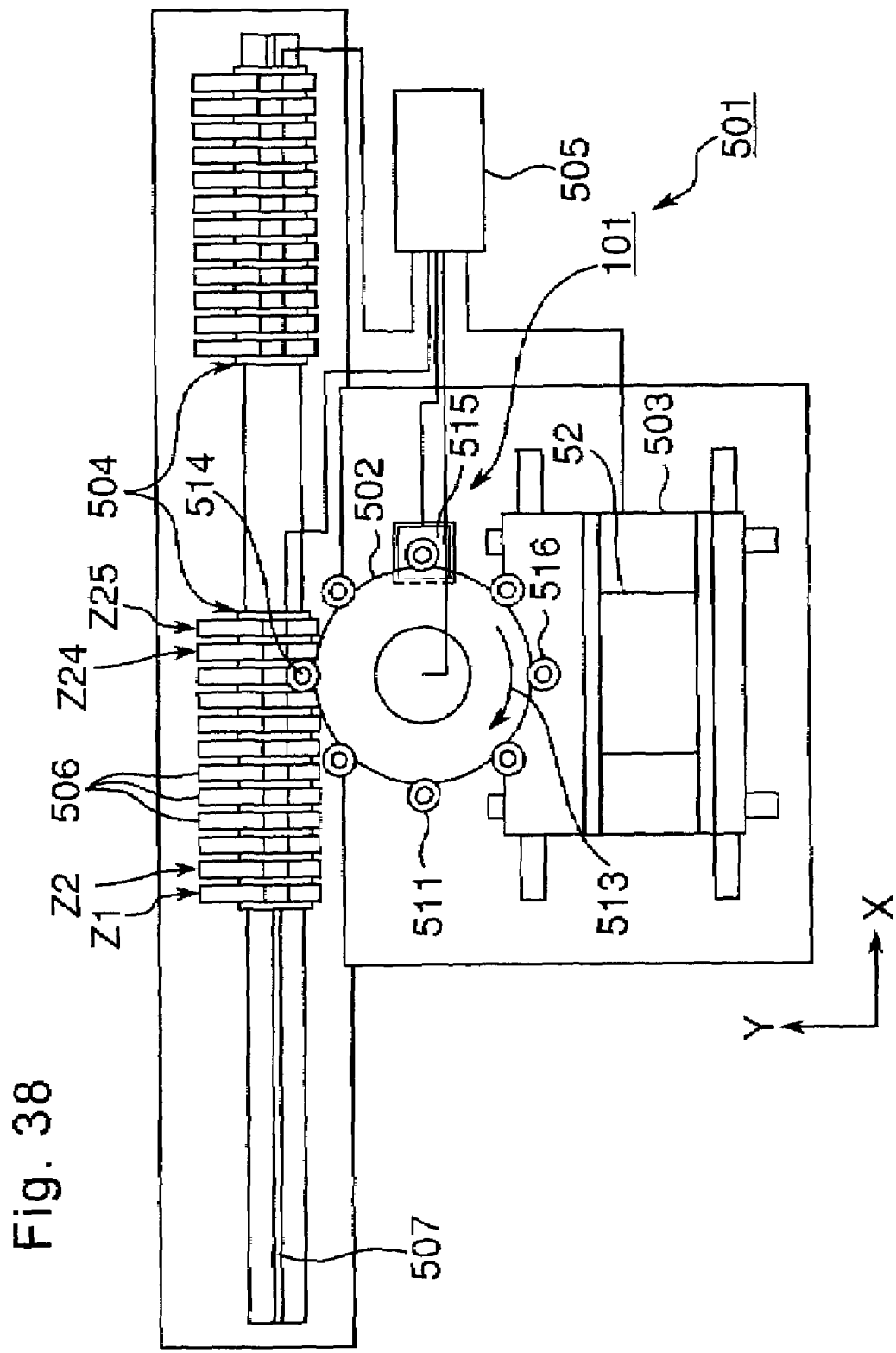
FIG. 38 is a plan view showing another electronic component mounting device for employing the component mounting method according to the one embodiment.

Furthermore, examples of strictly observed rules generated based on the mounting apparatus conditions and the component holding conditions in view of productivity not in a rotary head type high-speed component mounting device in FIG. 38, but in multifunctional component mounting devices shown in FIGS. 1 to 8, 37, 39, 40, and 41, wherein a head is movable in an X-Y plane, include a rule that, when a component is sucked and held by a nozzle, a nozzle that can be positioned at a component feeding position in a component feed unit is used. This is because, for example, when a nozzle only at one end portion of the mounting head can be positioned at the component feeding position in the component feed unit, and the other nozzles cannot be positioned at the component feeding position depending on limitations to an arrangement of component feeding cassettes or tray feed units in the component feed unit and to a moving distance of the mounting head, components in the component feeding cassette or tray feed unit can be sucked only by the nozzle that is at the one end portion in the mounting head and can be positioned at the component feeding position. Based on this rule, when components are sucked and held by nozzle(s) during a component mounting operation, nozzle(s) that can be positioned at the component feeding positions(s) in the component feed unit are used.

Furthermore, examples of strictly observed rules generated based on the mounting apparatus conditions and the component holding conditions in view of productivity in the component mounting device in FIGS. 1 to 8 include a rule that a mounting operation in a region where components cannot be mounted by the front-side mounting unit due to board size is performed by a rear-side mounting unit or by using another component mounting device. This is because the mounting head cannot mount components outside a range where the mounting head of the front-side mounting unit can be moved. Based on this rule, during a component mounting operation, a mounting operation is performed by the rear-side mounting unit or by using another component mounting device in a region where components cannot be mounted by the front-side mounting unit due to the board size.

(A2) Desirably Observed Rule

Examples of desirably observed rules in view of productivity are explained below. (1) Examples of desirably observed rules generated based on the placing conditions and user mounting requesting conditions in view of productivity include a rule that, even though placement is possible when components are placed, placement that results in lower productivity is not performed. Based on this rule, even though placement is possible when components are placed, placement that results in lower productivity is not performed during a component mounting operation.

For example, instead of placing large components first and small components later, the small components are placed first and the large components are placed later. As another example, instead of placing heavy components first and light components later, the light components are placed first and the heavy components are placed later. As yet another example, instead of placing tall components first and short components later, short components are placed first and tall components are placed later. A reason for these is that, since positional deviations of large, heavy, or tall components easily occur during an operation of moving a board to a placing position as compared with small, light, or short components, positional deviations of the large, heavy, or tall components are likely to occur on the board due to their inertial force if a moving speed of the board is increased and the board is stopped or the like when components larger, heavier, or taller than the smaller, lighter, or shorter components are placed. Therefore, the moving speed of the board needs to be decreased to an extent that positional deviations of the large, heavy, or tall components do not occur, thereby resulting in lower productivity. On the other hand, when large, heavy, or tall components are placed as late as possible and small, light, or short components are placed first, the moving speed of the board does not need to be decreased until large, heavy, or tall components are placed and a mounting operation can be performed with favorable productivity.

Furthermore, examples of desirably observed rules generated based on the placing conditions and the user mounting requesting conditions in view of productivity include a rule that instead of placing thin components having leads with narrow pitches such as, for example, TSOP (Thin Small Outline Package) and TQFP (Thin Quad Flat Package) earlier than other components, the TSOP (Thin Small Outline Package) and TQFP (Thin Quad Flat Package) are placed later than other components. This is because, when components such as TSOP and TQFP are placed earlier than other components and a moving speed of a board is increased, positional deviations of the components such as TSOP and TQFP may occur on the board when the board is stopped or the like. Therefore, the moving speed of the board needs to be decreased to an extent that positional deviations of the components such as TSOP and TQFP do not occur, thereby resulting in lower productivity. On the other hand, when components such as TSOP and TQFP are placed as late as possible and other components are placed first, the moving speed of the board does not need to be decreased until components such as TSOP and TQFP are placed, and a mounting operation can be performed with favorable productivity. Based on this rule, instead of placing thin components having leads in narrow pitches such as, for example, TSOP and TQFP earlier than other components, the components such as TSOP and TQFP are placed later than other components during a component mounting operation.

Examples of desirably observed rules generated based on the placing conditions and the user mounting requesting conditions in view of productivity include a rule that replacement of suction nozzles is performed with as few frequencies as possible. This is because, if replacement is frequently performed, time is required for performing replacement operations, thereby deteriorating mounting efficiency. Based on this rule, replacement of suction nozzles is performed as infrequently as possible during a component mounting operation.

Examples of desirably observed rules generated based on the mounting apparatus conditions, component holding conditions, and user mounting requesting conditions in view of productivity not in a rotary head type high-speed component mounting device in FIG. 38, but in multifunctional component mounting devices shown in FIGS. 1 to 8, 37, 39, 40, and 41, wherein the head is movable in the X-Y plane, include a rule that, when components are sucked, component suction heights, for example, heights of upper surfaces of components are aligned as much as possible. This is because, with such alignment, components having different heights can be sucked at once. Based on this rule, when components are sucked during a component mounting operation, component suction heights, for example, heights of the upper surfaces of the components are aligned as much as possible.

Examples of desirably observed rules generated based on the mounting apparatus conditions, recognizing conditions, and user mounting requesting conditions in view of productivity not in a rotary head type high-speed component mounting device in FIG. 38, but in multifunctional component mounting devices shown in FIGS. 1 to 8, 37, 39, to 40, and 41, wherein the head is movable in the X-Y plane, include a rule that, when components are recognized, component recognition surfaces, for example, heights of lower surfaces of components are aligned as much as possible. This is because, with this alignment, components having different heights can be recognized at once. Based on this rule, when components are recognized during a component mounting operation, component recognition surfaces, for example, heights of the lower surfaces of the components are aligned as much as possible.

Examples of desirably observed rules generated based on the user mounting requesting conditions in view of productivity not in a rotary head type high-speed component mounting device in FIG. 38, but in multifunctional component mounting devices shown in FIGS. 1 to 8, 37, 39, 40, and 41, wherein the head is movable in the X-Y plane, include a rule that movement of the mounting head is made as small as possible. This is because, when movement of the mounting head is made as small as possible, a placement work can be performed more efficiently. Based on this rule, movement of the mounting head is made as small as possible during a component mounting operation.

Examples of desirably observed rules generated based on the user mounting requesting conditions in view of productivity not in a rotary head type high-speed component mounting device in FIG. 38, but in multifunctional component mounting devices shown in FIGS. 1 to 8, 37, 39, 40, and 41, wherein the head is movable in the X-Y plane, include a rule that components to be placed onto a board are sucked in advance during carrying-in and carrying-out of the board. For example, while a board, on which components are already mounted, is carried out from a board conveying/holding device or a board holding device, such as a pair of support rail units 21, 22, to an unloader, a next new board is carried in from a loader to the board conveying/holding device or the board holding device, or a board on which components are already mounted is carried out from a board conveying/holding device or a board holding device, such as a pair of support rail units 21, 22, to an unloader and a next new board is carried in from a loader to the board conveying/holding device or the board holding device, and components to be placed on the next new board are sucked. This is because, for example, a long time is required to hold components positioned at positions far from the board conveying/holding device or the board holding device when they are placed. Therefore, components can be held by utilizing the time for carrying in and out the board, so that a mounting time as a whole can be shortened. Based on this rule, components to be placed on a board are sucked in advance during carrying-in or carrying-out of a board during a component mounting operation.

Furthermore, examples of desirably observed rules generated based on the mounting apparatus conditions and the component holding conditions in view of productivity in the component mounting device in FIGS. 1 to 8 include a rule that when a region is closer to a mounting reference position of a board in a mounting program in one mounting unit as compared with a distance from a mounting reference position of a board in a mounting program in another mounting unit, a mounting operation therein is performed by the one mounting unit. This is because, for example, when a lower left corner of a board 2 is used as an original point position of a component placing position in a mounting program in the front-side mounting unit in FIG. 2, a mounting operation is performed in a region of shaded region 2A, which is close to this original point position, and then other regions are moved to the rear-side mounting unit. When an upper right corner of a board 2 is used as an original point position of a component placing position in a mounting program in the rear-side mounting unit and a mounting operation is performed in the shaded region 2A, which is close to this original point position, a moving distance of the mounting head in each region 2A can be shortened and a mounting operation can be performed more efficiently. Based on this rule, when a region is closer to a mounting reference position of a board in a mounting program in one mounting unit as compared with a distance from a mounting reference position of a board in a mounting program in another mounting unit, a mounting operation therein is performed by the one mounting unit.

(B) View of Quality Assurance (B1) Strictly Observed Rule

Examples of strictly observed rules in view of quality assurance are explained below.

Figure 42:
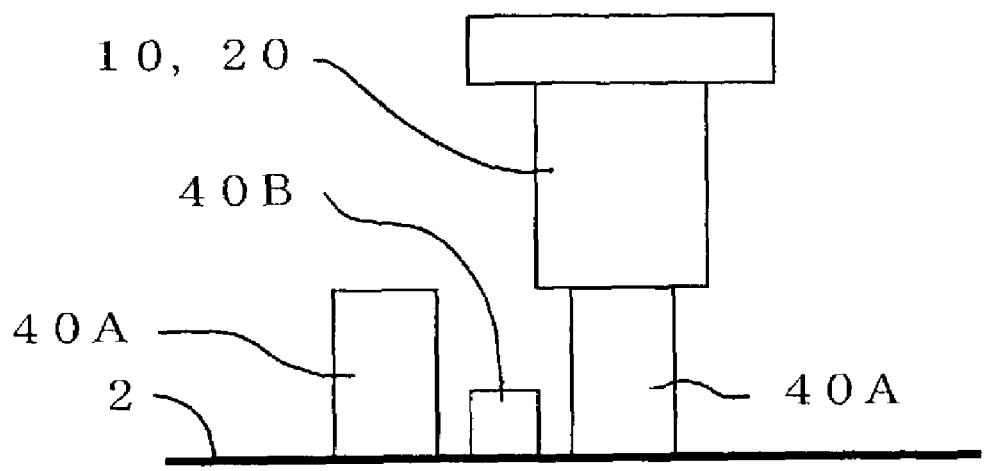
FIG. 42 is a view for explaining a case where a shorter component and taller components are placed with narrow pitches.
Figure 43:
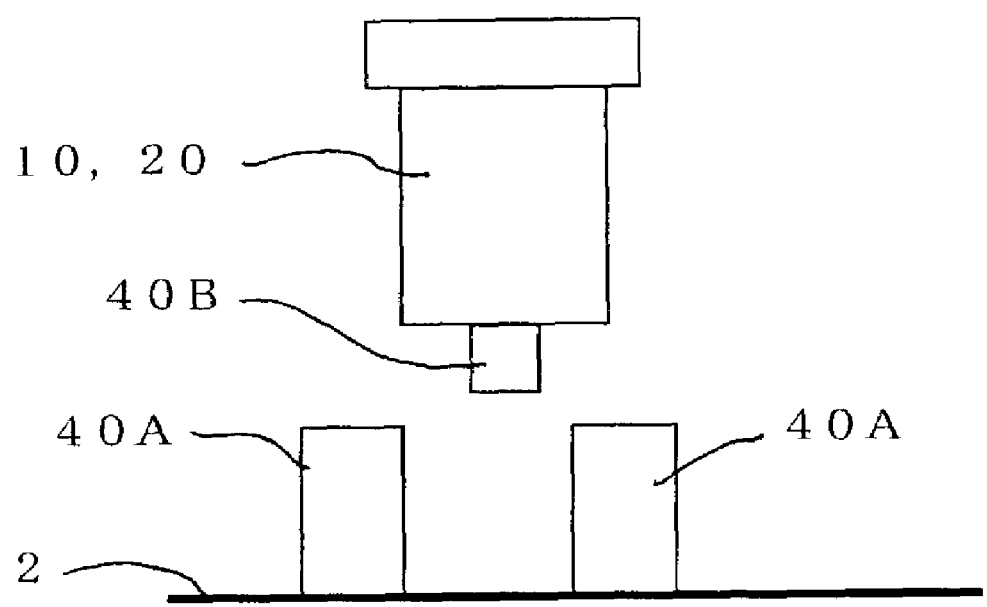
FIG. 43 is a view for explaining a case where taller components are first placed and then a shorter component is placed later during placement as shown in FIG. 42.

Examples of strictly observed rules generated based on placing conditions and user mounting requesting conditions in view of quality assurance include a rule that, when tall components and short components are placed with narrow pitches, the short components are placed earlier than the tall components. This is because, for example, as shown in FIG. 42, when a short component 40B is placed between tall components 40A, 40A, a nozzle 10, 20 is brought into contact with the tall components 40A and the short component cannot be inserted between the two tall components 40A, 40A if the tall components 40A are placed first and then the short component 40B is tried to be inserted and placed later between the two tall components 40A, 40A as shown in FIG. 43. Therefore, the short component 40B needs to be surely placed earlier than the tall components 40A. Based on this rule, when tall components and short components are placed with narrow pitches in a component mounting operation, the short components are placed earlier than the tall components.

(B2) Desirably Observed Rule

Examples of desirably observed rules in view of quality assurance are explained below.

Examples of desirably observed rules based on the placing conditions and the user mounting requesting conditions in view of quality assurance include a rule that, when components are placed, placement that results in lower quality is not performed even though this placement is possible. Based on this rule, when components are placed during a component mounting operation, placement that results in lower quality is not performed even though this placement is possible.

For example, there is a rule that, instead of placing large components first and small components later, the small components are placed first and the large components are placed later. As another example, there is a rule that, instead of placing heavy components first and light components later, the light components are placed first and the heavy components are placed later. As yet another example, there is a rule that, instead of tall components placed first and short components placed later, the short components are placed first and the tall components are placed later. A reason for these is that, since positional deviations of large, heavy, or tall components easily occur during an operation of moving a board to a placing position as compared with small, light, or short components, positional deviations of the large, heavy, or tall components are likely to occur on the board due to their inertial force if a moving speed of the board is increased and the board is stopped or the like when components larger, heavier, or taller than the small, light, or short components are placed. Therefore, the moving speed of the board needs to be decreased to an extent that positional deviations of the large, heavy, or tall components do not occur, thereby resulting in lower productivity. On the other hand, when large, heavy, or tall components are placed as late as possible and small, light, or short components are placed first, the moving speed of the board does not need to be decreased until the large, heavy, or tall components are placed and a mounting operation can be performed with favorable quality.

Furthermore, examples of desirably observed rules generated based on the placing conditions and the user mounting requesting conditions in view of quality assurance include a rule that, instead of placing thin components having leads with narrow pitches such as, for example, TSOP (Thin Small Outline Package) and TQFP (Thin Quad Flat Package) earlier than other components, the TSOP and TQFP are placed later than the other components. This is because, when components such as TSOP and TQFP are placed earlier than other components and a moving speed of a board is increased, positional deviations of the components such as TSOP and TQFP may occur on the board when the board is stopped or the like, thereby resulting in lower quality. Therefore, the moving speed of the board needs to be decreased to an extent that positional deviations of the components such as TSOP and TQFP do not occur, but quality may still be deteriorated. On the other hand, when the components such as TSOP and TQFP are placed as late as possible and other components are placed first, the moving speed of the board does not need to be decreased until components such as TSOP and TQFP are placed, and a mounting operation can be performed while maintaining good quality. Based on this rule, instead of placing thin components having leads with narrow pitches such as, for example, TSOP and TQFP earlier than other components, the components such as TSOP and TQFP are placed later than the other components during a component mounting operation.

Examples of desirably observed rules generated based on the placing conditions and the user mounting requesting conditions in view of quality assurance include a rule that moisture absorbent components are placed as late as possible. The moisture absorbent components, for example, components such as SOP (Small Outline Package) and QFP (Quad Flat Package), wherein a package resin has moisture absorbency, are removed from a component feeding cassette or a tray feed unit in a sealed state and placed onto a board. After a lapse of a certain amount of time, the package resin may absorb too much moisture and explode due to existence of moisture at a time of reflow during a reflow process as a post-processing step. Therefore, by placing the above-described moisture absorbent members as late as possible, a time required for removing components from the component feeding cassette and the tray feed unit in a sealed state, placing the components onto the board, and then transferring the board to a next step needs to be shortened to prevent lower quality. Based on this rule, moisture absorbent components are placed as late as possible during a component mounting operation.

Furthermore, examples of desirably observed rules based on the placing conditions and the user mounting requesting conditions in view of quality assurance in a rotary head type high-speed component mounting device in FIG. 38 include a rule that movement of a board conveying/holding device or a board holding device holding a board is made as small as possible. That is, when a board conveying/holding device or a board holding device holding a board is moved largely, positional deviations of placed components may occur, thereby resulting in lower quality. Therefore, it is desirable that movement of a board positioning device 503 is made as small as possible. Based on this rule, movement of a board conveying/holding device or a board holding device holding a board is made as small as possible during a component mounting operation.

Examples of desirably observed rules based on the placing conditions and the user mounting requesting conditions in view of quality assurance not in a rotary head type high-speed component mounting device in FIG. 38, but in multifunctional component mounting devices shown in FIGS. 1 to 8, 37, 39, 40, and 41, wherein the head is movable in the X-Y plane, include a rule that a movement amount of a mounting head having nozzles is made as small as possible. This is because, as the movement amount of the mounting head becomes larger, an inertial force when the head is stopped is increased and mechanical abrasion easily occurs in a driving portion. Furthermore, since a vibration is applied to the device as a whole, positional deviations at a time of placement or positional deviations of placed components due to the vibration may occur, which is not desirable. Based on this rule, a movement amount of a mounting head having nozzles is made as small as possible during a component mounting operation.

Figure 39:
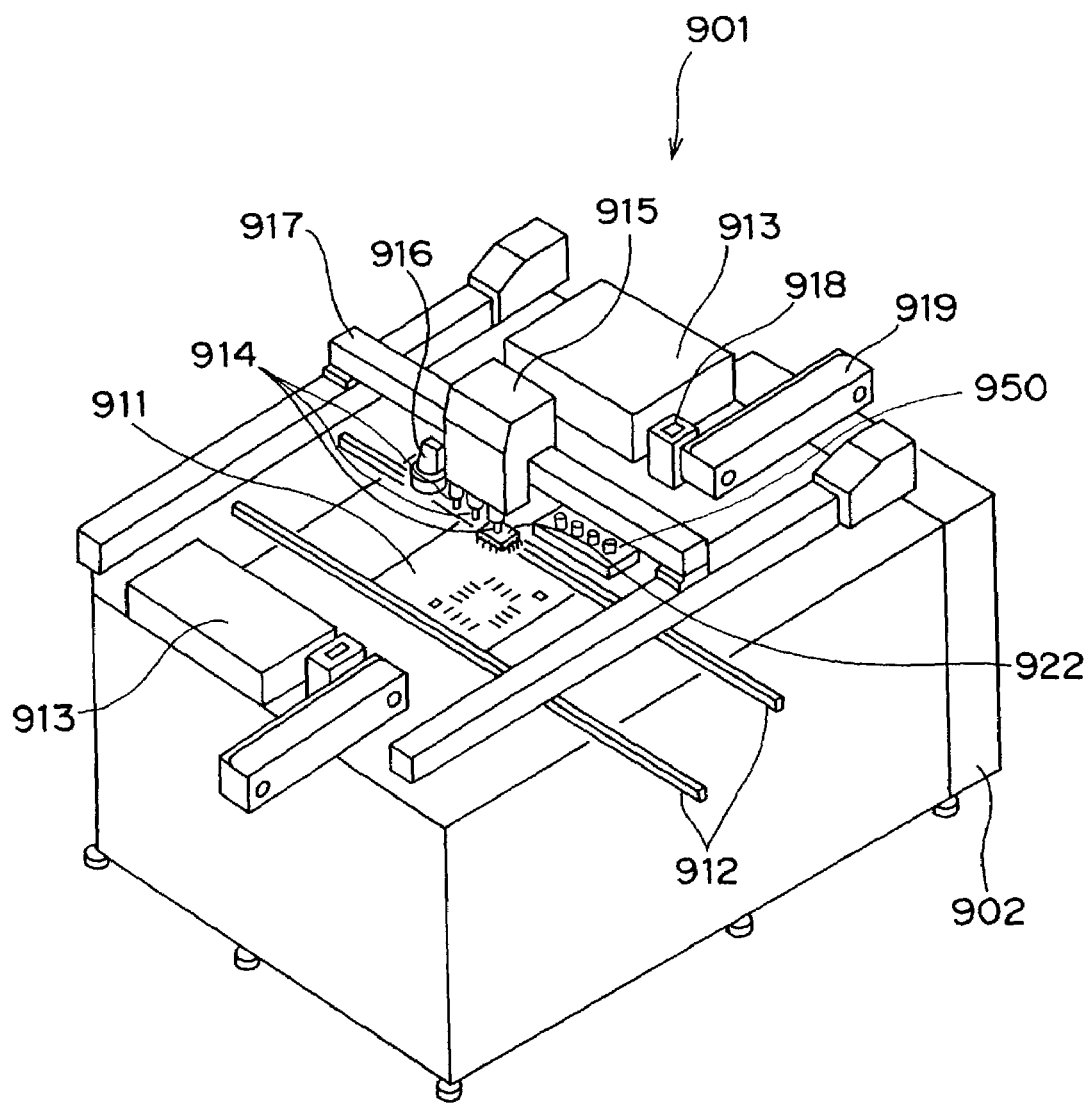
FIG. 39 is a perspective view showing the electronic component mounting device for employing the component mounting method according to the embodiment of FIG. 37 when a plurality of nozzles are included in the electronic component mounting device.
Figure 40:
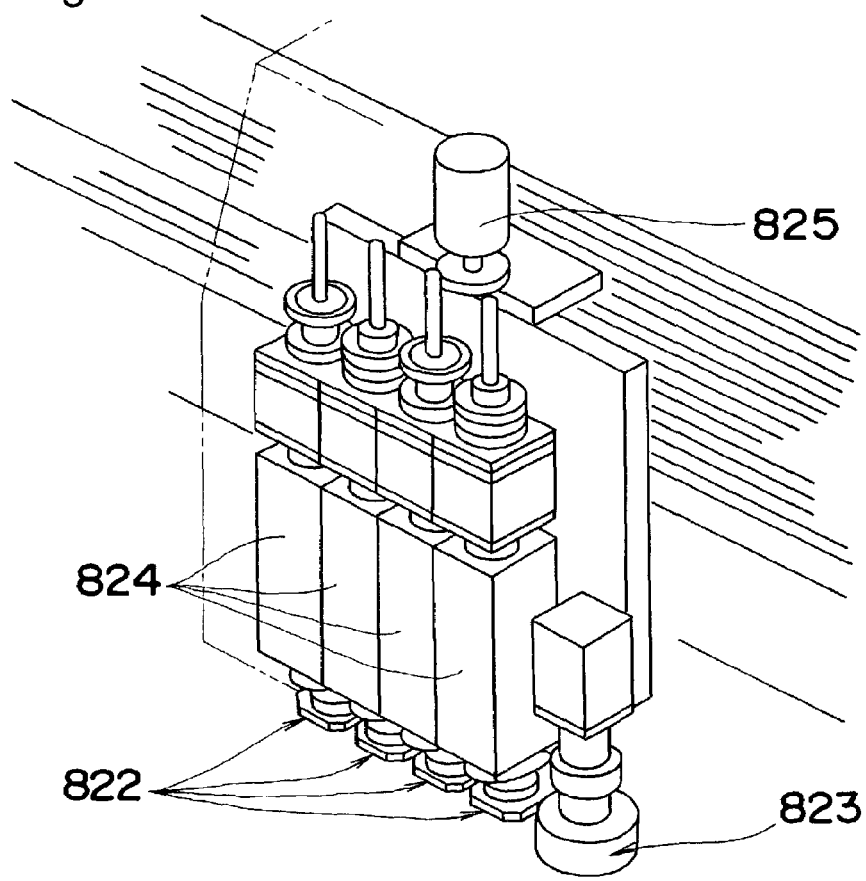
FIG. 40 is a perspective view showing another example of a mounting head.
Figure 41:
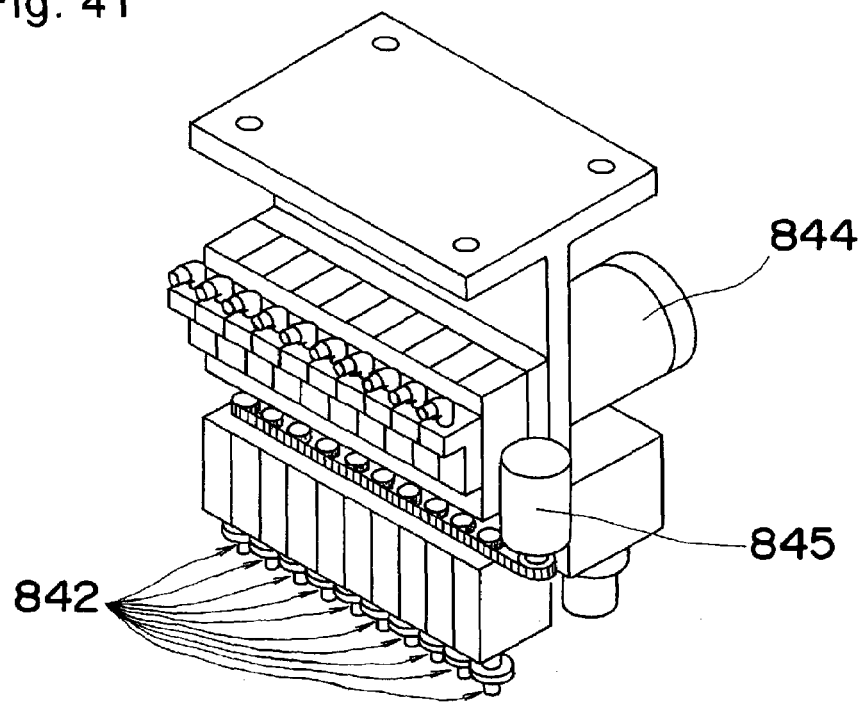
FIG. 41 is a perspective view showing yet another example of the mounting head.

Examples of desirably observed rules based on mounting apparatus conditions, the component holding conditions and the user mounting requesting conditions in view of quality assurance not in a rotary head type high-speed component mounting device in FIG. 38, but in multifunctional component mounting devices shown in FIGS. 1 to 8, 37, 39, 40, and 41, wherein the head is movable in the X-Y plane, include a rule that, when components are sucked, component suction heights, for example, heights of upper surfaces of components are aligned as much as possible. This is because, when components having different heights are to be sucked at once, for example, by a head of a type wherein all nozzles are lowered at once as shown in FIG. 41, nozzles are lowered at once so that a lower end of a nozzle is brought into contact with an upper surface of a lowest component. For components higher than the lowest component, springs (for example, the spring 65 in FIGS. 5 to 7) disposed on a nozzle side are contracted by their height difference and the nozzles are pressed up by the components so that all the components are simultaneously sucked by all the nozzles. In such a case, an urging force of the spring may act on a component and adversely affect a quality of the component. Therefore, to avoid such a state where possible, it is desirable that component suction heights, for example, heights of the upper surfaces of components are aligned. Based on this rule, when components are sucked, component suction heights, for example, heights of upper surfaces of components are aligned as much as possible during a component mounting operation.

Examples of desirably observed rules based on the placing conditions and the user mounting requesting conditions in view of quality assurance include a rule that a component sucked by a nozzle is rotated to a placing angle before component recognition. This is because, if the component is rotated to the placing angle after recognition, a rotation angle is increased. In a case where a nozzle is distorted due to heat, this distortion has a greater effect as the rotation angle is increased, thereby increasing a placing angle error. Therefore, it is desirable to rotate a component to the placing angle before recognition where possible. Based on this rule, a component sucked by a nozzle is rotated to a placing angle before component recognition during a component mounting operation.

(C) In View of Safety (C1) Strictly Observed Rule

Usually, an operation without observing strictly observed rules in view of safety is not permitted since an accident is very likely to occur if these rules are not observed. Therefore, there is no strictly observed rules in view of safety.

(C2) Desirably Observed Rule

Examples of desirably observed rules in view of safety are explained below.

Examples of desirably observed rules based on user mounting requesting conditions in view of safety in a rotary head type high-speed component mounting device in FIG. 38 or the like include a rule that a large structure is not moved a long distance where possible. For example, component feeding cassettes 506 are not rapidly moved a long distance along a direction of the arrangement. More specifically, when a position of a component feeding cassette 506 disposed at a position furthest from a component feeding position is designated as address Z1 and a position of component feeding cassette 506 nearest therefrom is designated as address Z25, instead of allowing a nozzle 511 to suck components fed by each component feeding cassette 506 starting with the component feeding cassette 506 at address Z25 towards the component feeding cassette 506 at address Z1, like address Z25, address Z24, address Z23, and so forth, the nozzle 511 is allowed to suck components fed by each component feeding cassette 506 while moving alternately between the address Z1 side and the address Z25 side, like address Z1, address Z25, address Z2, and so forth. Consequently, one block of component feeding cassettes 506 from address Z1 to address Z25 moves largely and rapidly for each component suction. Therefore, some users consider it undesirable because an operator feels uneasiness. Furthermore, when a large structure is moved so largely and rapidly, a vibration may be transmitted to the component mounting device as a whole due to its inertial force when it is stopped and drive mechanisms may experience serious abrasion. Positioning accuracy may also be deteriorated. Therefore, some users may consider this undesirable in view of safety as well as in view of quality assurance. Based on this rule, a large structure is not moved a long distance where possible during a component mounting operation.

Furthermore, examples of desirably observed rules based on the user mounting requesting conditions in view of safety in a rotary head type high-speed component mounting device in FIG. 38 or the like include a rule that movement of a board holding device for holding a board 52 such as an X-Y table or the like, that is, a board positioning device 503 is made as small as possible. This is because, for example, if a board positioning device 503 for holding a board 52 is moved largely, some users may consider it undesirable because an operator feels unease. Based on this rule, movement of a board holding device for holding a board 52 such as an X-Y table or the like, that is, a board positioning device 503 is made as small as possible during a component mounting operation.

Examples of desirably observed rules based on placing conditions and user mounting requesting conditions in view of safety not in a rotary head type high-speed component mounting device in FIG. 38, but in multifunctional component mounting devices shown in FIGS. 1 to 8, 37, 39, 40, and 41, wherein the head is movable in the X-Y plane, include a rule that a movement amount of a mounting head having nozzles is made as small as possible. This is because, if the movement amount of the mounting head is large, some users may consider it undesirable because an operator feels unease. Based on this rule, the movement amount of a mounting head having nozzles is made as small as possible during a component mounting operation.

According to this embodiment, the component information, mounting target information, and placing position information are prepared and the strictly observed rule(s) or the desirably observed rule(s) can be automatically generated based on the mounting apparatus conditions, component holding conditions, recognizing conditions, placing conditions, and user mounting requesting conditions of the mounting apparatus to be used. Therefore, even if the mounting apparatus conditions and the like become complicated or the user mounting requesting conditions are diversified, appropriate component mounting data can be generated in view of productivity, quality assurance, or safety or in view of prevention of causes of lower productivity or lower quality. Furthermore, by the generated component mounting data, components can be mounted onto a mounting target(s) appropriately and with excellent productivity, quality assurance, or safety. More specifically, for example, when a mounting program is conventionally generated or improved to increase productivity, lower quality may result unknowingly. However, by this embodiment, for example, when component mounting data is generated by using the strictly observed rule(s) or the desirably observed rule(s) generated from a plurality of views out of productivity, quality assurance, and safety, component mounting data for performing a component mounting operation with which the plurality of views can be optimally achieved at the same time can be generated. As a result, component mounting data can be generated from a comprehensive viewpoint by a plurality of views and with a plurality of well-balanced views. Even without knowing a habit of each machine (specificity depending on each machine), a comprehensive and well-balanced mounting operation in a plurality of views out of productivity, quality assurance, and safety can be performed easily and reliably by following the rules. In particular, when many kinds of component mounting devices such as a rotary head type high-speed component mounting device (high-speed machine), a component mounting device wherein a mounting head(s) is moved by an XY robot(s) (multifunctional machine) and so forth are disposed, even an operator who has only experience in generation of a program for one kind of component mounting device can perform a desired component mounting operation to some extent by using the component mounting data generating method and device according to this embodiment. Furthermore, when the component mounting data is generated and used in view of productivity, a number of mounted components per unit time can be optimized.

It is noted that the present invention is not limited to the above embodiment, but can be applied in other various aspects.

For example, this embodiment can be applied to a mounting apparatus 901 having only one mounting unit shown in FIGS. 37 and 8.

As shown in FIGS. 37 and 8, this mounting apparatus includes a board conveying device 912 for carrying in and out a circuit board 911, component feeding device 913 having a plurality of component feed units, XY robot 917 movable in X-Y directions, which has a mounting head 915 that can load four desired suction nozzles 914 and move vertically or rotate these loaded suction nozzles 914, a board recognition camera 916 and electronic component image pickup device 918 for picking up an image of an electronic component 922, component discard unit 919 for discarding an electronic component 922 having an abnormal component attitude measurement result, and a control unit 902 for controlling operations of this mounting apparatus 901. Reference numeral 950 denotes a nozzle station, wherein a plurality of nozzles for replacement are prepared. Furthermore, FIG. 37 shows an electronic component mounting device wherein one suction nozzle 914 is disposed, while FIG. 39 is a perspective view of an electronic component mounting device having a plurality of nozzles 914 therein for employing the component mounting method of this embodiment of FIG. 37.

A mounting operation in this mounting apparatus 901 is performed as follows.

First, the circuit board 911 is carried into a placing position by the board conveying device 912. The XY robot 917 moves the board recognition camera 916 to over the circuit board 911 and a position of each electronic component 922 to be placed is checked. Subsequently, the mounting head 915 is moved to the component feed unit 913 by the XY robot 917, respective electronic components 922 (922A to 922D) are sucked and held by the plurality of suction nozzles 914 (first to fourth suction nozzles 914A to 914D), and all the suction nozzles 914 are raised to an upper end position. Then, by moving the mounting head 915 so that the electronic components 922A to 922D held by the respective suction nozzles 914A to 914D pass over the component image pickup device 918, a held attitude of each electronic component 922A to 922D is image-picked up by the component image pickup device 918 and measured. Based on this measurement result, quality of the held attitude is judged.

Depending on this judgment result, if the held attitudes of the electronic components 922A to 922D are normal, positions of the electronic components 922A to 922D are corrected based on obtained image information. Then, the mounting head 915 is moved to a desired first placing position by the XY robot 917. First suction nozzle 914A holding first electronic component 922A is first lowered to placement height L1 and the electronic component 922A is mounted onto the circuit board 911. Then, the first suction nozzle 914A is raised to recognition height L2. Subsequently, the mounting head 915 is moved to a desired second placing position by the XY robot 917. Similarly, electronic components 922B, 922C, 922D are successively placed onto the circuit board 911 by second to fourth suction nozzles 914B, 914C, 914D.

FIG. 38 shows another mounting apparatus 501 to which the above embodiment can be applied.

In FIG. 38, reference numeral 506 denotes a component feeding cassette of a component feeding device that can be moved along a guide rail 507 in a Z-axis direction by a drive unit 504. Reference numerals 511, 514, 516 denote nozzles disposed on a known rotary head 502. Reference numeral 503 denotes a board positioning device for positioning a board 52. Reference numeral 515 denotes a recognition camera. Reference numeral 505 is a control unit. By rotation of the rotary head 502 in a direction of arrow 513, components are sucked by the nozzles 511, 514, 516 from the component feeding cassettes 506 and placed onto the board 52 positioned by the board positioning device 503.

Furthermore, FIG. 40 is a perspective view showing another example of a mounting head used in a component mounting device to which the component mounting method according to the above embodiment of the present invention can be applied. In FIG. 40, reference numeral 822 denotes a nozzle for sucking and holding a component. Reference numeral 823 denotes a camera for recognizing a board. Reference numeral 824 denotes an elevating device such as a voice coil motor or the like for individually and independently raising or lowering each nozzle 822. Reference numeral 825 denotes a rotary drive motor, which can correct a rotational attitude angle of a component sucked and held at a lower end of each nozzle 822 by selectively engaging an upper end of each nozzle 822 and rotating this engaged nozzle 822 about its axis.

FIG. 41 is a perspective view showing yet another example of a mounting head used in a component mounting device to which the component mounting method according to the above embodiment of the present invention can be applied. In FIG. 41, reference numeral 842 denotes a nozzle for sucking and holding a component. Reference numeral 844 denotes an elevating device such as an AC servo motor or the like for raising or lowering all nozzles 842 at once. Reference numeral 845 denotes a rotary drive motor, which can correct rotational attitude angles of components sucked and held at lower ends of the nozzles 842 by rotating each nozzle 842 about its axis at once.

A program for generating component mounting data for employing the component mounting data generating method according to the above embodiment of the present invention can be recorded in a computer readable recording medium such as, for example, an information storage member (semiconductor memory, floppy disc, hard disc, or the like) or optically readable information storage member (CD-ROM, DVD, or the like) and so forth, which can be read and written by a general purpose computer, so as to be provided to an existing mounting device. Or, the program can be provided to a required mounting device via a communication network, communication line, or the like, or communication medium (optical fiber, radio link, or the like) in a computer network system (LAN, WAN such as Internet or the like, radio communication network or the like). For convenience, this is described in detail below. A recording medium that can read a program for generating the component mounting data by computer is a recording medium wherein a generation program for generating component mounting data is recorded by a computer. Furthermore, the program is for preparing component information about a plurality of components to be placed onto a mounting target, mounting target information about the mounting target, and placing positional information of the components for the mounting target, and preparing at least one or more conditions out of mounting apparatus conditions about a component feeding device(s) for feeding the plurality of components, component holding member(s) for holding fed components, component recognition device(s) for recognizing components held by the component holding member(s), mounting target positioning device(s) for positioning the mounting target(s) on which the components held by the component holding member(s) and recognized are placed, head(s) having the component holding member(s) and for moving the component holding member(s) between the component feeding device(s), the component recognition device(s), and the mounting target positioning device(s), and so forth in a mounting apparatus to be used, component holding conditions when the components are held from the component feeding device(s) by the component holding member(s), recognizing conditions when the components held by the component holding member(s) are recognized by the recognition device(s), placing conditions when the components held by the component holding member(s) are placed onto the mounting target(s), and user mounting requesting conditions;

judging whether or not a mounting operation(s) wherein the mounting apparatus is used to hold, recognize, and place the components is a strictly observed rule(s), which must be strictly observed and without observation of which a corresponding operation cannot be performed, based on the component information, mounting target information, placing position information, and the at least one or more of the conditions, which are prepared as above, in view of productivity or quality assurance to generate the strictly observed rule(s), and judging whether or not a mounting operation(s) wherein the mounting apparatus is used to hold, recognize, and place the components is a desirably observed rule(s), which is desirable to be observed, based on the component information, mounting target information, placing position information, and the at least one or more of the conditions, which are prepared as above, in view of prevention of lower productivity or lower quality, or in view of safety, to generate the desirably observed rule(s);

generating data for performing a component mounting operation in consideration of the generated desirably observed rule(s) and the generated strictly observed rule(s);

automatically dividing a component mounting procedure of mounting operations of all the components to be mounted into component groups in consideration of the rules;

based on the mounting apparatus conditions, component holding conditions, recognizing conditions, placing conditions, and the user mounting requesting conditions, automatically dividing each divided component group into each operation unit for one head of one virtual mounting apparatus having a highest production capacity assumed from the mounting apparatus conditions and the user mounting requesting conditions, and assuming the divided operation unit as a task; and examining mounting operations for each task and then connecting all tasks, and generating component mounting data for performing the component mounting operation.

Such a program is recorded in this computer-readable recording medium. The medium is not limited to such a recording medium, but may be a computer readable recording medium recording a program(s) for employing the generating methods or the mounting methods described in this specification. In the above explanation, both strictly observed rules and desirably observed rules are generated, but only either one of them may be generated.

When the generating device is incorporated in an existing mounting device by utilizing such a recording medium, actions and effects according to this embodiment can be achieved.

For example, when similar mounting operations are performed by mounting devices installed in different factories, if all the above information and conditions are the same or the like, by storing information about rules or the like generated by the mounting device in one factory from input unit 1003 to generated rule storage unit 1006 via a recording medium or communication, rules or the like generated by the mounting device in one factory are inputted in the mounting device in another factory and component mounting data can also be generated by utilizing the inputted rules or the like. Furthermore, as required, a known recording medium reader as the input unit 1003 is included and the program for generating the component mounting data may be read from the recording medium by the recording medium reader to form strictly observed rule generation unit 1007 and desirably observed rule generation unit 1008.

According to the present invention, component information, mounting target information, and placing position information are prepared and strictly observed rules or desirably observed rules can be automatically generated based on mounting apparatus conditions, component holding conditions, recognizing conditions, placing conditions, and user mounting requesting conditions of a mounting apparatus to be used. Therefore, even if the mounting apparatus conditions and the like become complicated or the user mounting requesting conditions are diversified, appropriate component mounting data can be generated in view of productivity, quality assurance, or safety, or in view of prevention of causes of lower productivity or lower quality. Furthermore, by generated component mounting data, components can be mounted onto a mounting target appropriately and with excellent productivity, quality assurance, or safety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting data generating method comprising:
    preparing
        (i) component information about components to be placed onto a mounting target,
        (ii) mounting target information about the mounting target, and
        (iii) placement positional information of the components for the mounting target;
    preparing at least one condition out of
        (i) mounting apparatus conditions pertaining to
            (a) a component feeding device, of a mounting apparatus, for feeding the components,
            (b) a component holding member, of the mounting apparatus, for holding the components after being fed by the component feeding device,
            (c) a component recognition device, of the mounting apparatus, for recognizing the components when held by the component holding member,
            (d) a mounting target positioning device, of the mounting apparatus, for positioning the mounting target onto which the components held by the component holding member and recognized by the component recognition device are to be placed, and
            (e) a head, of the mounting apparatus, having the component holding member and for moving the component holding member between the component feeding device, the component recognition device and the mounting target positioning device,
        (ii) component holding conditions when the components, received from the component feeding device, are held by the component holding member,
        (iii) recognizing conditions when the components held by the component holding member are recognized by the component recognition device,
        (iv) placement conditions when the components held by the component holding member are to be placed onto the mounting target, and
        (v) user mounting requesting conditions;
    judging whether or not a mounting operation to be performed by the mounting apparatus is to be a strictly observed rule, which must be strictly observed and without observation of which the mounting operation cannot be performed, based on the component information, mounting target information, placement positional information and the at least one condition in view of productivity or quality assurance, to generate the strictly observed rule; and
    generating data for performing the component mounting operation in consideration of the strictly observed rule when generated.

2. The component mounting data generating method according to claim 1, further comprising:
    judging whether or not the mounting operation to be performed by the mounting apparatus is to be a desirably observed rule, which is desirable to be observed, based on the component information, mounting target information, placement positional information and the at least one condition in view of prevention of lower productivity or lower quality, or in view of safety, to generate the desirably observed rule; and
    generating data for performing the component mounting operation in consideration of the desirably observed rule when generated.

3. The component mounting data generating method according to claim 2, wherein the mounting operation comprises at least one of
    (i) a component holding operation when the components are held, after received from the component feeding device, by the component holding member,
    (ii) a recognizing operation when the components held by the component holding member are recognized by the component recognition device, and
    (iii) a placing operation when the components held by the component holding member are placed onto the mounting target.

4. The component mounting data generating method according to claim 2, further comprising:
    automatically determining a component mounting procedure of mounting operations for all the components to be mounted in consideration of at least one of the strictly observed rule and desirably observed rule, when generated, to generate component mounting data for performing the mounting operations.

5. The component mounting data generating method according to claim 2, further comprising:
    automatically dividing a component mounting procedure of mounting operations for all the components to be mounted into component groups in consideration of the strictly observed rule and desirably observed rule, when generated;
    automatically dividing each of the component groups into operation units for the head based on the mounting apparatus conditions, component holding conditions, recognizing conditions, placement conditions, and user mounting requesting conditions; and
    assuming the operation units as tasks, respectively, to examine mounting operations for each of the tasks, to then connect all of the tasks, and then to generate component mounting data for performing the component mounting operations.

6. The component mounting data generating method according to claim 5, further comprising:
when each of the component groups is automatically divided into operation units for the head to generate the tasks, assuming one virtual mounting apparatus having a highest production capacity from the mounting apparatus conditions and the user mounting requesting conditions;
automatically dividing the component mounting procedure of mounting operations for all components to be mounted into operation units for one head of the virtual mounting apparatus;
examining mounting operations for each of the tasks, and then
connecting all of the tasks to generate component mounting data for performing the component mounting operations.

7. The component mounting data generating method according to claim 5, further comprising:
when mounting operations are examined for each of the tasks, generating each of the tasks so that tasks for mounting components onto the mounting target are minimized, and then connecting all of the tasks to generate component mounting data for performing the component mounting operations.

8. The component mounting data generating method according to claim 5, further comprising:
when mounting operations are examined for each of the tasks, judging whether or not there is a portion wherein the desirably observed rule, when generated, is not observed.

9. The component mounting data generating method according to claim 8, further comprising:
when mounting operations are examined for each of the tasks and it is judged that there is a portion wherein the desirably observed rule, when generated, is not observed, simulating a mounting operation of the portion and judging whether or not the desirably observed rule, when generated, should be observed.

10. The component mounting data generating method according to claim 9, wherein
judging whether or not the desirably observed rule, when generated, should be observed comprises judging whether or not the desirably observed rule, when generated, should be observed in view of shortening of a time required for performance of all of the tasks as a whole.

11. The component mounting data generating method according to claim 2, wherein
the component information is information about the components to be placed onto the mounting target, including length, width and height of the components,
the mounting target information is information about the mounting target, including vertical and horizontal dimensions of the mounting target, and
the placement positional information is placement positional information pertaining to where the components are to be mounted on the mounting target.

12. The component mounting data generating method according to claim 2, wherein
the mounting apparatus conditions include at least one condition out of
(i) a number of mounting apparatuses,
(ii) constitution of the head of each mounting apparatus,
(iii) constitution of the component holding member of each head,
(iv) constitution of component feeding cassettes of the component feeding device,
(v) constitution of a tray feed unit of the component feeding device,
(vi) constitution of cameras of the component recognition device, and
(vii) constitution of a station for replacing the component holding member;
the component holding conditions includes at least one condition out of
(i) component holding surface heights, and pitches of component holding members,
(ii) pitches of component holding members,
(iii) pitches of the component feeding cassettes of the component feeding device,
(iv) a component holding method, and
(v) rotation of a component before recognition of the component for positional correction of the component before placement of the component on the mounting target;
the recognizing conditions include at least one condition out of
(i) constitution of recognition cameras of the component recognition device,
(ii) recognition surface heights of components,
(iii) depth of field of cameras of the component recognition device, and
(iv) component pitches;
the placement conditions include at least one condition out of
(i) component placement order,
(ii) whether shorter components are mounted first and then taller components are mounted,
(iii) whether taller components are mounted first and then shorter components are mounted,
(iv) whether components having small dimensions are mounted first and then components having large dimensions are mounted,
(v) whether components having large dimensions are mounted first and then components having small dimensions are mounted, and
(vi) arrangement of components on the mounting target; and
the user mounting requesting conditions include at least one condition out of
(i) a number of component holding members,
(ii) a number of component feeding cassettes,
(iii) component mounting order,
(iv) mounting order wherein shorter components are mounted first and then successively taller components are mounted, and
(v) order specification for specified components.

13. The component mounting data generating method according to claim 2, wherein the strictly observed rule is based on the recognizing conditions and comprises at least one of the following rules:
(i) a rule that a two-dimensional camera and a three-dimensional camera, or a large-sized three-dimensional camera and a small-sized three-dimensional camera, of the component recognition device cannot coexist for the head due to the a head moving speed for the two-dimensional camera being different than a head moving speed for the three-dimensional camera, and a head moving speed for the large-sized three-dimensional camera being different than a head moving speed for the small-sized three-dimensional camera;

(ii) a rule that, during performance of one task using a two-dimensional camera of the component recognition device, components employed during the task must be limited so that a component height variation is at most 4 mm of a depth of field of the two-dimensional camera;

(iii) a rule that, since a kind and number of the component holding member allocated to the head can be varied, components to be placed during performance of one task must be determined based on resource information of the component holding member; and (iv) a rule that, since a kind and number of a component feeding cassette feeder of the component feeding device can be varied, arrangement of component feeding cassette feeders must be determined based on resource information of the component feeding cassette feeder.

14. The component mounting data generating method according to claim 2, wherein when the strictly observed rule is based on the component holding conditions, the strictly observed rule is that, when components are simultaneously held by component holding members, components can be held only after being received from adjacent component feed units of the component feeding device, and when the strictly observed rule is based on the user mounting requesting conditions, the strictly observed rule is that a maximum number of components that can be sucked during one sucking operation, as determined by the user mounting requesting conditions, is a number of nozzles disposed on the head.

15. The component mounting data generating method according to claim 2, wherein the desirably observed rule is based on the placement conditions and comprises one of the following rules:

(i) a rule that components of at most 6 mm are desirably united with the head for performance of one task so as to speed up a placement operation; and (ii) a rule that, to speed up a placement operation, it is desirable during performance of one task to not recognize components by a large-sized two-dimensional camera and a small-sized two-dimensional camera.

16. The component mounting data generating method according to claim 2, wherein the desirably observed rule is based on the user mounting requesting conditions and is any one of:

(i) a rule that a moving distance of the head is minimized, (ii) a rule that causes of lower productivity are minimized, (iii) a rule that mounting is started with shorter components, and (iv) a rule that a mounting order is determined so that component feeding cassettes of the component feeding device are not moved a large distance at once.

17. The component mounting data generating method according to claim 1, wherein the mounting operation comprises at least one of (i) a component holding operation when the components are held, after received from the component feeding device, by the component holding member, (ii) a recognizing operation when the components held by the component holding member are recognized by the component recognition device, and (iii) a placing operation when the components held by the component holding member are placed onto the mounting target.

18. The component mounting data generating method according to claim 1, further comprising:

automatically determining a component mounting procedure of mounting operations for all the components to be mounted in consideration of at least one of the strictly observed rule and desirably observed rule, when generated, to generate component mounting data for performing the mounting operations.

19. The component mounting data generating method according to claim 1, further comprising:

automatically dividing a component mounting procedure of mounting operations for all the components to be mounted into component groups in consideration of the strictly observed rule and desirably observed rule, when generated;

automatically dividing each of the component groups into operation units for the head based on the mounting apparatus conditions, component holding conditions, recognizing conditions, placement conditions, and user mounting requesting conditions; and assuming the operation units as tasks, respectively, to examine mounting operations for each of the tasks, to then connect all of the tasks, and then to generate component mounting data for performing the component mounting operations.

20. The component mounting data generating method according to claim 19, further comprising:

when each of the component groups is automatically divided into operation units for the head to generate the tasks, assuming one virtual mounting apparatus having a highest production capacity from the mounting apparatus conditions and the user mounting requesting conditions;

automatically dividing the component mounting procedure of mounting operations for all components to be mounted into operation units for one head of the virtual mounting apparatus;

examining mounting operations for each of the tasks, and then connecting all of the tasks to generate component mounting data for performing the component mounting operations.

21. The component mounting data generating method according to claim 19, further comprising:

when mounting operations are examined for each of the tasks, generating each of the tasks so that tasks for mounting components onto the mounting target are minimized, and then connecting all of the tasks to generate component mounting data for performing the component mounting operations.

22. The component mounting data generating method according to claim 19, further comprising:

when mounting operations are examined for each of the tasks, judging whether or not there is a portion wherein the desirably observed rule, when generated, is not observed.

23. The component mounting data generating method according to claim 22, further comprising:

when mounting operations are examined for each of the tasks and it is judged that there is a portion wherein the desirably observed rule, when generated, is not observed, simulating a mounting operation of the portion and judging whether or not the desirably observed rule, when generated, should be observed.

24. The component mounting data generating method according to claim 23, wherein judging whether or not the desirably observed rule, when generated, should be observed comprises judging whether or not the desirably observed rule, when generated, should be observed in view of shortening of a time required for performance of all of the tasks as a whole.

25. The component mounting data generating method according to claim 1, wherein
the component information is information about the components to be placed onto the mounting target, including length, width and height of the components,
the mounting target information is information about the mounting target, including vertical and horizontal dimensions of the mounting target, and
the placement positional information is placement positional information pertaining to where the components are to be mounted on the mounting target.

26. The component mounting data generating method according to claim 1, wherein
the mounting apparatus conditions include at least one condition out of
(i) a number of mounting apparatuses,
(ii) constitution of the head of each mounting apparatus,
(iii) constitution of the component holding member of each head,
(iv) constitution of component feeding cassettes of the component feeding device,
(v) constitution of a tray feed unit of the component feeding device,
(vi) constitution of cameras of the component recognition device, and
(vii) constitution of a station for replacing the component holding member;
the component holding conditions includes at least one condition out of
(i) component holding surface heights, and pitches of component holding members,
(ii) pitches of component holding members,
(iii) pitches of the component feeding cassettes of the component feeding device,
(iv) a component holding method, and
(v) rotation of a component before recognition of the component for positional correction of the component before placement of the component on the mounting target;
the recognizing conditions include at least one condition out of
(i) constitution of recognition cameras of the component recognition device,
(ii) recognition surface heights of components,
(iii) depth of field of cameras of the component recognition device, and
(iv) component pitches;
the placement conditions include at least one condition out of
(i) component placement order,
(ii) whether shorter components are mounted first and then taller components are mounted,
(iii) whether taller components are mounted first and then shorter components are mounted,
(iv) whether components having small dimensions are mounted first and then components having large dimensions are mounted,
(v) whether components having large dimensions are mounted first and then components having small dimensions are mounted, and
(vi) arrangement of components on the mounting target; and the user mounting requesting conditions include at least one condition out of
(i) a number of component holding members,
(ii) a number of component feeding cassettes,
(iii) component mounting order,
(iv) mounting order wherein shorter components are mounted first and then successively taller components are mounted, and
(v) order specification for specified components.

27. The component mounting data generating method according to claim 1, wherein the strictly observed rule is based on the recognizing conditions and comprises at least one of the following rules:
(i) a rule that a two-dimensional camera and a three-dimensional camera, or a large-sized three-dimensional camera and a small-sized three-dimensional camera, of the component recognition device cannot coexist for the head due to the a head moving speed for the two-dimensional camera being different than a head moving speed for the three-dimensional camera, and a head moving speed for the large-sized three-dimensional camera being different than a head moving speed for the small-sized three-dimensional camera;
(ii) a rule that, during performance of one task using a two-dimensional camera of the component recognition device, components employed during the task must be limited so that a component height variation is at most 4 mm of a depth of field of the two-dimensional camera;
(iii) a rule that, since a kind and number of the component holding member allocated to the head can be varied, components to be placed during performance of one task must be determined based on resource information of the component holding member; and
(iv) a rule that, since a kind and number of a component feeding cassette feeder of the component feeding device can be varied, arrangement of component feeding cassette feeders must be determined based on resource information of the component feeding cassette feeder.

28. The component mounting data generating method according to claim 1, wherein
when the strictly observed rule is based on the component holding conditions, the strictly observed rule is that, when components are simultaneously held by component holding members, components can be held only after being received from adjacent component feed units of the component feeding device, and
when the strictly observed rule is based on the user mounting requesting conditions, the strictly observed rule is that a maximum number of components that can be sucked during one sucking operation, as determined by the user mounting requesting conditions, is a number of nozzles disposed on the head.

29. A component mounting data generating method comprising:
preparing
(i) component information about components to be placed onto a mounting target,
(ii) mounting target information about the mounting target, and
(iii) placement positional information of the components for the mounting target;
preparing at least one condition out of
(i) mounting apparatus conditions pertaining to
(a) a component feeding device, of a mounting apparatus, for feeding the components, (b) a component holding member, of the mounting apparatus, for holding the components after being fed by the component feeding device, (c) a component recognition device, of the mounting apparatus, for recognizing the components when held by the component holding member, (d) a mounting target positioning device, of the mounting apparatus, for positioning the mounting target onto which the components held by the component holding member and recognized by the component recognition device are to be placed, and (e) a head, of the mounting apparatus, having the component holding member and for moving the component holding member between the component feeding device, the component recognition device and the mounting target positioning device, (ii) component holding conditions when the components, received from the component feeding device, are held by the component holding member, (iii) recognizing conditions when the components held by the component holding member are recognized by the recognition device, (iv) placement conditions when the components held by the component holding member are to be placed onto the mounting target, and (v) user mounting requesting conditions;

judging whether or not a mounting operation to be performed by the mounting apparatus is to be a desirably observed rule, which is desirable to be observed, based on the component information, mounting target information, placement positional information and the at least one condition in view of prevention of lower productivity or lower quality, or in view of safety, to generate the desirably observed rule; and generating data for performing the component mounting operation in consideration of the desirably observed rule when generated.

30. The component mounting data generating method according to claim 29, wherein the mounting operation comprises at least one of (i) a component holding operation when the components are held, after received from the component feeding device, by the component holding member, (ii) a recognizing operation when the components held by the component holding member are recognized by the component recognition device, and (iii) a placing operation when the components held by the component holding member are placed onto the mounting target.

31. The component mounting data generating method according to claim 29, further comprising:

automatically determining a component mounting procedure of mounting operations for all the components to be mounted in consideration of at least one of the strictly observed rule and desirably observed rule, when generated, to generate component mounting data for performing the mounting operations.

32. The component mounting data generating method according to claim 29, further comprising:

automatically dividing a component mounting procedure of mounting operations for all the components to be mounted into component groups in consideration of the strictly observed rule and desirably observed rule, when generated;

automatically dividing each of the component groups into operation units for the head based on the mounting apparatus conditions, component holding conditions, recognizing conditions, placement conditions, and user mounting requesting conditions; and assuming the operation units as tasks, respectively, to examine mounting operations for each of the tasks, to then connect all of the tasks, and then to generate component mounting data for performing the component mounting operations.

33. The component mounting data generating method according to claim 32, further comprising:

when each of the component groups is automatically divided into operation units for the head to generate the tasks, assuming one virtual mounting apparatus having a highest production capacity from the mounting apparatus conditions and the user mounting requesting conditions;

automatically dividing the component mounting procedure of mounting operations for all components to be mounted into operation units for one head of the virtual mounting apparatus;

examining mounting operations for each of the tasks, and then connecting all of the tasks to generate component mounting data for performing the component mounting operations.

34. The component mounting data generating method according to claim 32, further comprising:

when mounting operations are examined for each of the tasks, generating each of the tasks so that tasks for mounting components onto the mounting target are minimized, and then connecting all of the tasks to generate component mounting data for performing the component mounting operations.

35. The component mounting data generating method according to claim 32, further comprising:

when mounting operations are examined for each of the tasks, judging whether or not there is a portion wherein the desirably observed rule, when generated, is not observed.

36. The component mounting data generating method according to claim 35, further comprising:

when mounting operations are examined for each of the tasks and it is judged that there is a portion wherein the desirably observed rule, when generated, is not observed, simulating a mounting operation of the portion and judging whether or not the desirably observed rule, when generated, should be observed.

37. The component mounting data generating method according to claim 36, wherein judging whether or not the desirably observed rule, when generated, should be observed comprises judging whether or not the desirably observed rule, when generated, should be observed in view of shortening of a time required for performance of all of the tasks as a whole.

38. The component mounting data generating method according to claim 29, wherein the component information is information about the components to be placed onto the mounting target, including length, width and height of the components, the mounting target information is information about the mounting target, including vertical and horizontal dimensions of the mounting target, and the placement positional information is placement positional information pertaining to where the components are to be mounted on the mounting target.

39. The component mounting data generating method according to claim 29, wherein
the mounting apparatus conditions include at least one condition out of
(i) a number of mounting apparatuses,
(ii) constitution of the head of each mounting apparatus,
(iii) constitution of the component holding member of each head,
(iv) constitution of component feeding cassettes of the component feeding device,
(v) constitution of a tray feed unit of the component feeding device,
(vi) constitution of cameras of the component recognition device, and
(vii) constitution of a station for replacing the component holding member;
the component holding conditions includes at least one condition out of
(i) component holding surface heights, and pitches of component holding members,
(ii) pitches of component holding members,
(iii) pitches of the component feeding cassettes of the component feeding device,
(iv) a component holding method, and
(v) rotation of a component before recognition of the component for positional correction of the component before placement of the component on the mounting target;
the recognizing conditions include at least one condition out of
(i) constitution of recognition cameras of the component recognition device,
(ii) recognition surface heights of components,
(iii) depth of field of cameras of the component recognition device, and
(iv) component pitches;
the placement conditions include at least one condition out of
(i) component placement order,
(ii) whether shorter components are mounted first and then taller components are mounted,
(iii) whether taller components are mounted first and then shorter components are mounted,
(iv) whether components having small dimensions are mounted first and then components having large dimensions are mounted,
(v) whether components having large dimensions are mounted first and then components having small dimensions are mounted, and
(vi) arrangement of components on the mounting target; and
the user mounting requesting conditions include at least one condition out of
(i) a number of component holding members,
(ii) a number of component feeding cassettes,
(iii) component mounting order,
(iv) mounting order wherein shorter components are mounted first and then successively taller components are mounted, and
(v) order specification for specified components.

40. The component mounting data generating method according to claim 29, wherein the desirably observed rule is based on the placement conditions and comprises one of the following rules:
(i) a rule that components of at most 6 mm are desirably united with the head for performance of one task so as to speed up a placement operation; and
(ii) a rule that, to speed up a placement operation, it is desirable during performance of one task to not recognize components by a large-sized two-dimensional camera and a small-sized two-dimensional camera.

41. The component mounting data generating method according to claim 29, wherein the desirably observed rule is based on the user mounting requesting conditions and is any one of:
(i) a rule that a moving distance of the head is minimized,
(ii) a rule that causes of lower productivity are minimized,
(iii) a rule that mounting is started with shorter components, and
(iv) a rule that a mounting order is determined so that component feeding cassettes of the component feeding device are not moved a large distance at once.

42. A component mounting method comprising:
preparing
(i) component information about components to be placed onto a mounting target,
(ii) mounting target information about the mounting target, and
(iii) placement positional information of the components for the mounting target;
preparing at least one condition out of
(i) mounting apparatus conditions pertaining to
(a) a component feeding device, of a mounting apparatus, for feeding the components,
(b) a component holding member, of the mounting apparatus, for holding the components after being fed by the component feeding device,
(c) a component recognition device, of the mounting apparatus, for recognizing the components when held by the component holding member,
(d) a mounting target positioning device, of the mounting apparatus, for positioning the mounting target onto which the components held by the component holding member and recognized by the component recognition device are to be placed, and
(e) a head, of the mounting apparatus, having the component holding member and for moving the component holding member between the component feeding device, the component recognition device and the mounting target positioning device,
(ii) component holding conditions when the components, received from the component feeding device, are held by the component holding member,
(iii) recognizing conditions when the components held by the component holding member are recognized by the recognition device,
(iv) placement conditions when the components held by the component holding member are to be placed onto the mounting target, and
(v) user mounting requesting conditions;
judging whether or not a mounting operation to be performed by the mounting apparatus is to be a desirably observed rule, which is desirable to be observed, based on the component information, mounting target information, placement positional information and the at least one condition in view of prevention of lower productivity or lower quality, or in view of safety, to generate the desirably observed rule;
generating data in consideration of the desirably observed rule when generated; and performing the mounting operation based on the data when generated.

43. A component mounting method comprising:
preparing
- (i) component information about components to be placed onto a mounting target,
- (ii) mounting target information about the mounting target, and
- (iii) placement positional information of the components for the mounting target;

preparing at least one condition out of
- (i) mounting apparatus conditions pertaining to
  - (a) a component feeding device, of a mounting apparatus, for feeding the components,
  - (b) a component holding member, of the mounting apparatus, for holding the components after being fed by the component feeding device,
  - (c) a component recognition device, of the mounting apparatus, for recognizing the components when held by the component holding member,
  - (d) a mounting target positioning device, of the mounting apparatus, for positioning the mounting target onto which the components held by the component holding member and recognized by the component recognition device are to be placed, and
  - (e) a head, of the mounting apparatus, having the component holding member and for moving the component holding member between the component feeding device, the component recognition device and the mounting target positioning device,
- (ii) component holding conditions when the components, received from the component feeding device, are held by the component holding member,
- (iii) recognizing conditions when the components held by the component holding member are recognized by the component recognition device,
- (iv) placement conditions when the components held by the component holding member are to be placed onto the mounting target, and
- (v) user mounting requesting conditions;

judging whether or not a mounting operation to be performed by the mounting apparatus is to be a strictly observed rule, which must be strictly observed and without observation of which the mounting operation cannot be performed, based on the component information, mounting target information, placement positional information and the at least one condition in view of productivity or quality assurance, to generate the strictly observed rule;
generating data in consideration of the strictly observed rule when generated; and
performing the mounting operation based the data when generated.

44. A component mounting method comprising:
preparing
- (i) component information about components to be placed onto a mounting target,
- (ii) mounting target information about the mounting target, and
- (iii) placement positional information of the components for the mounting target;

preparing at least one condition out of
- (i) mounting apparatus conditions pertaining to
  - (a) a component feeding device, of a mounting apparatus, for feeding the components,
  - (b) a component holding member, of the mounting apparatus, for holding the components after being fed by the component feeding device,
  - (c) a component recognition device, of the mounting apparatus, for recognizing the components when held by the component holding member,
  - (d) a mounting target positioning device, of the mounting apparatus, for positioning the mounting target onto which the components held by the component holding member and recognized by the component recognition device are to be placed, and
  - (e) a head, of the mounting apparatus, having the component holding member and for moving the component holding member between the component feeding device, the component recognition device and the mounting target positioning device,
- (ii) component holding conditions when the components, received from the component feeding device, are held by the component holding member,
- (iii) recognizing conditions when the components held by the component holding member are recognized by the component recognition device,
- (iv) placement conditions when the components held by the component holding member are to be placed onto the mounting target, and
- (v) user mounting requesting conditions;

judging whether or not a mounting operation to be performed by the mounting apparatus is to be a strictly observed rule, which must be strictly observed and without observation of which the mounting operation cannot be performed, based on the component information, mounting target information, placement positional information and the at least one condition in view of productivity or quality assurance, to generate the strictly observed rule;
judging whether or not the mounting operation to be performed by the mounting apparatus is to be a desirably observed rule, which is desirable to be observed, based on the component information, mounting target information, placement positional information and the at least one condition in view of prevention of lower productivity or lower quality, or in view of safety, to generate the desirably observed rule;
generating data in consideration of the strictly observed rule when generated;
generating data in consideration of the desirably observed rule when generated; and
performing the mounting operation based the data when generated.

* * * * *